United States Patent
Ching et al.

(10) Patent No.: US 9,711,533 B2
(45) Date of Patent: Jul. 18, 2017

(54) FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF

(71) Applicant: TAIWAN SEMICONDUCTOR MANUFACTURING COMPANY, LTD., Hsin-Chu (TW)

(72) Inventors: Kuo-Cheng Ching, Zhubei (TW); Ching-Wei Tsai, Taoyuan (TW); Chih-Hao Wang, Baoshan Township (TW); Ying-Keung Leung, Hong Kong (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/885,115

(22) Filed: Oct. 16, 2015

(65) Prior Publication Data

US 2017/0110476 A1    Apr. 20, 2017

(51) Int. Cl.
*H01L 27/118* (2006.01)
*H01L 29/78* (2006.01)
*H01L 29/66* (2006.01)
*H01L 29/08* (2006.01)

(52) U.S. Cl.
CPC .... *H01L 27/11807* (2013.01); *H01L 29/0847* (2013.01); *H01L 29/66545* (2013.01); *H01L 29/66803* (2013.01); *H01L 29/7851* (2013.01); *H01L 2027/11853* (2013.01); *H01L 2027/11864* (2013.01)

(58) Field of Classification Search
None
See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |

(Continued)

*Primary Examiner* — Bilkis Jahan
(74) *Attorney, Agent, or Firm* — Haynes and Boone, LLP

(57) ABSTRACT

A semiconductor device includes a first FinFET device and a second FinFET device. The first FinFET device includes a first gate, a first source, and a first drain. The first FinFET device has a first source/drain proximity. The second FinFET device includes a second gate, a second source, and a second drain. The second FinFET device has a second source/drain proximity that is smaller than the first source/drain proximity. In some embodiments, \the first FinFET device is an Input/Output (I/O) device, and the second FinFET device is a non-I/O device such as a core device. In some embodiments, the greater source/drain proximity of the first FinFET device is due to an extra spacer of the first FinFET device that does not exist for the second FinFET device.

20 Claims, 50 Drawing Sheets

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,809,173 B1* | 8/2014 | Yin | H01L 29/0684 |
| | | | 257/288 |
| 8,816,444 B2 | 8/2014 | Wann et al. | |
| 8,823,065 B2 | 9/2014 | Wang et al. | |
| 8,860,148 B2 | 10/2014 | Hu et al. | |
| 2008/0128800 A1* | 6/2008 | Song | H01L 29/4236 |
| | | | 257/330 |
| 2009/0032859 A1* | 2/2009 | Zhu | H01L 21/28273 |
| | | | 257/316 |
| 2009/0085163 A1* | 4/2009 | Russ | H01L 29/6609 |
| | | | 257/594 |
| 2011/0309333 A1* | 12/2011 | Cheng | B82Y 10/00 |
| | | | 257/24 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0377922 A1* | 12/2014 | Fung | H01L 29/66795 |
| | | | 438/283 |
| 2015/0228722 A1* | 8/2015 | Chung | H01L 29/0657 |
| | | | 257/401 |
| 2015/0287636 A1* | 10/2015 | Wei | H01L 21/823878 |
| | | | 257/368 |
| 2015/0311341 A1* | 10/2015 | Hur | H01L 21/02532 |
| | | | 257/190 |

* cited by examiner

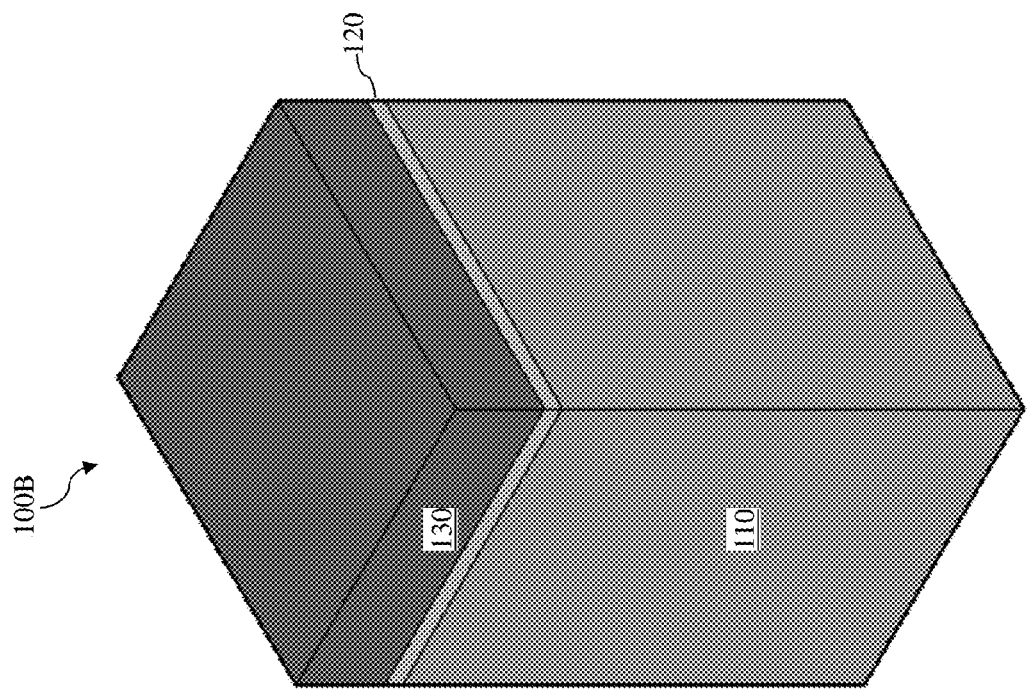
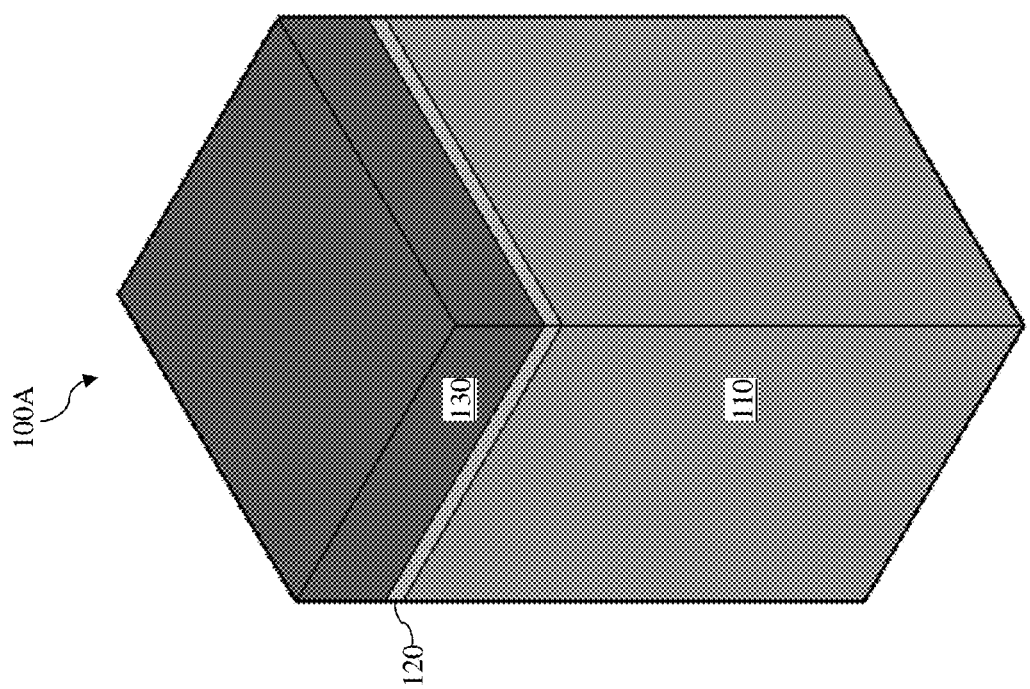
Fig. 2

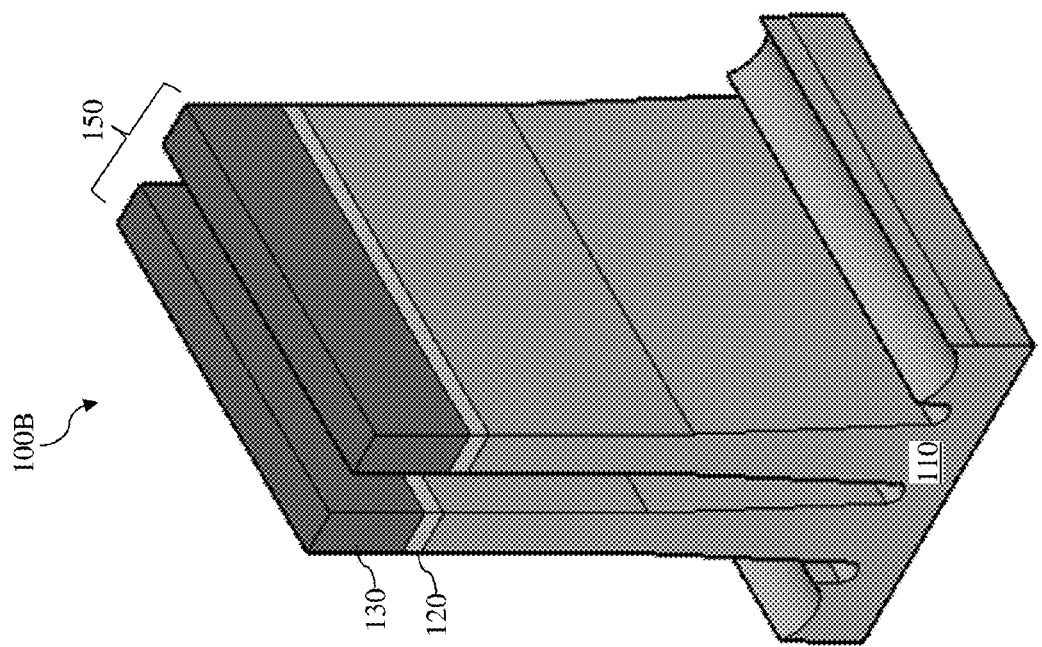
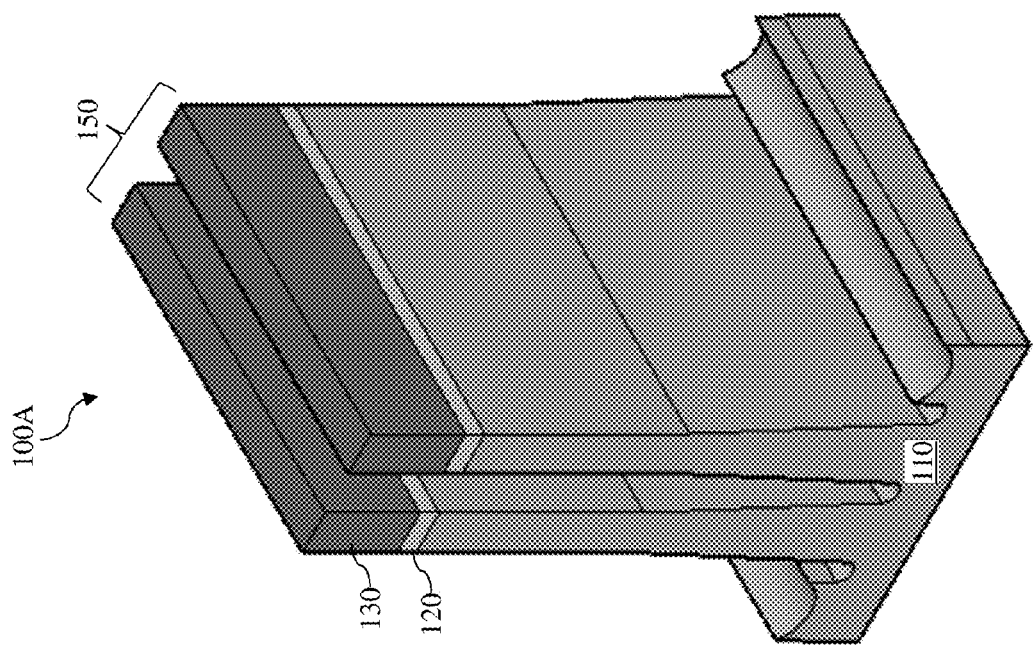
Fig. 3

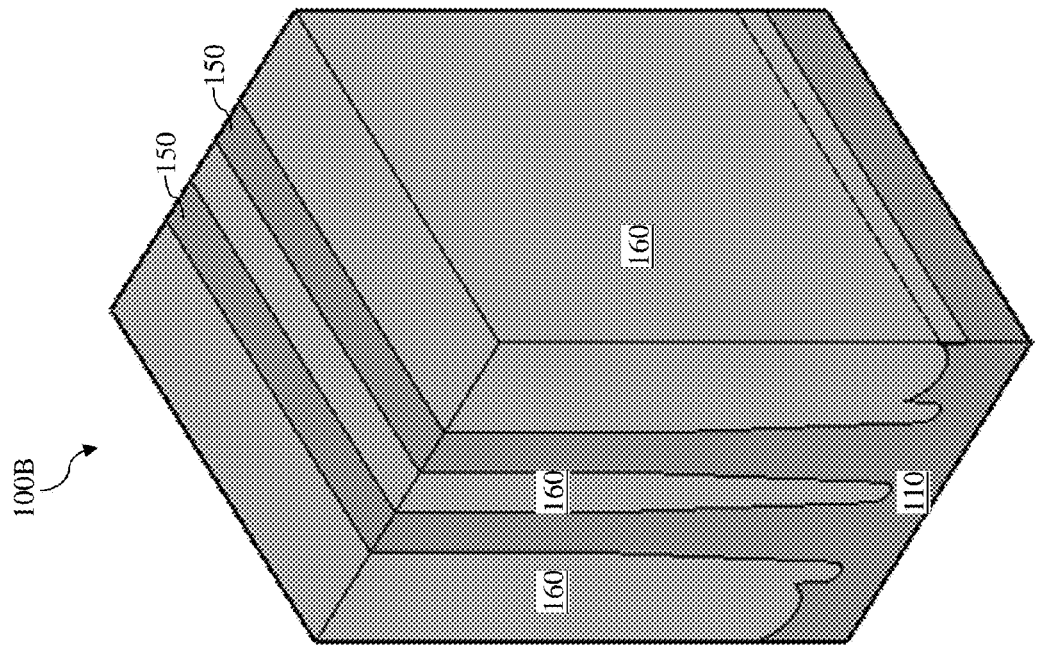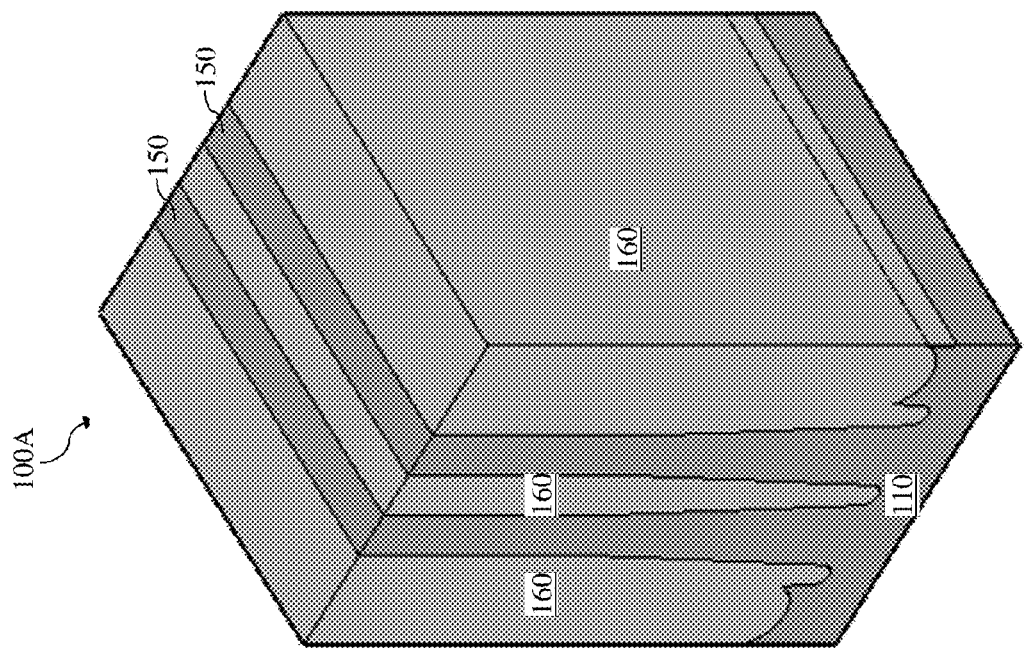
Fig. 4

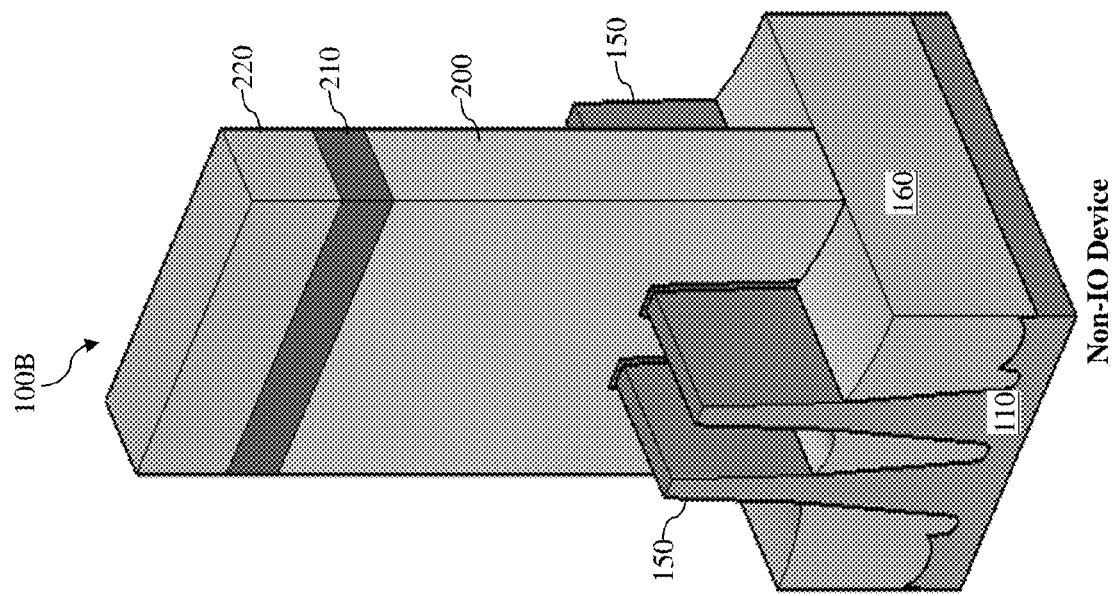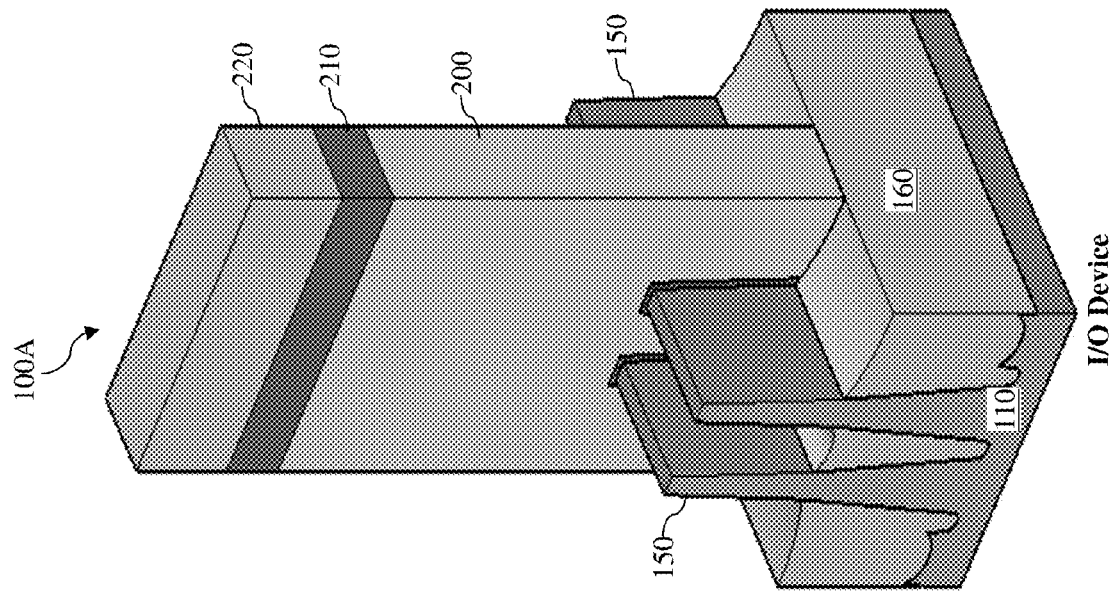
Fig. 6

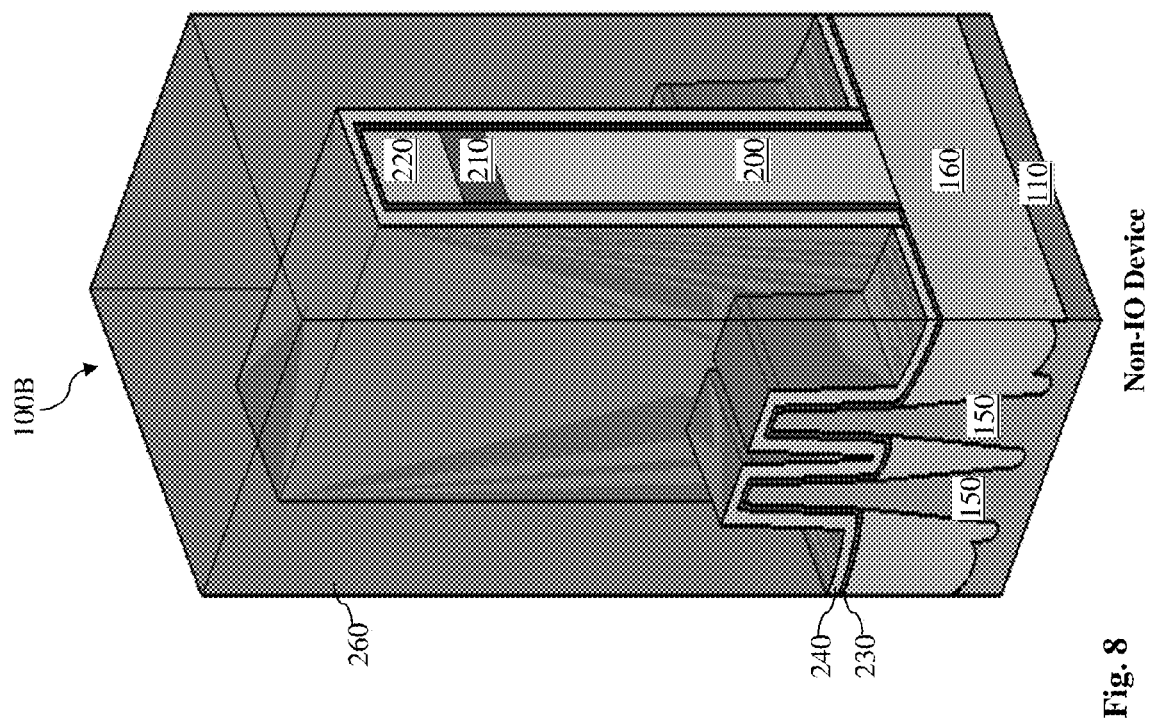
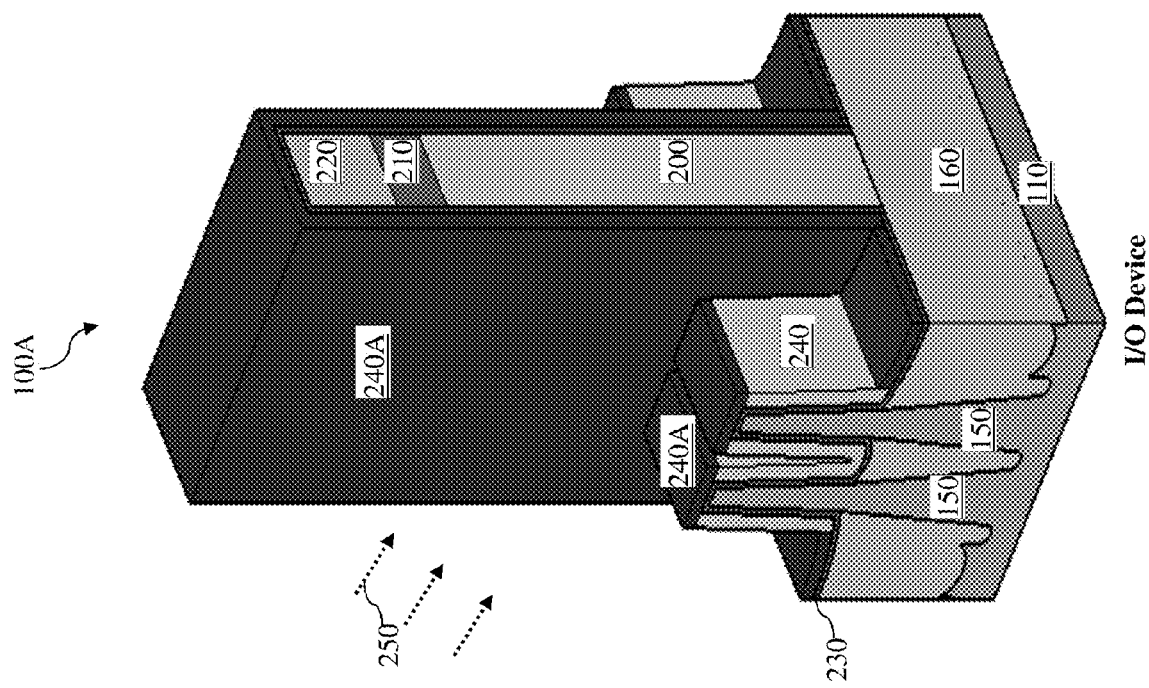
Fig. 8

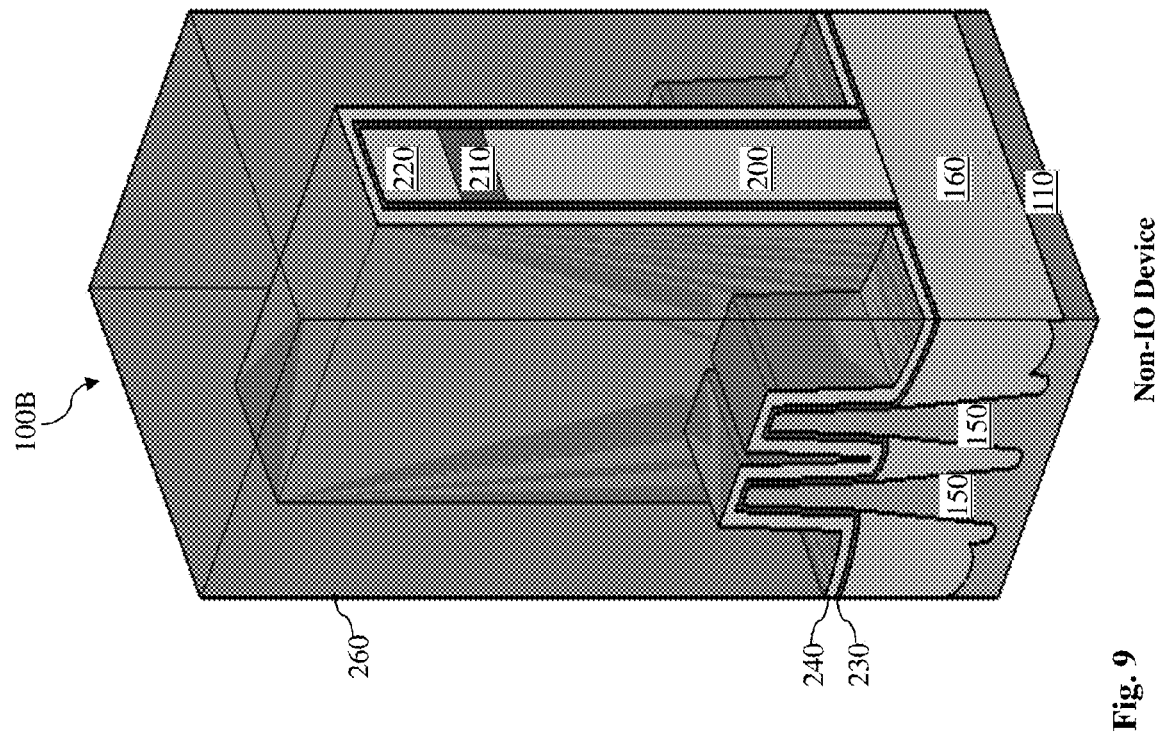
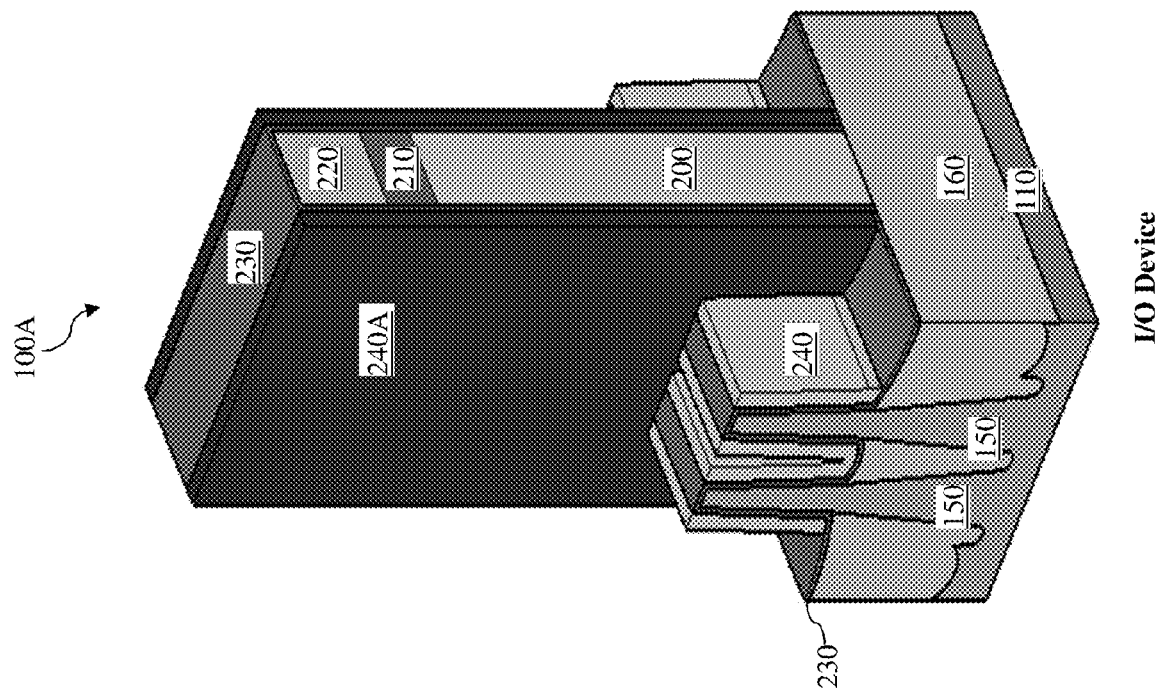
Fig. 9

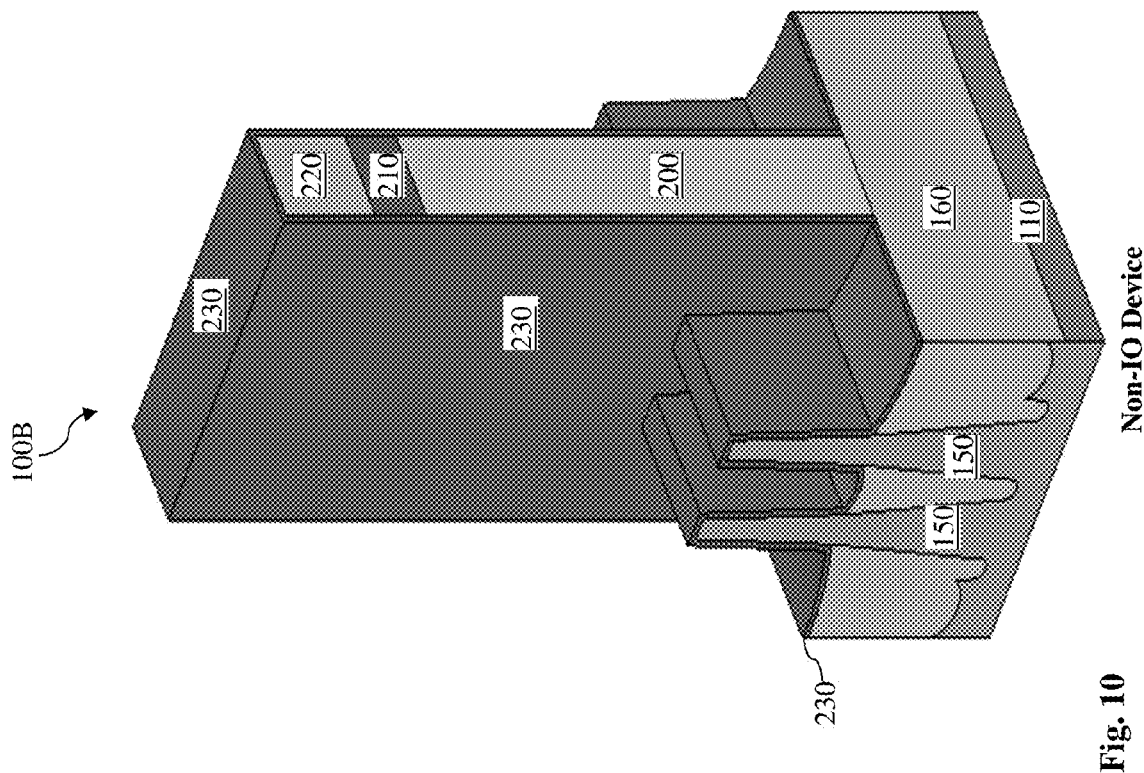
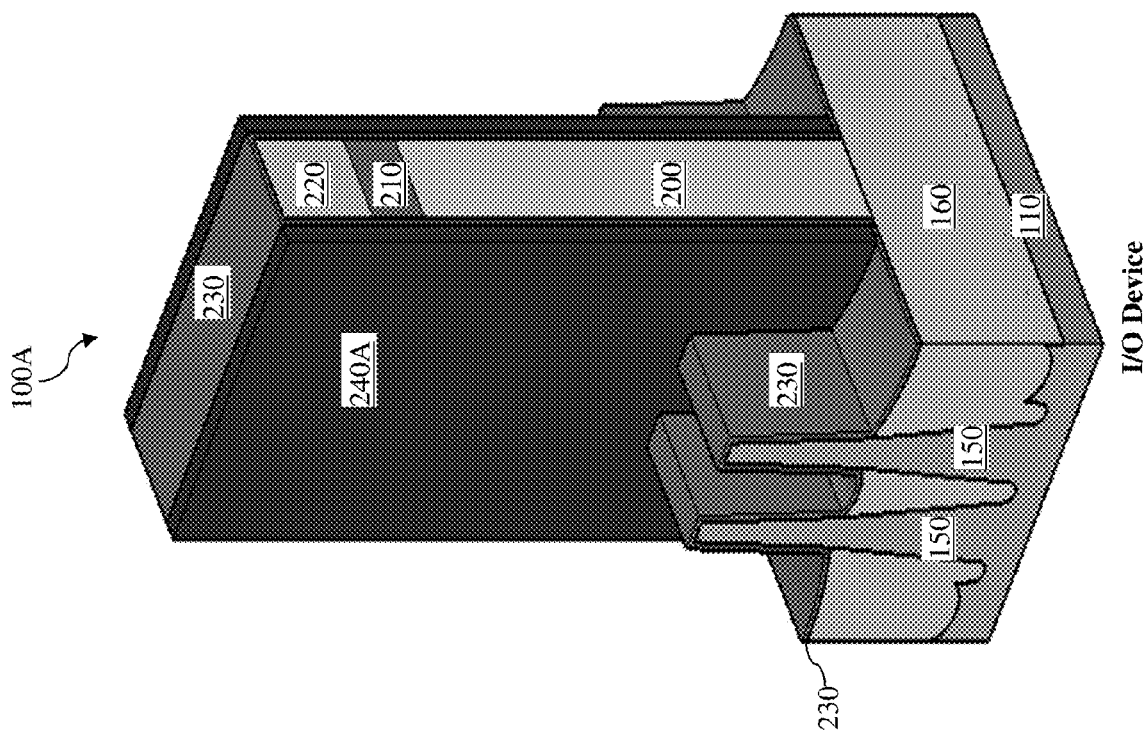
Fig. 10

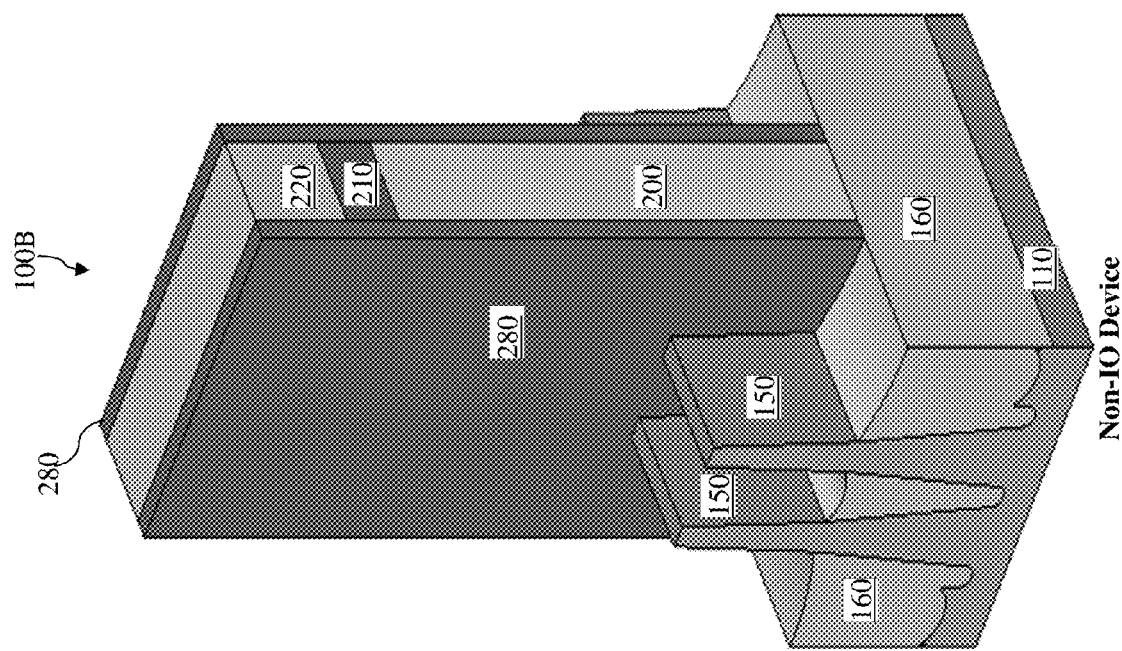
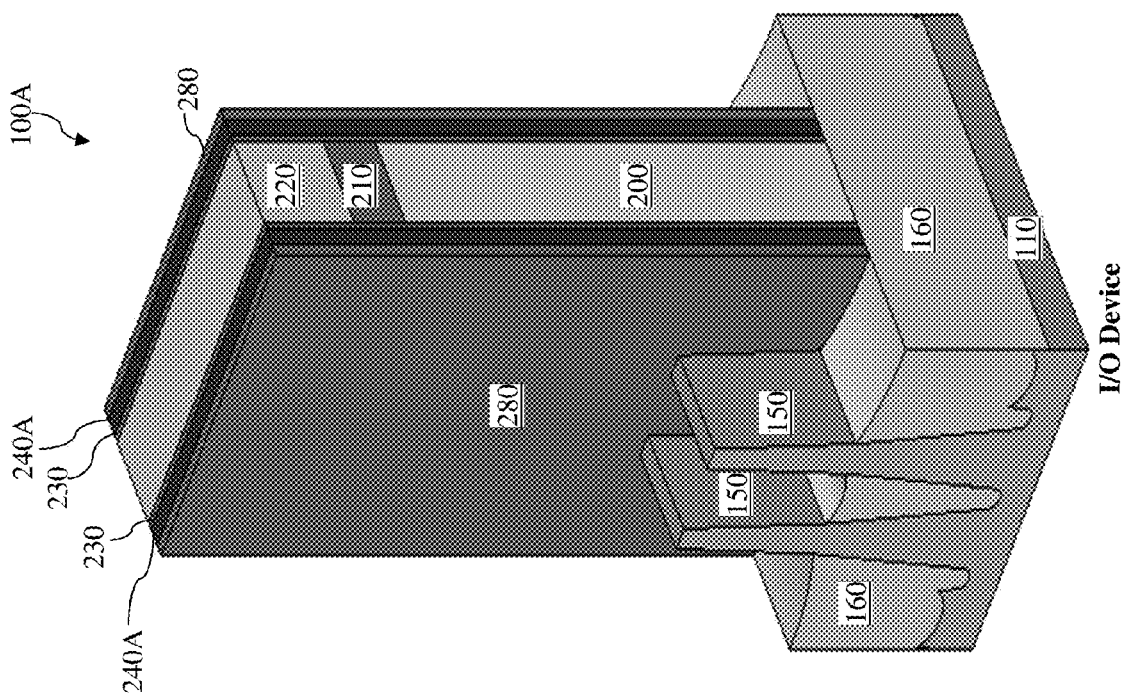
Fig. 11

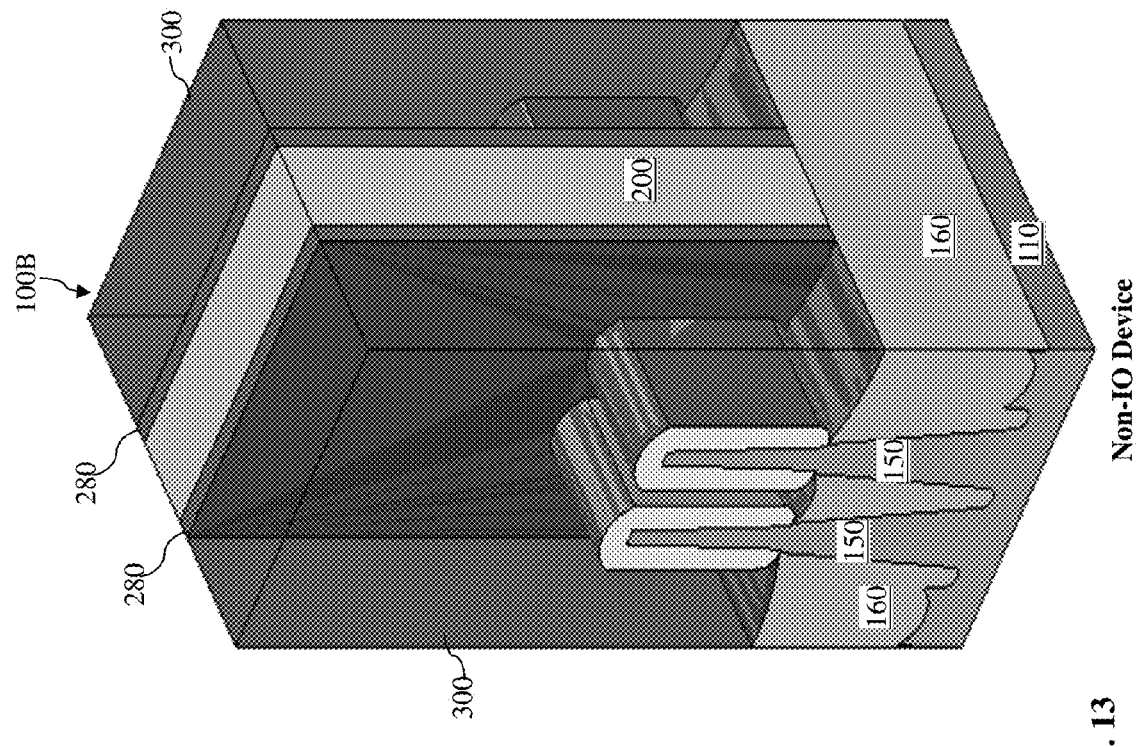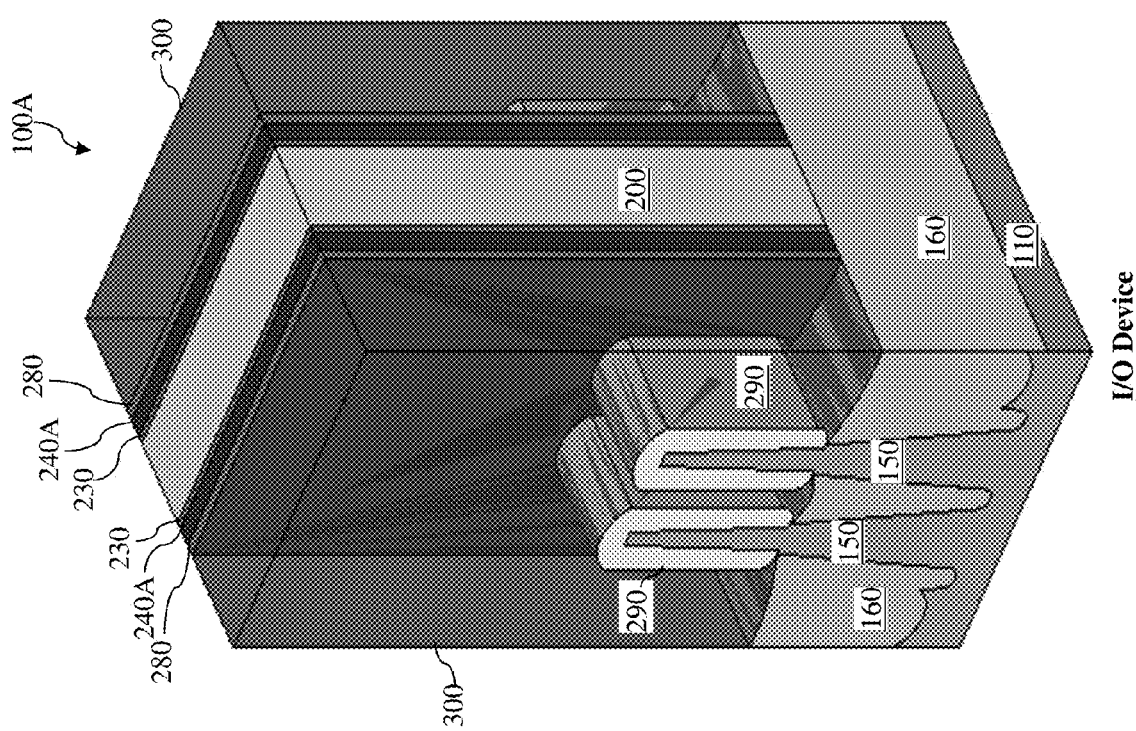
Fig. 13

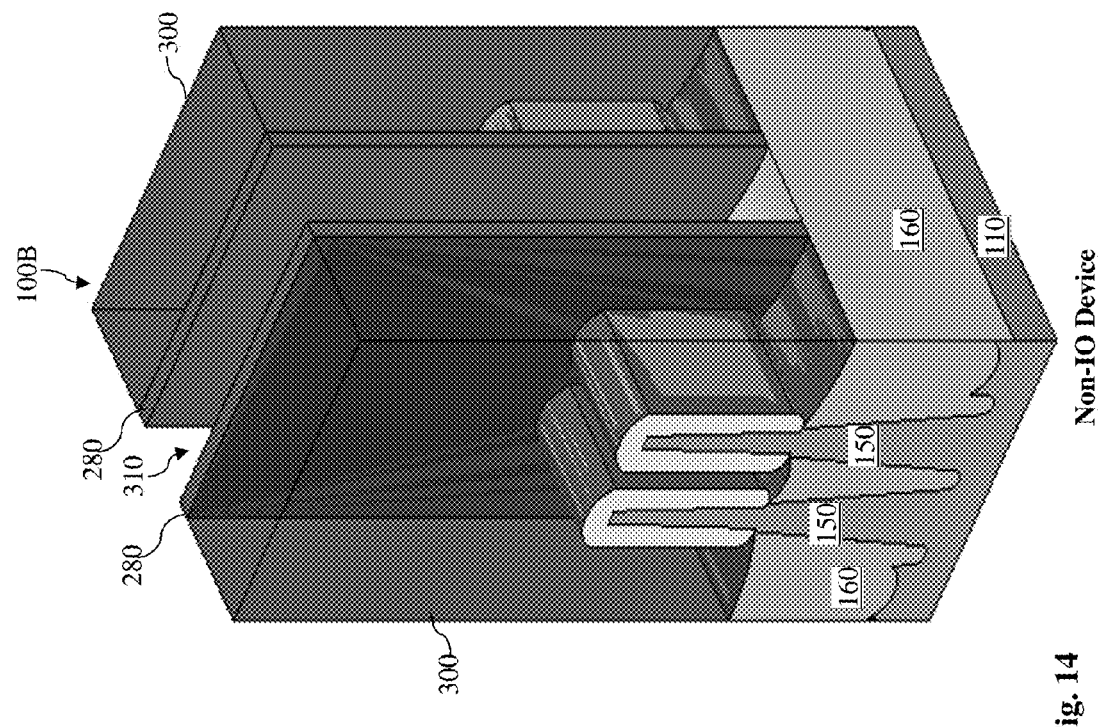
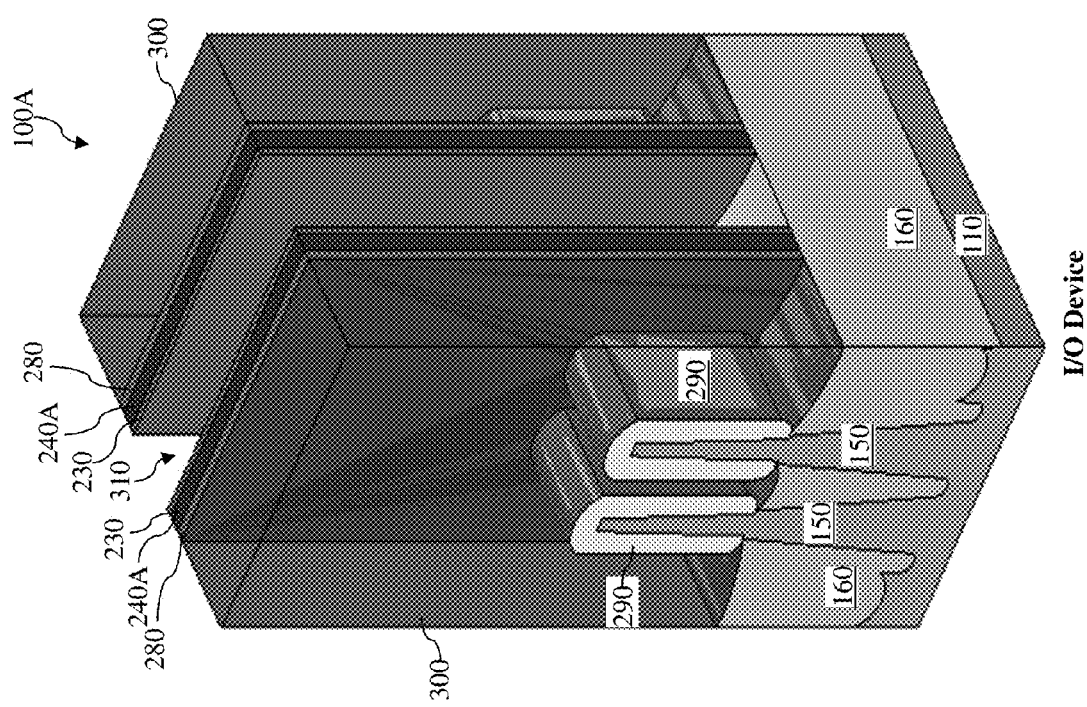
Fig. 14

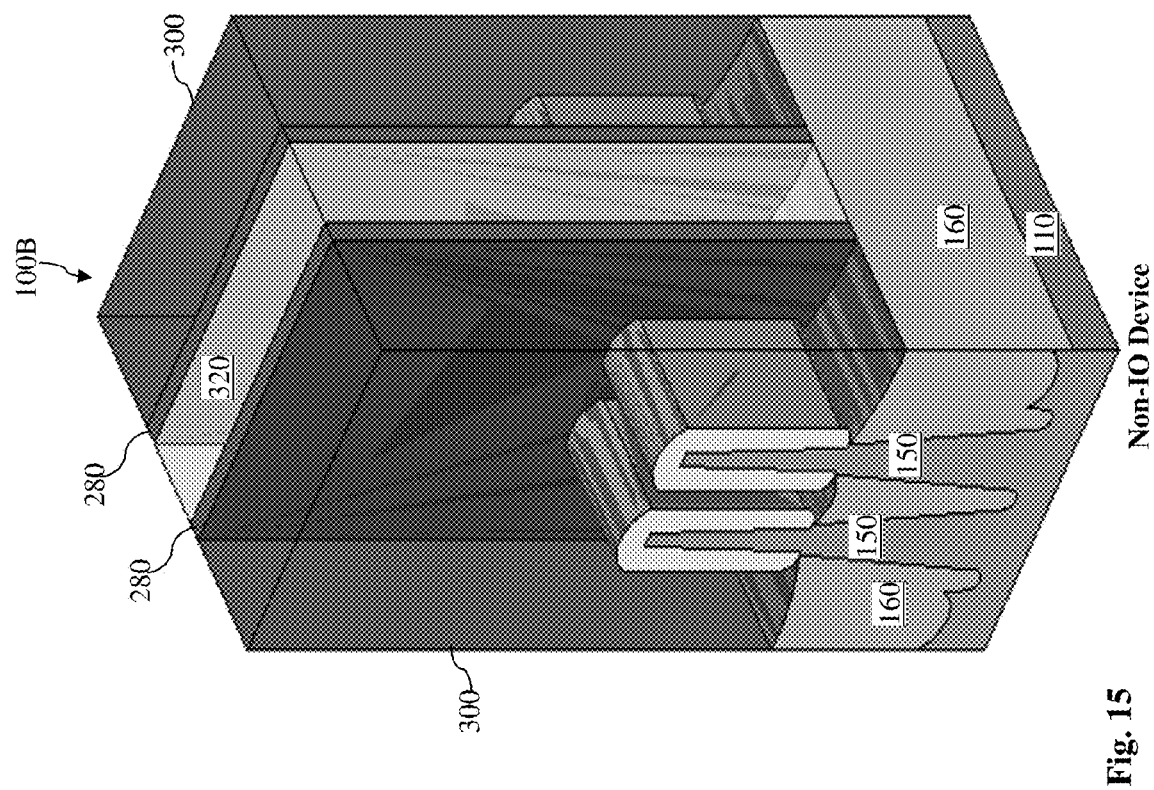
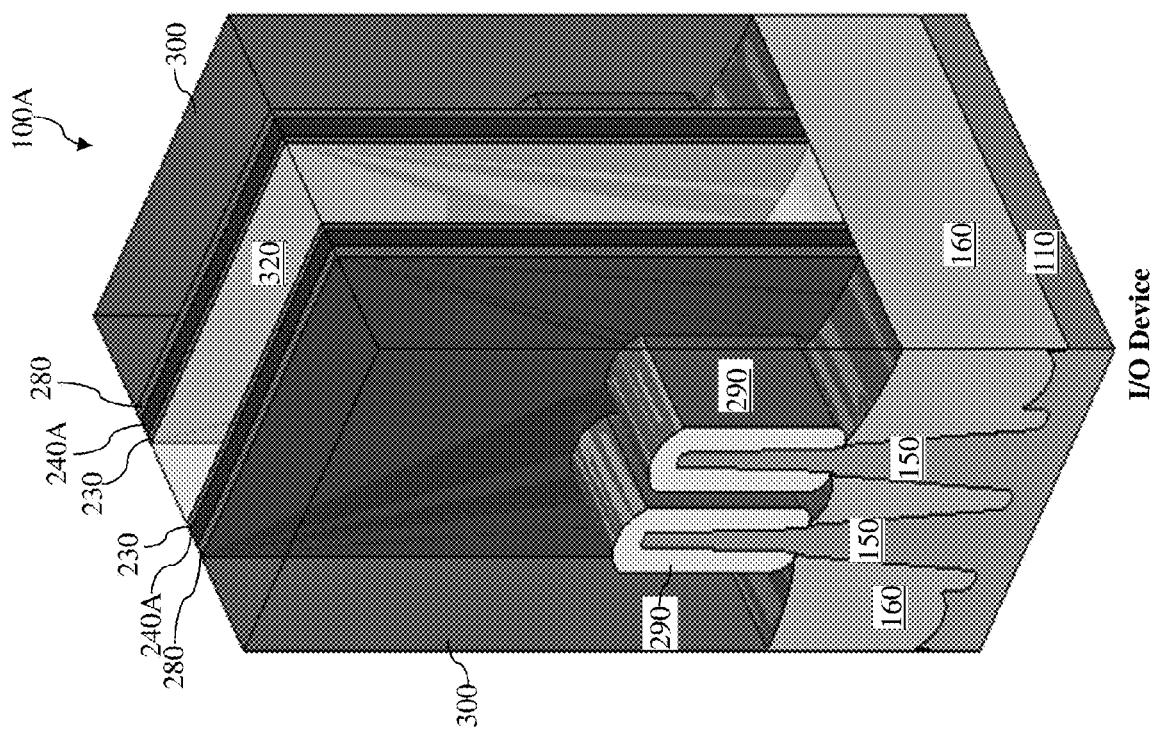
Fig. 15

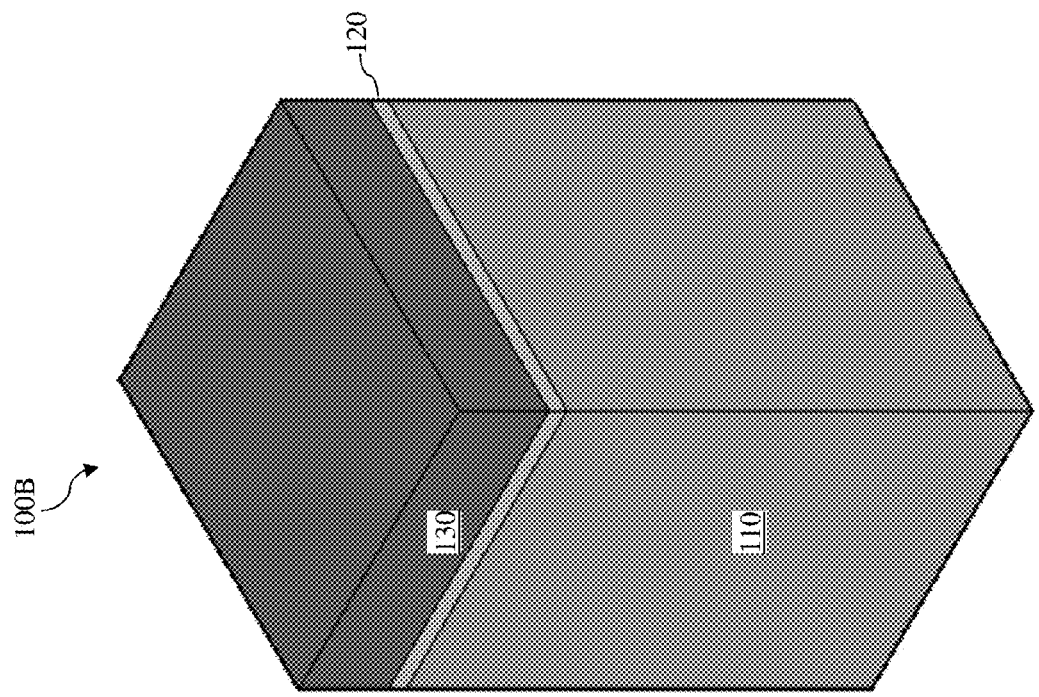
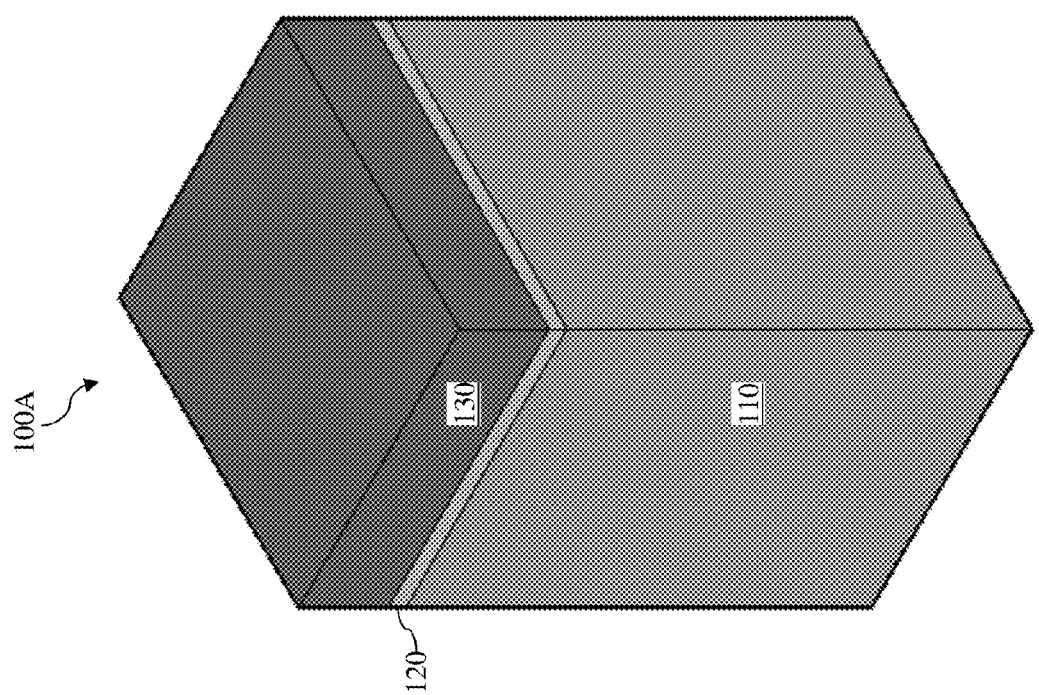
Fig. 17

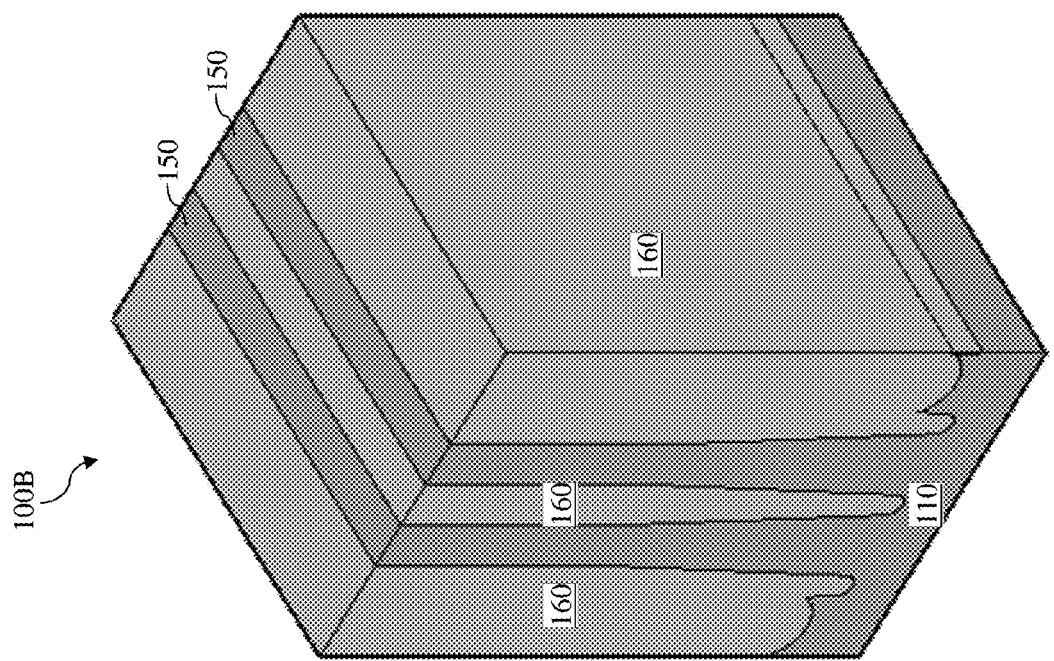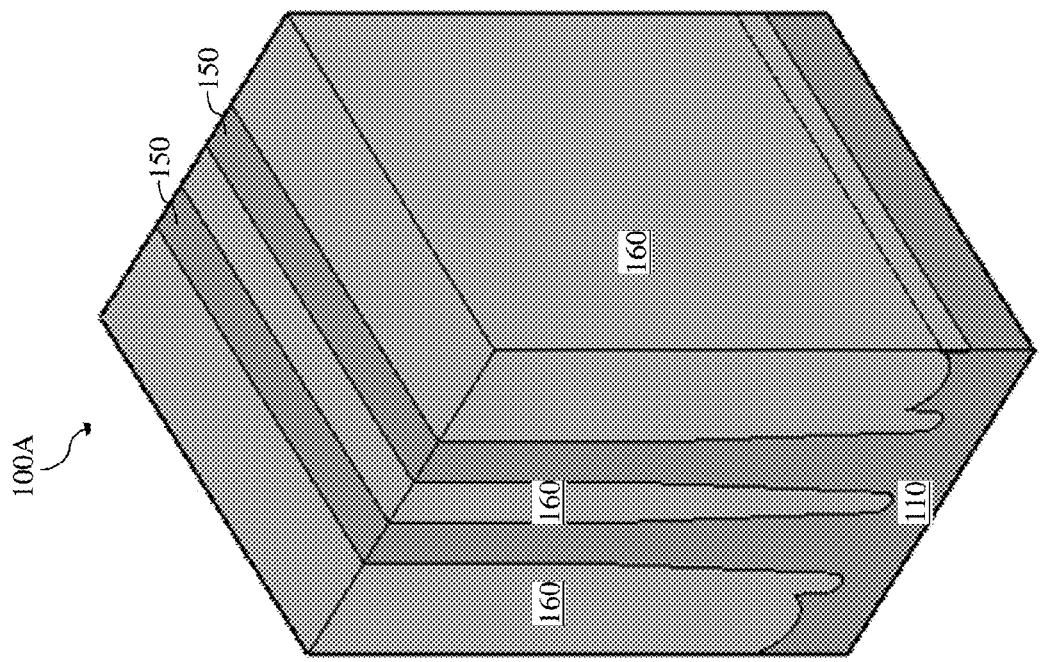
Fig. 19

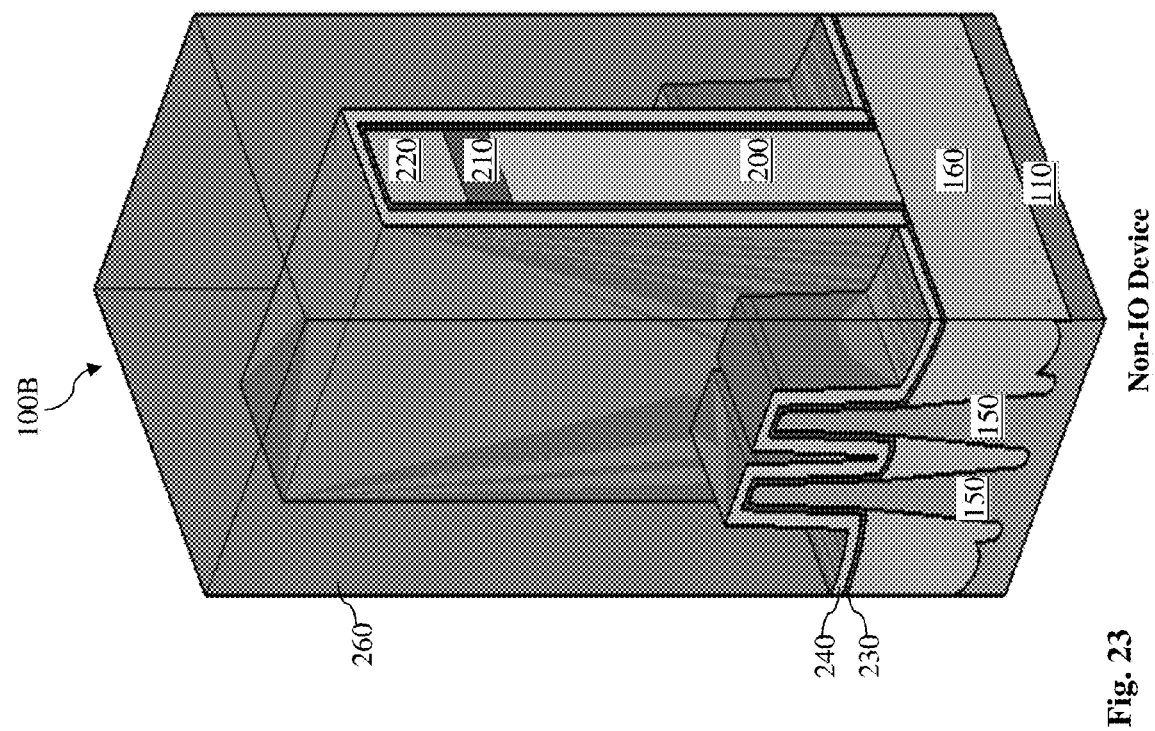
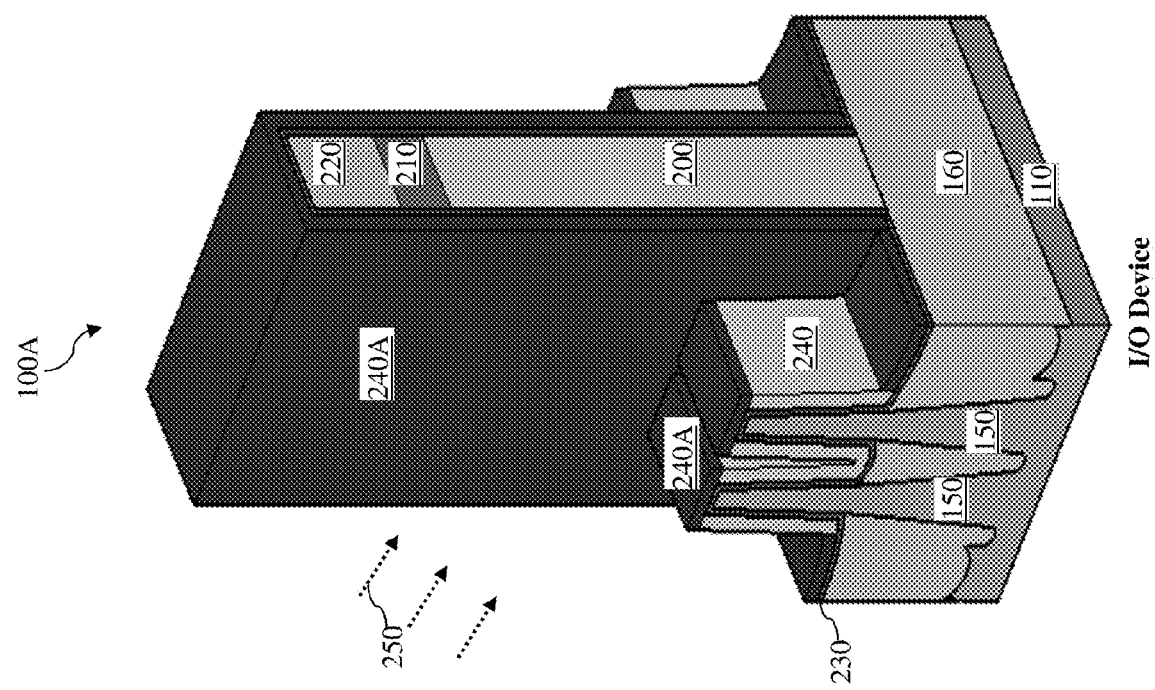

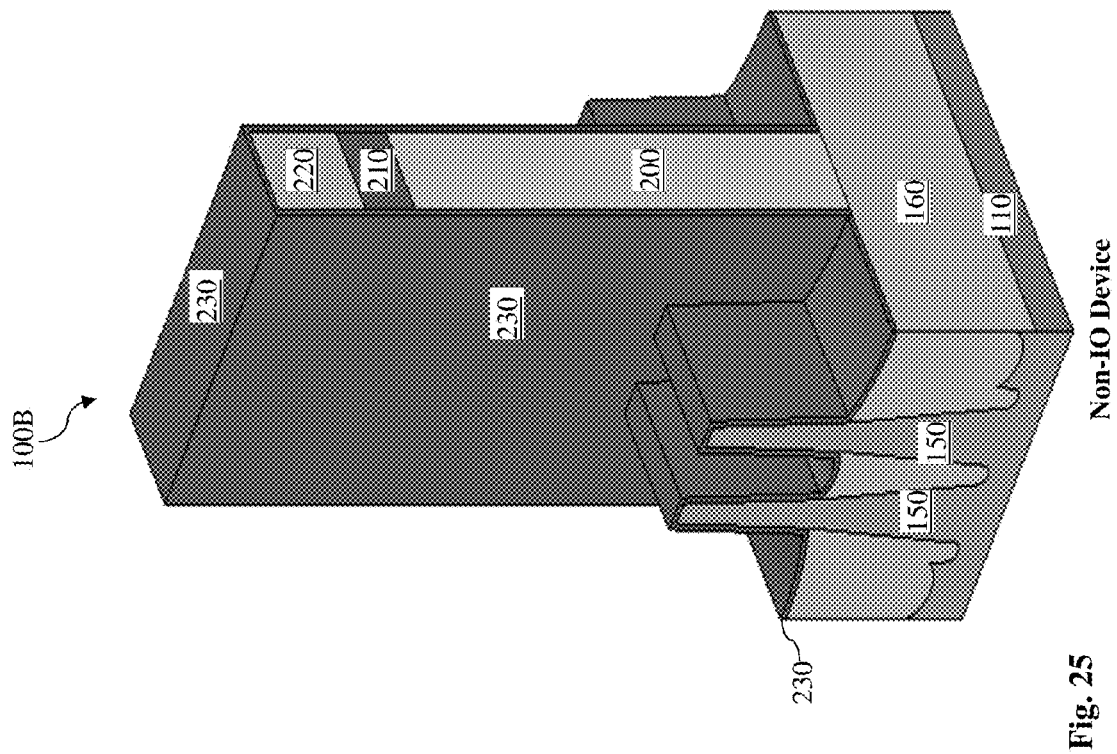
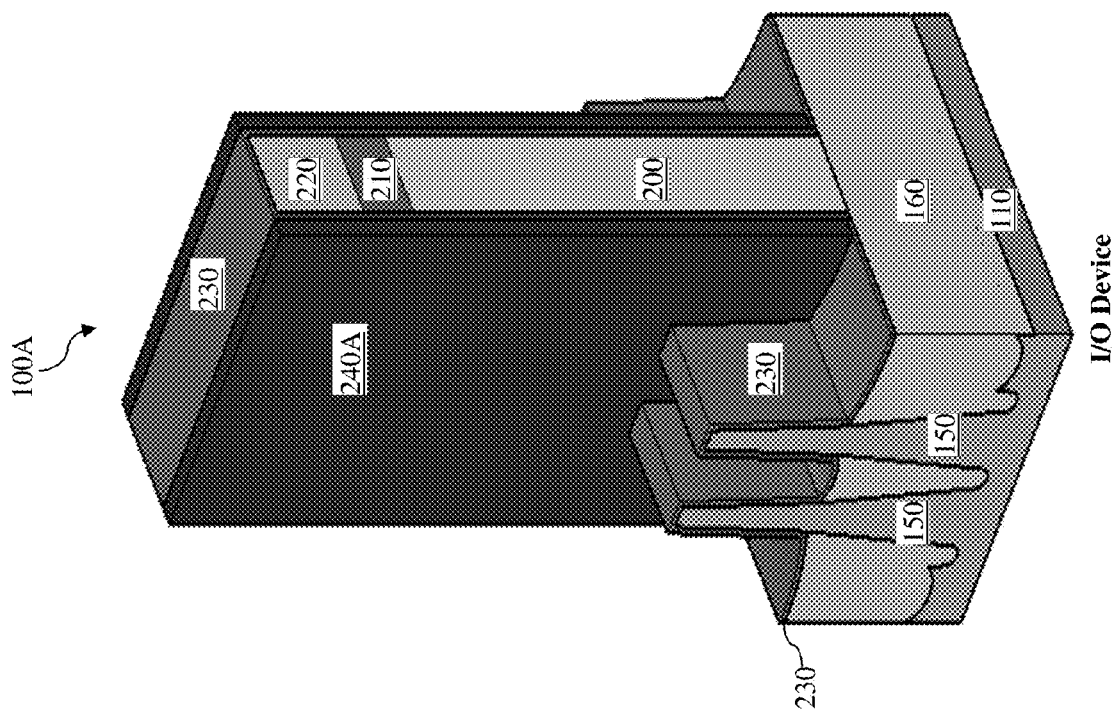
Fig. 25

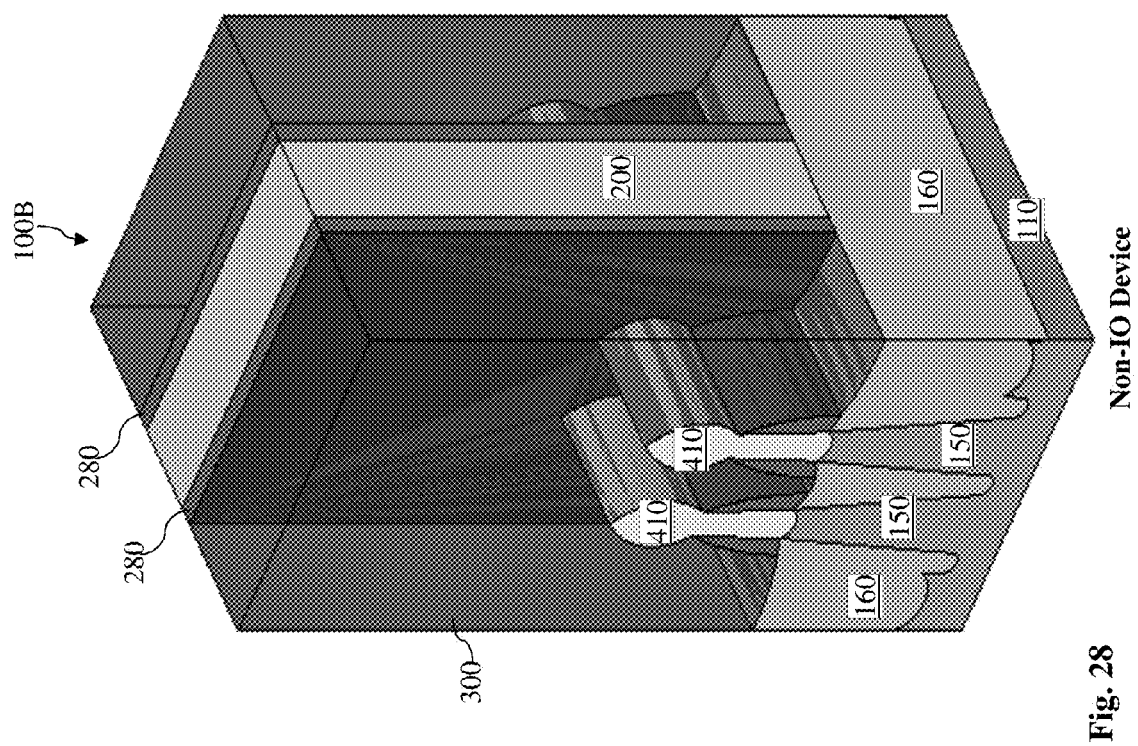
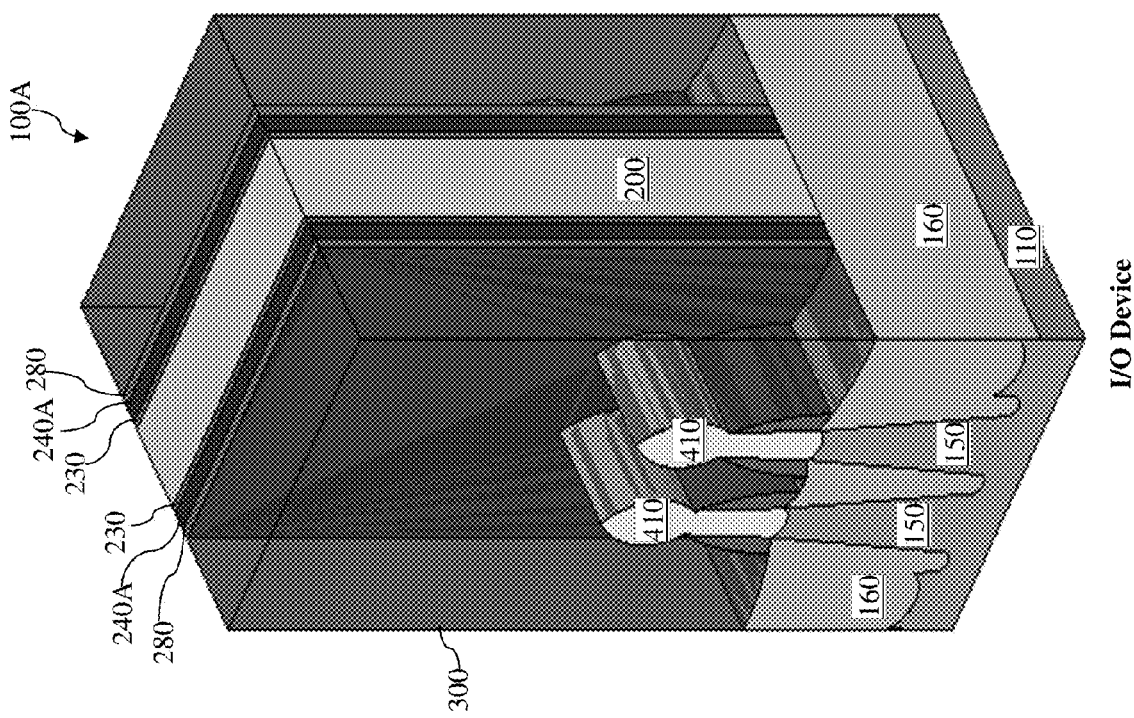
Fig. 28

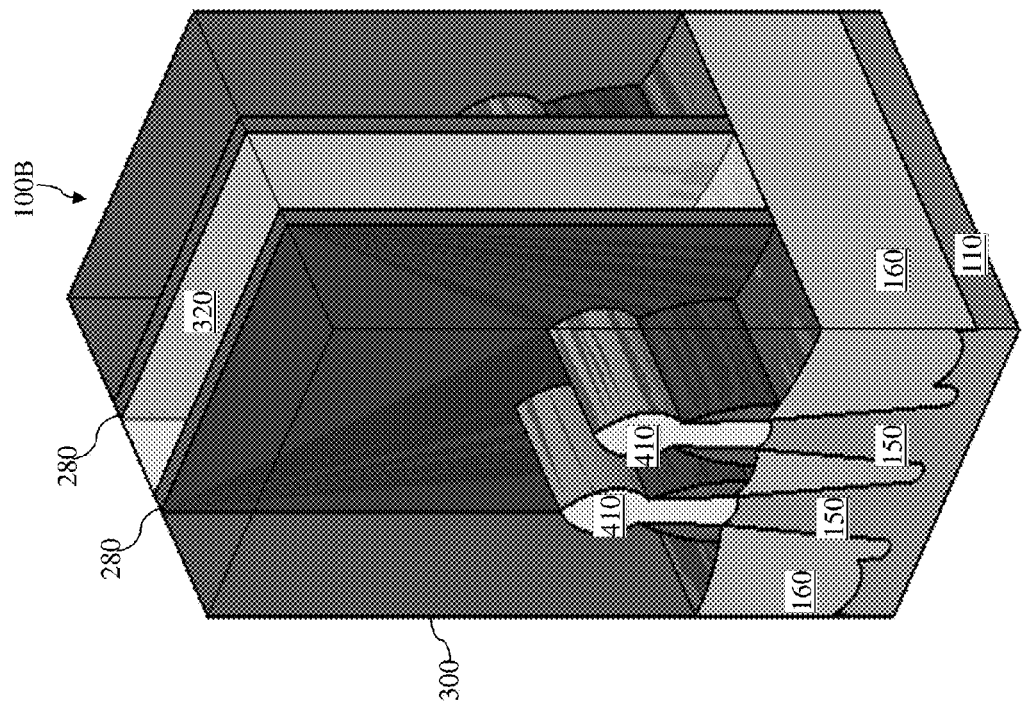
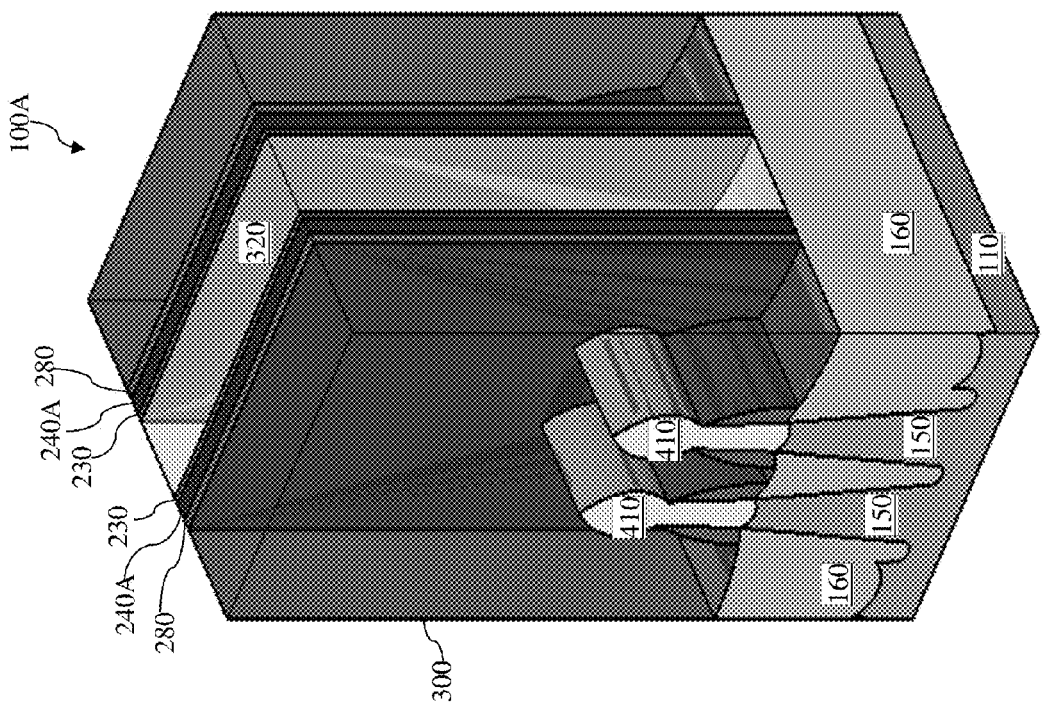
Fig. 30

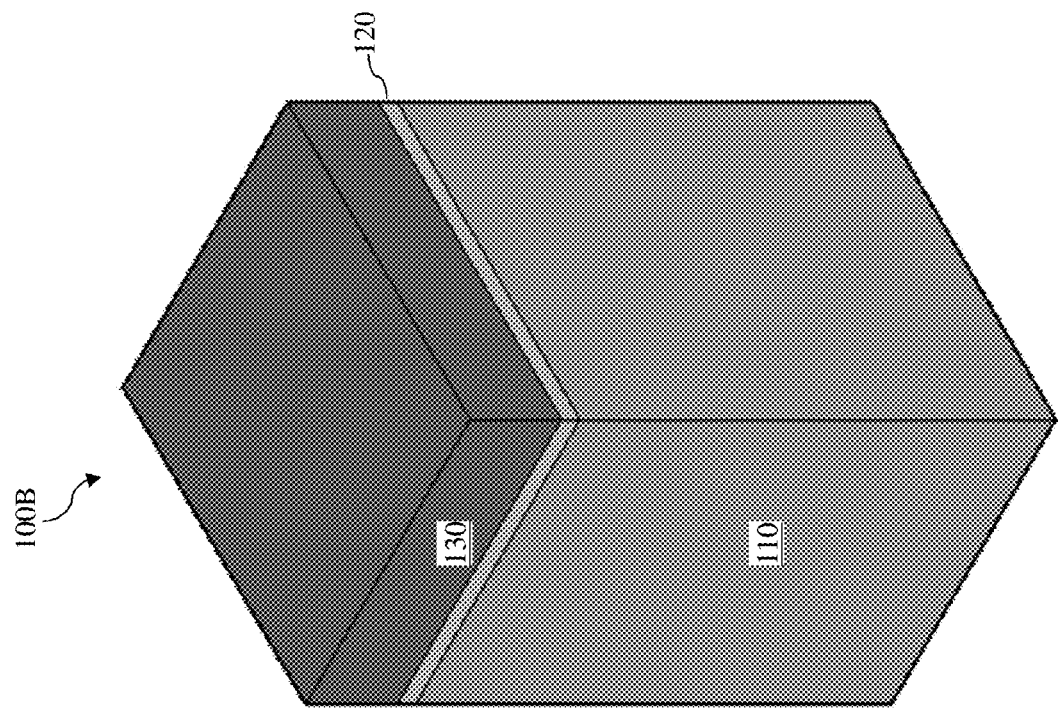
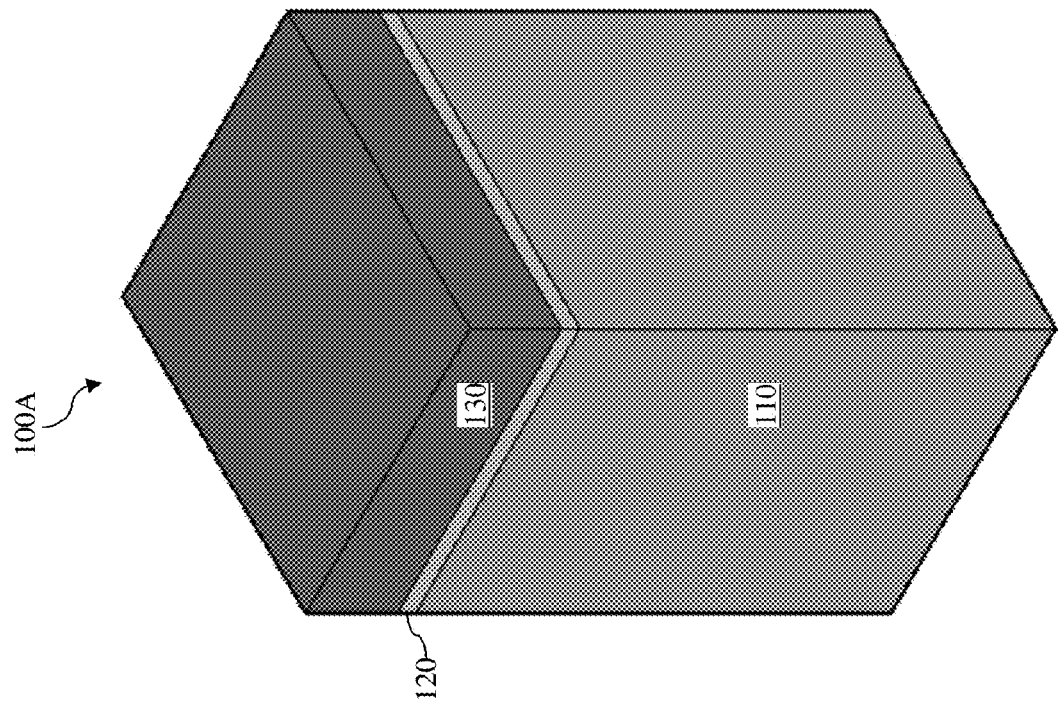
Fig. 32

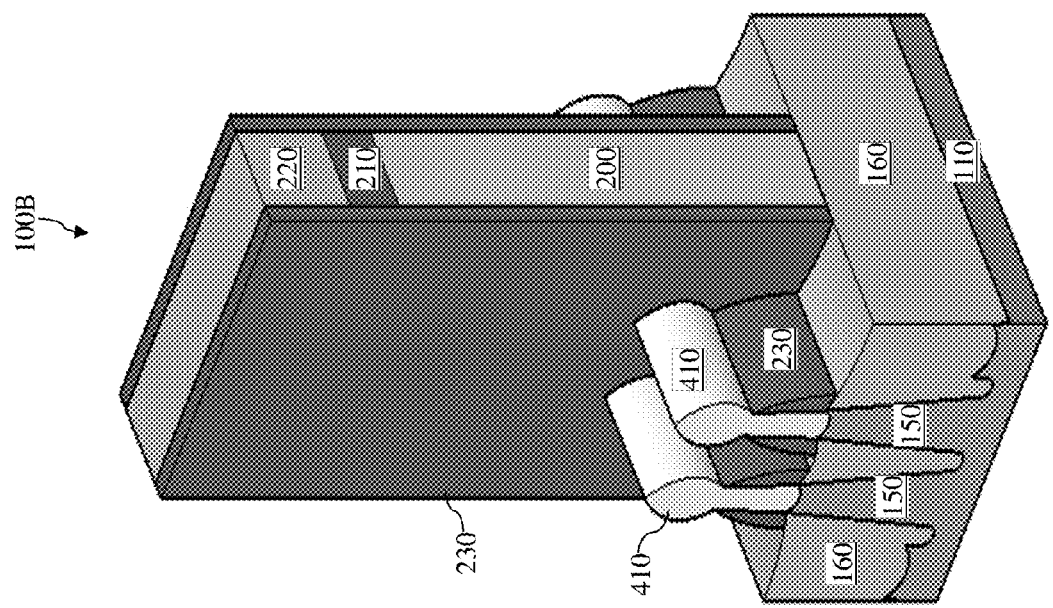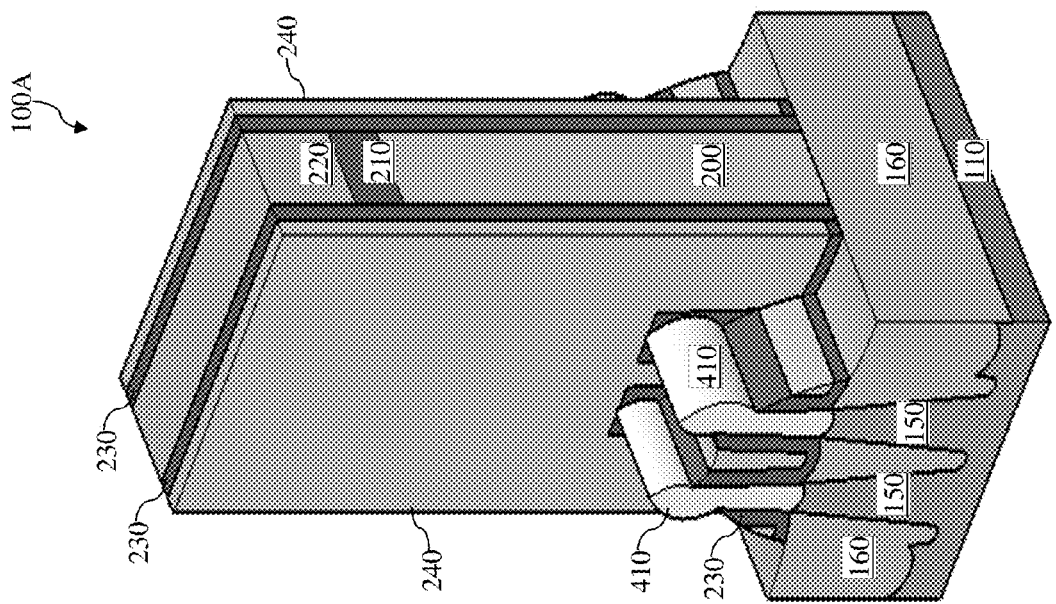
Fig. 41

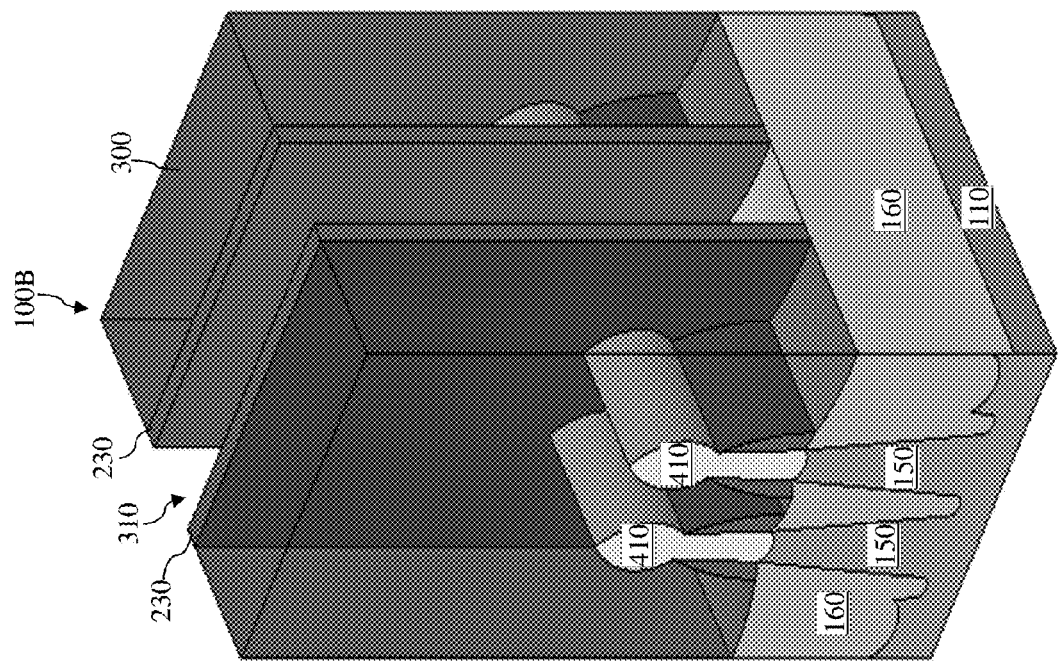
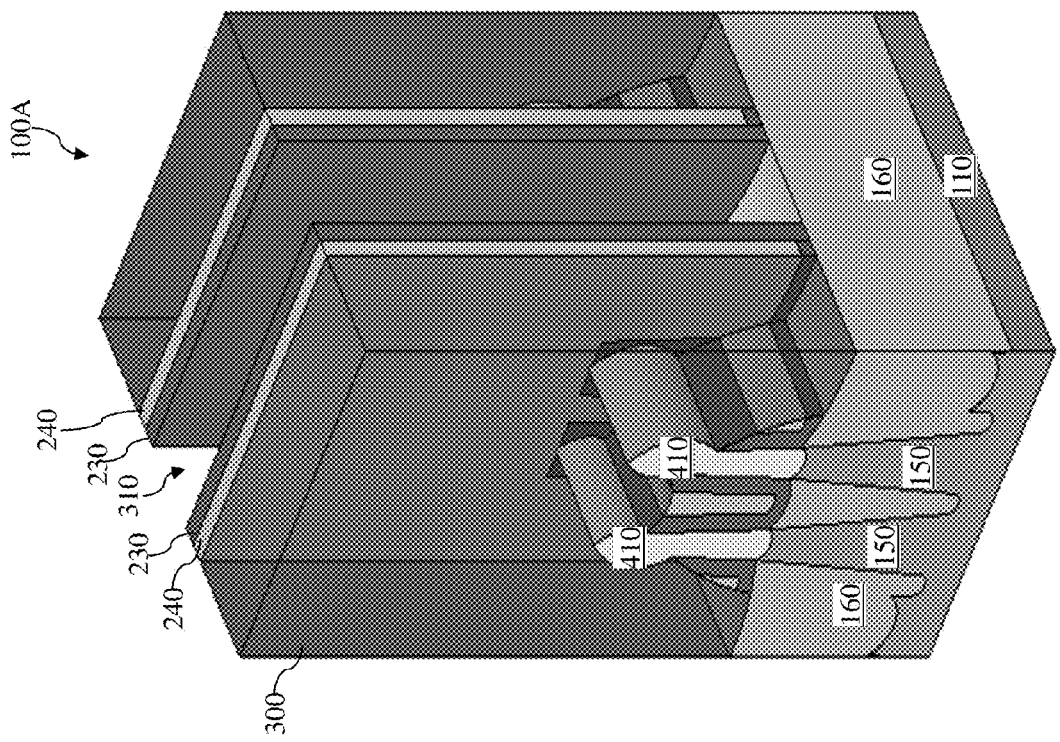
Fig. 43

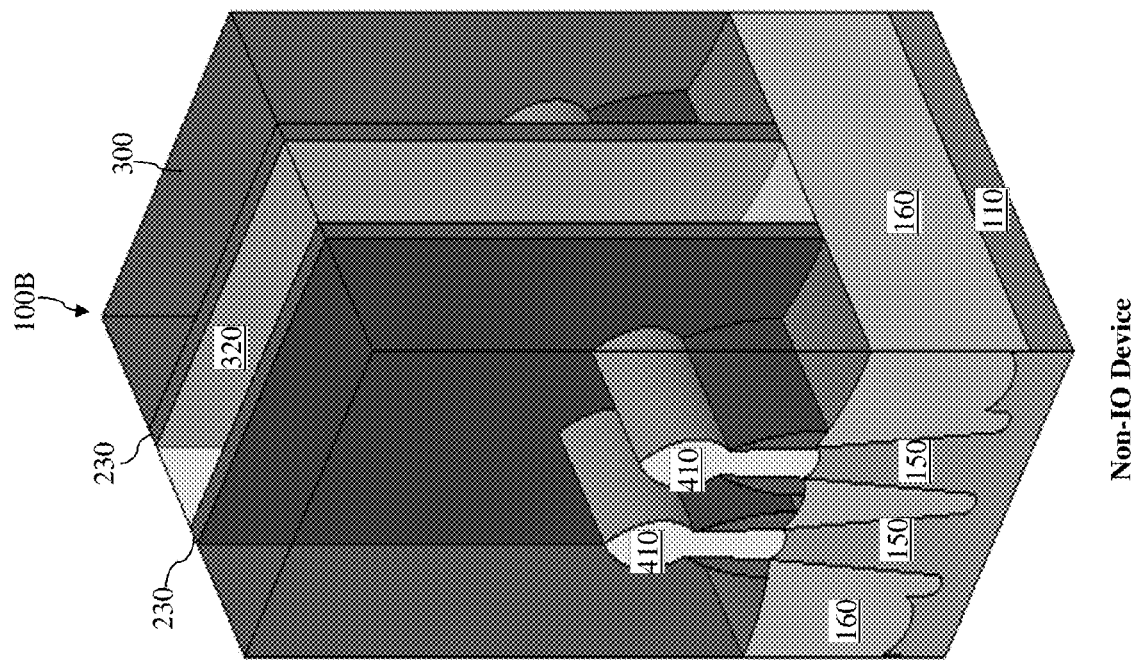
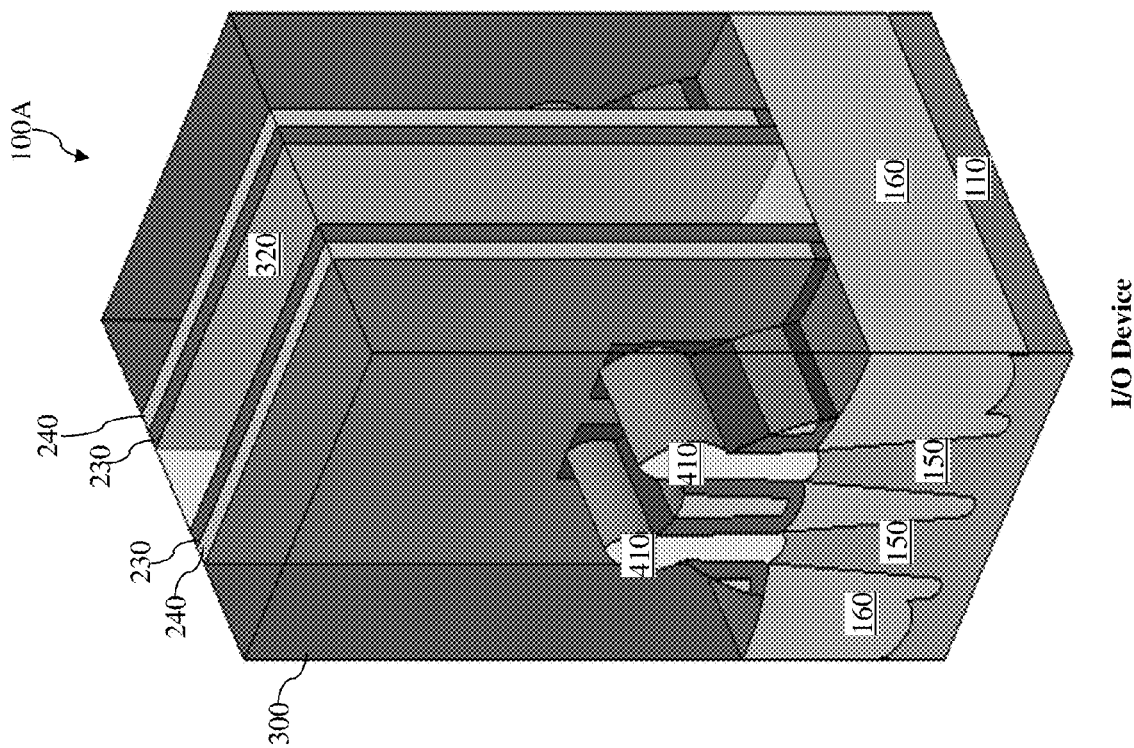
Fig. 44

FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, the source/drain proximity for I/O (Input/Output) FinFET devices is substantially the same as the source/drain proximity for core FinFET devices. This may lead to reliability problems such as breakdown voltage, hot carrier injection, or leakage current.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-15, 17-30, and 32-44 are perspective three-dimensional views of a FinFET device at different stages of fabrication according to various embodiments of the present disclosure.

DETAILED DESCRIPTION

Figure 1:
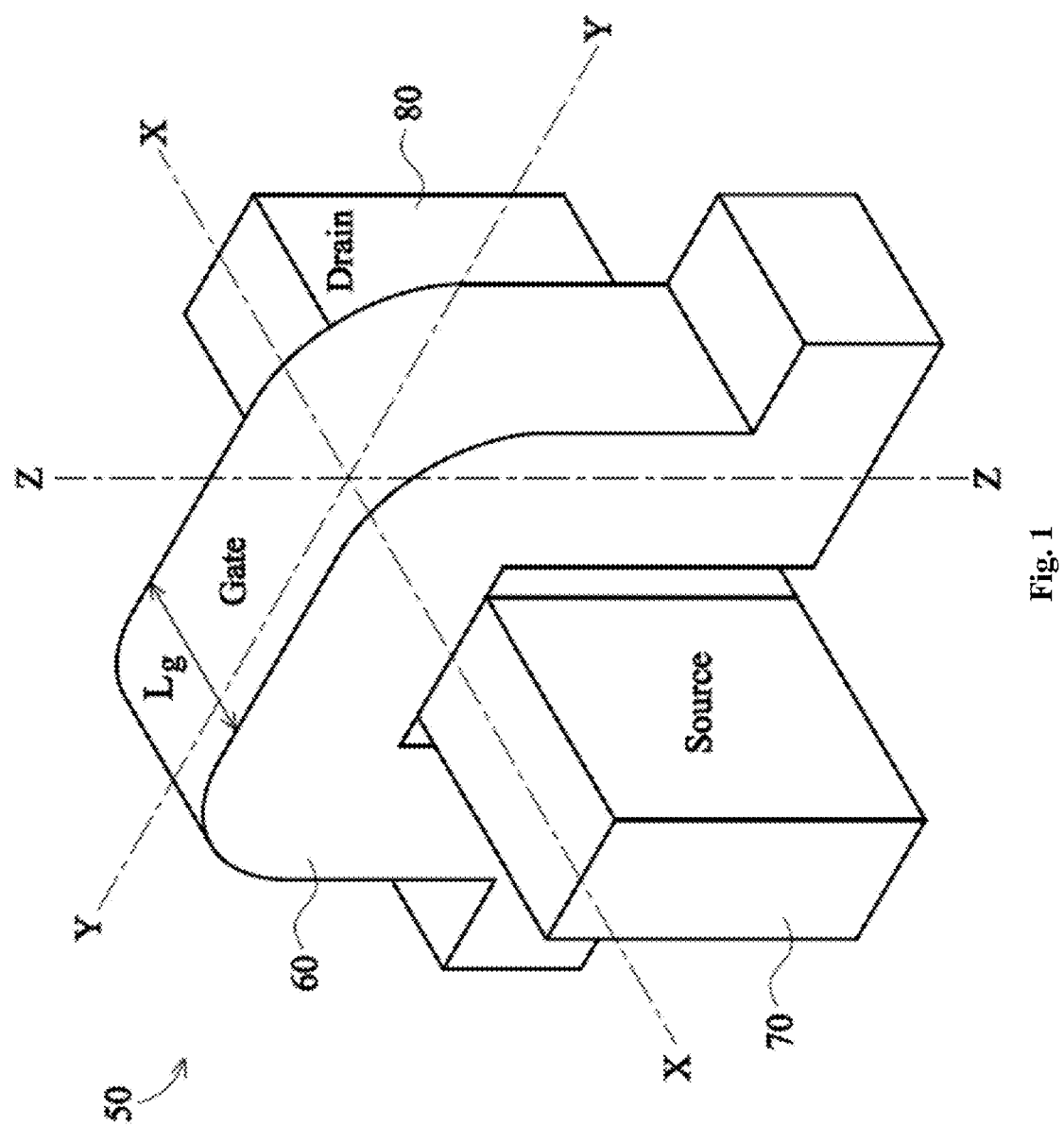
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present invention. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, conventional FinFET fabrication does not distinguish between I/O (Input/Output) devices and non-I/O devices. In some embodiments, the I/O devices are devices that handle the input and/or output voltages/currents, and as such they need to be able to tolerate a greater amount of voltage or current swing than non-I/O devices. In some embodiments, core devices refer to conventional logic devices (that do not need to handle the input/output voltages/currents directly), for example, various logic gates such as NAND, NOR, INVERTER, etc. In some embodiments, the core devices include an SRAM (static random-access memory) region. As a result of conventional fabrication not being able to distinguish between I/O devices and non-I/O devices, the source/drain (S/D) proximity (i.e., the distance between the source and the drain) for I/O FinFET devices is about the same as the S/D proximity for non-IO FinFET devices. This in turn leads to reliability problems such as breakdown voltage, hot carrier injection, and/or leakage current. These reliability problems are exacerbated when IC fabrication progresses to more advanced technology nodes, such as the 10-nanometer node (or smaller nodes). This is at least in part due to the tightened pitch in the advanced IC fabrication technology nodes.

To improve reliability for FinFET devices, the present disclosure utilizes various fabrication techniques to fabricate FinFET devices where the S/D proximity is greater for I/O devices than for the non-I/O devices, as discussed in more detail below with reference to FIGS. 2-50.

FIGS. 2-15 are three-dimensional perspective views of FinFET devices 100A and 100B at various stages of fabrication. The FinFET device 100A is an I/O device, and the FinFET device 100B is a non-I/O device, for example a core device. The FinFET devices 100A-100B are fabricated over the same substrate, which is not specifically illustrated herein for reasons of simplicity. In some embodiments, the substrate includes a dielectric material, for example silicon oxide (SiO2).

A semiconductor layer 110 is formed on the substrate 110. In an embodiment, the semiconductor layer 110 includes a crystal silicon material. An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 110 is in a range from about $1 \times 10^{17}$ ions/cm3 to about $5 \times 10^{19}$ ions/cm3.

A dielectric layer 120 is formed over the semiconductor layer 110. In some embodiments, the dielectric layer 120 contains silicon oxide. A dielectric layer 130 is formed over the dielectric layer 120. The dielectric layer 130 has a different material composition than the dielectric layer 120. In some embodiments, the dielectric layer 130 contains silicon nitride. The dielectric layers 120 and 130 collectively serve as a hard mask layer, which can be used to pattern the semiconductor layer 110 therebelow.

Referring now to FIG. 3, the dielectric layers 130, 120, and the semiconductor layer 110 are patterned through one or more lithography processes to form fin structures (or fins) 150. The lithography processes may include forming a patterned photoresist (not illustrated herein), which may be formed by processes such as deposition, exposure, developing, baking, etc. (not necessarily performed in that order). The patterned photoresist may then be used to pattern the layers below to form the fin structures 150 by etching away portions of the layers 110-130 not protected by the patterned photoresist. It is understood that the portions of the semiconductor layer 110 of the fin structures 150 will serve as the source, drain, and channel regions of the FinFET devices 100A and 100B.

Referring now to FIG. 4, isolation structures 160 are formed to electrically isolate the fins 150. The isolation structures 160 may also be referred to as shallow trench isolation (STI) structures. In some embodiments, the isolation structures 160 contain a dielectric material such as silicon oxide or silicon nitride. The isolation structures 160 may be formed by depositing the dielectric material to fill the openings formed by the fin structures 150 and then performing a polishing process (such as chemical mechanical polishing) to planarize the surface. The dielectric layers 130 and 120 are also removed, which may be performed before or after the formation of the isolation structures 160.

Figure 5:
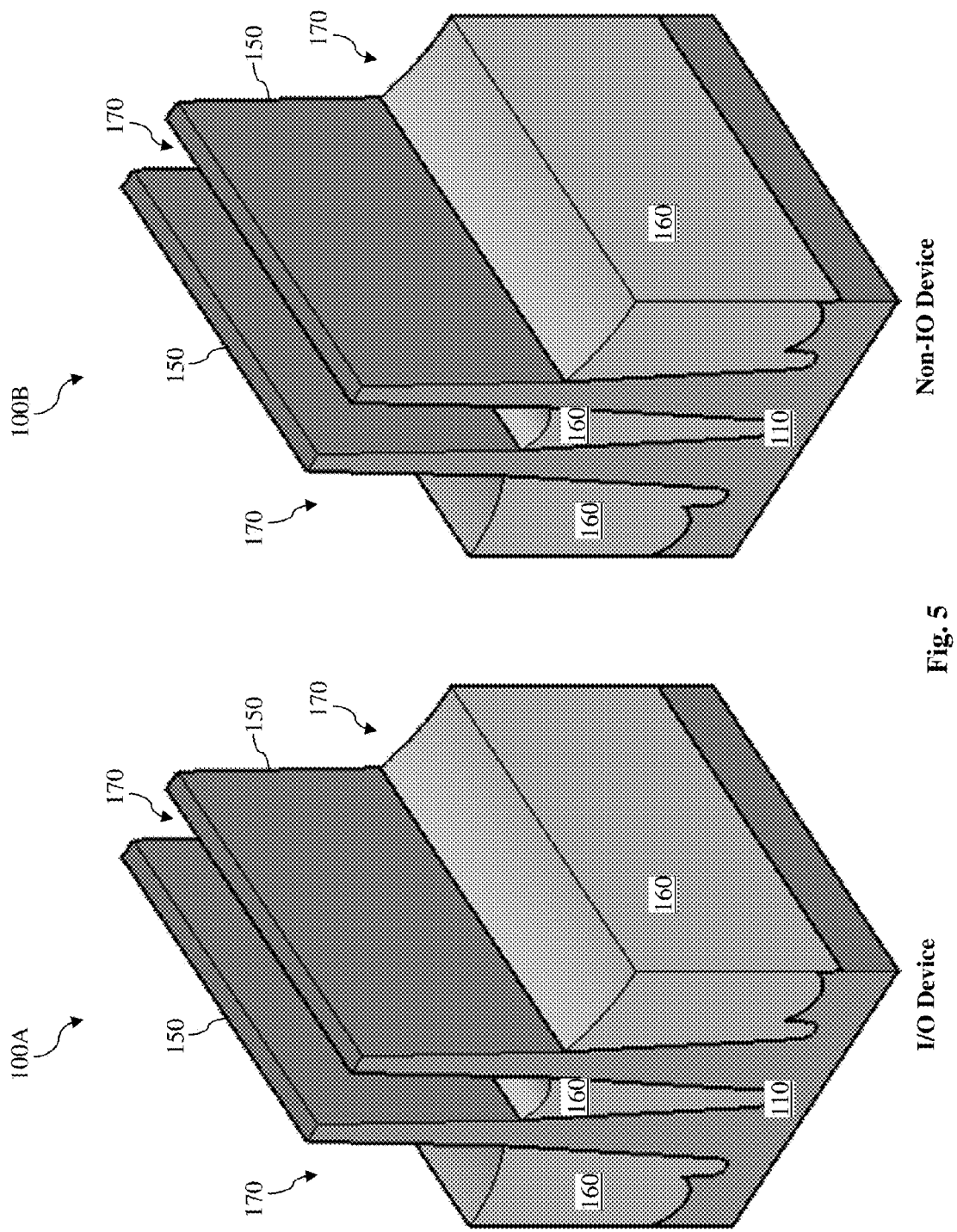

Referring now to FIG. 5, one or more etching processes are performed to form recesses 170. The recesses 170 are formed by removing portions (but not all) of the material from the isolation structures 160. At this point, the fin structures 150 partially protrude upwards and out of the isolation structures 160. In other words, at least a portion of each fin structure 150 is exposed and not covered by the isolation structures 160.

Referring now to FIG. 6, a patterned dummy gate structure 200 is formed over the isolation structures 160. The patterned dummy gate structure 200 is formed by one or more patterning processes. For example, a polysilicon material is formed over the isolation structures 160. A patterned hard mask is formed over the polysilicon material. The patterned hard mask includes a dielectric layer 210 and a dielectric layer 220. In some embodiments, the dielectric layer 210 may contain silicon nitride, and the dielectric layer 220 may contain silicon oxide. The patterned hard mask is then used to pattern (e.g., by one or more etching processes) the polysilicon material below to form the patterned dummy gate structure 200. As is shown in FIG. 6, the patterned dummy gate structure 200 is formed to wrap around the fin structures 150. It is also understood that the dummy gate structure 200 may include a dummy dielectric layer formed below the polysilicon material, but this is not specifically illustrated for the sake of simplicity.

Figure 7:
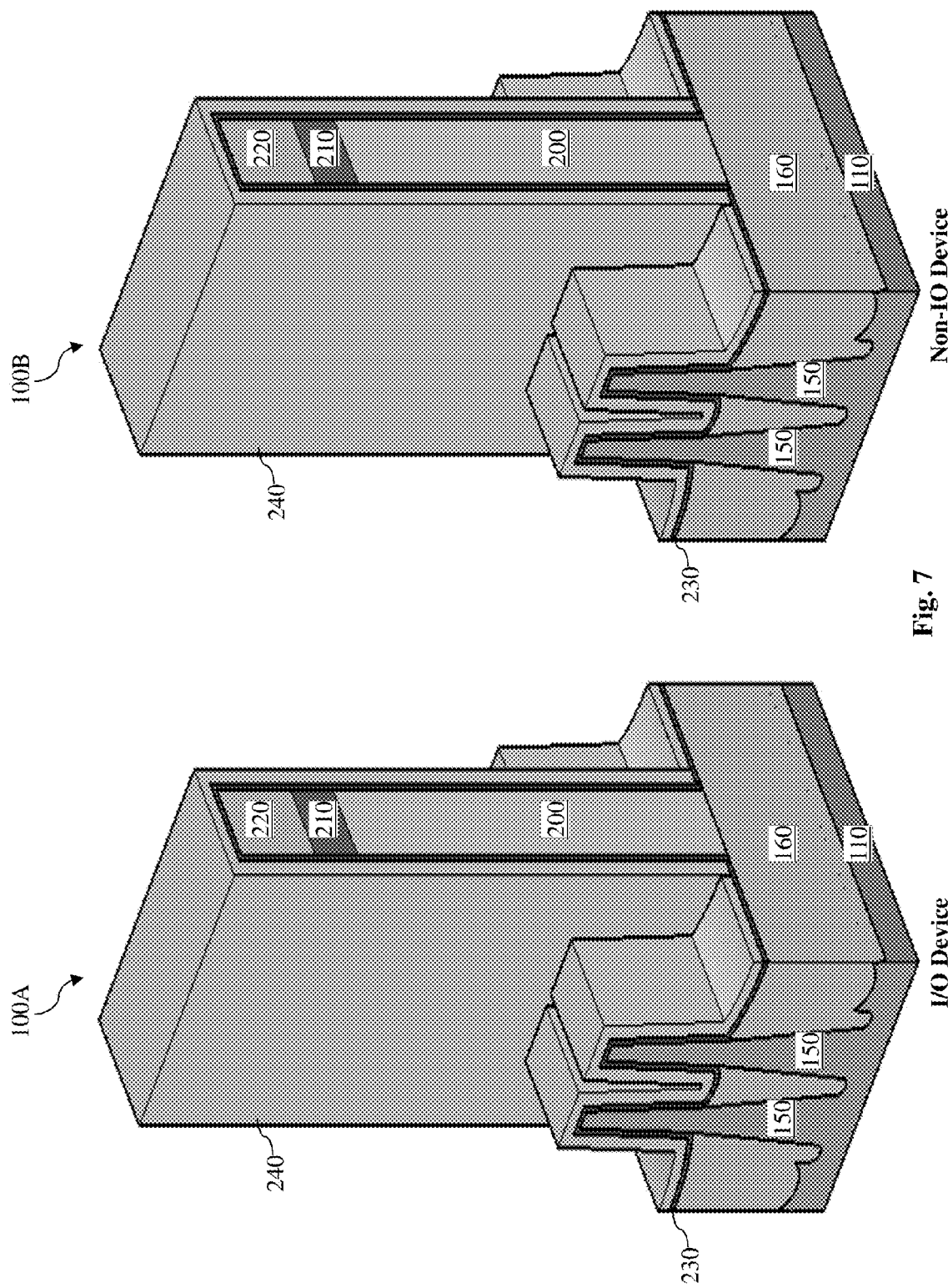

Referring now to FIG. 7, a sealing layer 230 is formed over the isolation structures 160, the fin structures 150, and the dummy gate structure 200. In some embodiments, the sealing layer 230 contains silicon carbon oxynitride (SiCON). In other embodiments, the sealing layer 230 contains silicon oxycarbide (SiOC). A layer 240 is formed on the sealing layer 230. In some embodiments, the layer 240 contains silicon nitride. In other embodiments, the layer 240 contains silicon oxide. In some other embodiments, the layer 240 contains amorphous silicon. In the embodiment shown herein, the layers 230 and 240 are each formed conformally. The layer 240 formed over the I/O device 100A will be transformed into an extra spacer by subsequent processes discussed below.

Up until this stage of fabrication, the same fabrication processes are performed for the I/O device 100A and the non-I/O device 100B. In other words, the I/O device 100A and the non-I/O device 100B are the same at this stage of fabrication. After this point, different fabrication processes will be performed to the I/O device 100A and the non-I/O device 100B.

Referring now to FIG. 8, an ion implantation process 250 is performed to the I/O device 100A. In some embodiments, the ion implantation process 250 implants carbon ions to the layer 240. In other embodiments, the ion implantation process 250 implants boron ions to the layer 240. The ion implantation process 250 is configured such that ions are implanted to the sidewalls of the layer 240 covering the sidewalls of the dummy gate structure 200 as well as upper surfaces of the layer 240. The portions of the layer 240 implanted by the ions are denoted as 240A to differentiate from the portions of the layer 240 that are substantially unaffected by the ion implantation. For example, portions the layer 240 covering the sidewalls of the fin structures 150 are substantially unaffected by the ion implantation. To the extent that any ions are implanted into these portions of the layer 240, they are sufficiently low in quantity and concentration so as to be negligible for the purposes of the present disclosure. In some embodiments, the ion implantation process 250 is performed at a tilt angle, which may be in a range from about 10 degrees to 45 degrees.

Meanwhile, a protective layer 260 is formed over the non I/O device 100B before the ion implantation process 250. In some embodiments, the protective layer 260 contains a photoresist material. The protective layer 260 protects the various layers of the non-I/O device 100B underneath from being implanted by the ions in the implantation process 250. In other words, while ions are implanted into portions of the layer 240 for the I/O device 100A, no ions are implanted into the layer 240 for the non I/O device 100B due to the presence of the protective layer 260.

Referring now to FIG. 9, a dry etching process is performed to remove upper surface portions of the layer 240A (e.g., portions of the layer 240A covering the upper surfaces of the layer 220, the fin structures 150, and the isolation structures 160). However, the dry etching process does not substantially affect the portions of the layer 240A formed on sidewalls of the dummy gate structure 200 for the I/O device 100A. In this manner, spacers are formed by the portions of the layer 240A now remaining on the sidewalls of the dummy gate structure 200. The spacers formed by the portions of the layer 240A are "extra" spacers for reasons to be discussed below, and the reference numeral 240A may hereinafter be used to interchangeably refer to the spacers 240A or the layer 240A implanted by the ions.

Meanwhile, since the non-I/O device 100B has the protective layer 260 formed thereover, the dry etching process does not substantially affect the non-I/O device 100B. In other words, no spacers are formed in the non-I/O device 100B yet.

Referring now to FIG. 10, the protective layer 260 is removed from the non-I/O device 100B, thereby leaving the non-I/O device 100B exposed. An annealing process is also performed to repair/recover the damages caused by the ion implantation process 250. Thereafter, a wet etching process is performed to remove the layer 240 for both the I/O device 100A and the non-I/O device 100B. In some embodiments, hot phosphoric acid is used as an etchant in the wet etching process. Due to the ion implantation, the spacers 240A have different physical properties (such as etching rate) than the layer 240. As a result, the wet etching process does not substantially etch away the spacers 240A (formed on the I/O device 100A) but leaves them substantially intact. In comparison, the layer 240 is removed in its entirety for the non-I/O device 100B, including the portions of the layer 240 covering the sidewalls of the dummy gate structure 200 (and the layers 210-220). At this stage of fabrication, the I/O device 100A has extra spacers 240A that the non-I/O device 100B does not.

Referring now to FIG. 11, spacers 280 are formed for both the I/O device 100A and the non-I/O device 100B. The spacers 280 may be formed by depositing a dielectric material and then etching the dielectric material to form the spacers 280. In some embodiments, the spacers 280 contain silicon carbon oxynitride (SiCON). In other embodiments, the spacers 280 contain silicon oxycarbide (SiOC). For the I/O device 100A, the spacers 280 are formed on the sidewalls of the "extra" spacers 240A. For the non-I/O device 100B, the spacers 280 are formed on the sidewalls of the sealing 230. In the illustrated embodiment, the spacers 280 and the sealing layer 230 have the same material compositions, so they are collectively identified as the spacers 280 hereinafter for reasons of simplicity. Note that the portions of the sealing layer 230 covering the layer 220 are also removed, leaving the upper surfaces of the layer 220 exposed. Note that any dielectric materials that were previously formed on these fin structures 150 have been removed. As such, the fin structures 150 are also exposed at this point of fabrication.

Figure 12:
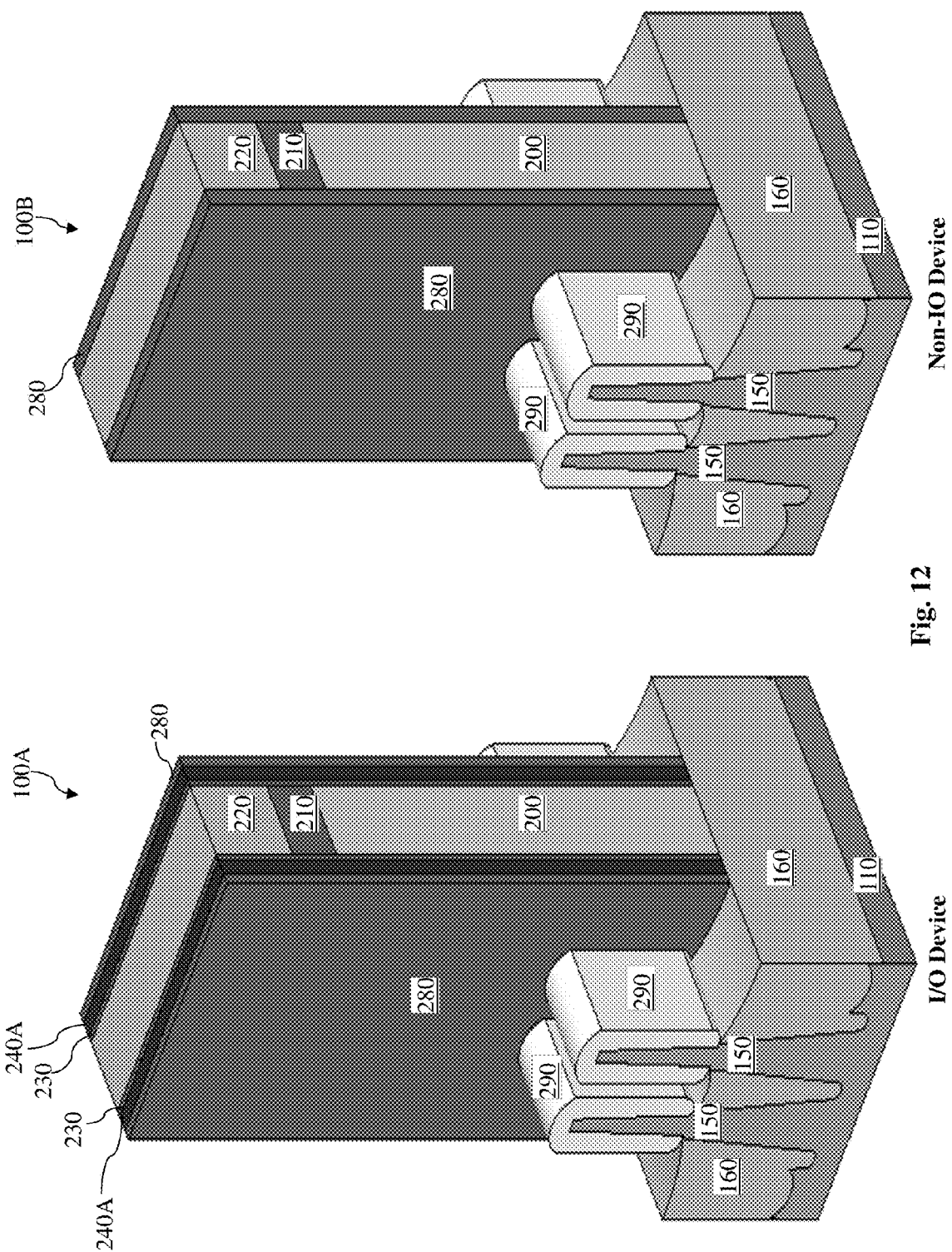
Figure 16:
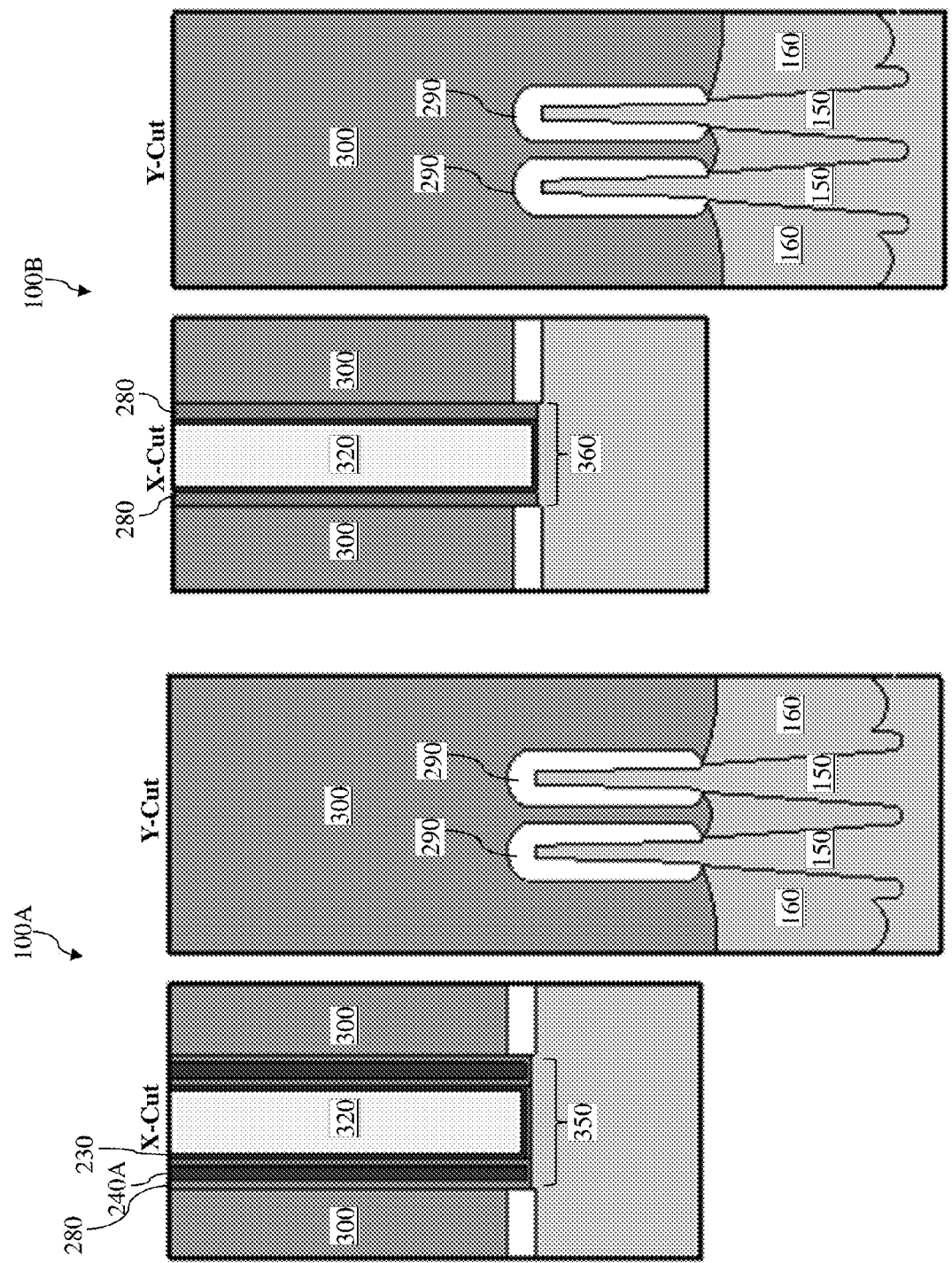
FIGS. 16, 31, and 45-48 are different cross-sectional side views of a FinFET device according to various embodiments of the present disclosure

Referring now to FIG. 12, the fin structures 150 are trimmed or thinned. Source/drain epi regions 290 are formed on the fin structures 150. The source/drain epi regions 290 are formed to wrap around the fin structures 150. These fin trimming process and the source/drain epi region formation are performed for both the I/O device 100A and the non-I/O device 100B.

Referring now to FIG. 13, interlayer dielectric (ILD) 300 is formed over the isolation structures 160 for both the I/O device 100A and the non-I/O device 100B. In some embodiments, the ILD 300 contains silicon oxide. The ILD 300 may be formed by a suitable deposition process. A polishing process such as chemical-mechanical-polishing (CMP) is performed to planarize the upper surface of the ILD 300. The layers 210 and 220 are also removed. The upper surface of the dummy gate structure 200 is now exposed.

Referring now to FIG. 14, the dummy gate structure 200 is removed, thereby forming an opening 310 in both the I/O device 100A and the non-I/O device 100B. The removal of the dummy gate structure 200 includes removing the dummy polysilicon material as well as the dummy dielectric material of the dummy gate structure.

Referring now to FIG. 15, a functional gate structure 320 is formed in the opening 310 for both the I/O device 100A and the non-I/O device 100B. In some embodiments, the functional gate structure 320 includes a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 320. In various embodiments, the fill metal component may contain Aluminum (Al), Tungsten (W), Copper (Cu), or combinations thereof. The replacement of the dummy gate structure 200 by the functional gate structure 320 may be referred to as a gate replacement (or gate last) process.

By forming the "extra" spacers 240A for the I/O device 100A, the present disclosure effectively lengthens the S/D proximity for the I/O device 100A compared to the non-I/O device 100B. This is more clearly illustrated in FIG. 16, which illustrate two different cross-sectional side views for both the I/O device 100A and the non-I/O device 100B. One cross-sectional view is referred to as an "X-cut" view, and the other cross-sectional view is referred to as a "Y-cut" view. The "X-cut" view and the "Y-cut" view are perpendicular to one another.

As the "X-cut" views clearly show, the I/O device 100A has the "extra" spacer 240A that the non-I/O device 100B does not have. As a result, the I/O device 100A has a longer S/D proximity (e.g., the distance between the source and the drain) 350 than a S/D proximity 360 of the non-I/O device 100B. In some embodiments, the "extra" spacer 240A has a lateral dimension that is in a range from about 3 nanometers to about 10 nanometers, and thus the S/D proximity 350 of the I/O device 100A exceeds the S/D proximity 360 of the non-I/O device 100B by about 3 nanometers to about 10 nanometers. The greater S/D proximity of the I/O device 100A enhances its reliability, for example with respect to breakdown voltage, hot carrier injection, or leakage current.

FIGS. 17-31 illustrate another embodiment of the present disclosure for increasing the S/D proximity of the I/O device. For reasons of consistency and clarity, similar components appearing in FIGS. 2-16 are labeled the same in FIGS. 17-31.

Referring now to FIG. 17, the FinFET device 100A is an I/O device, and the FinFET device 100B is a non-I/O device, for example a core device. The FinFET devices 100A-100B are fabricated over the same substrate, which is not specifically illustrated herein for reasons of simplicity. In some embodiments, the substrate includes a dielectric material, for example silicon oxide ($SiO_2$).

A semiconductor layer 110 is formed on the substrate 110. In an embodiment, the semiconductor layer 110 includes a crystal silicon material. An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 110 is in a range from about $1 \times 10^{17}$ ions/cm$^3$ to about $5 \times 10^{19}$ ions/cm$^3$.

A dielectric layer 120 is formed over the semiconductor layer 110. In some embodiments, the dielectric layer 120 contains silicon oxide. A dielectric layer 130 is formed over the dielectric layer 120. The dielectric layer 130 has a different material composition than the dielectric layer 120. In some embodiments, the dielectric layer 130 contains silicon nitride. The dielectric layers 120 and 130 collectively serve as a hard mask layer, which can be used to pattern the semiconductor layer 110 therebelow.

Figure 18:
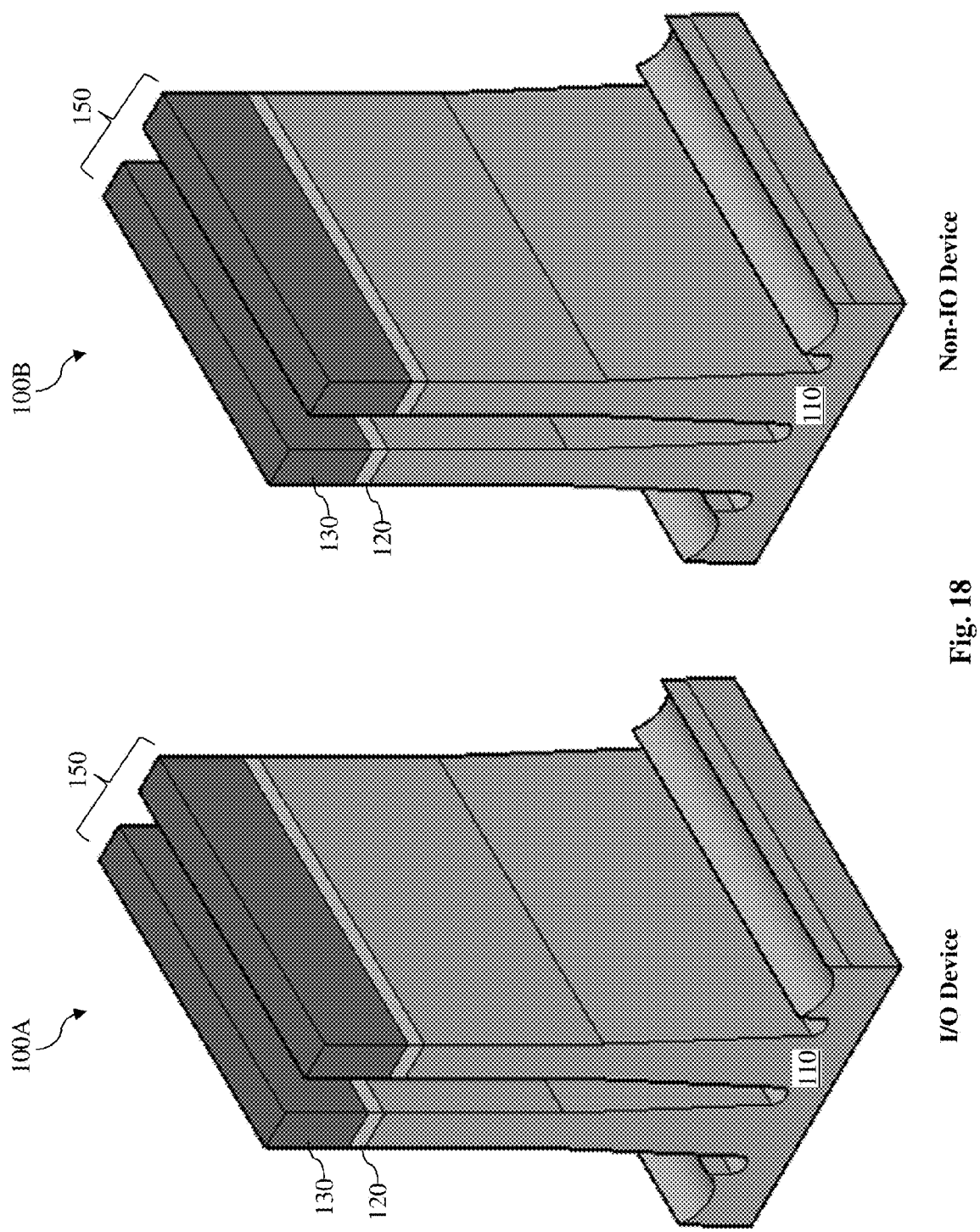

Referring now to FIG. 18, the dielectric layers 130, 120, and the semiconductor layer 110 are patterned through one or more lithography processes to form fin structures (or fins) 150. The lithography processes may include forming a patterned photoresist (not illustrated herein), which may be formed by processes such as deposition, exposure, developing, baking, etc. (not necessarily performed in that order). The patterned photoresist may then be used to pattern the layers below to form the fin structures 150 by etching away portions of the layers 110-130 not protected by the patterned photoresist. It is understood that the portions of the semiconductor layer 110 of the fin structures 150 will serve as the source, drain, and channel regions of the FinFET devices 100A and 100B.

Referring now to FIG. 19, isolation structures 160 are formed to electrically isolate the fins 150. The isolation structures 160 may also be referred to as shallow trench isolation (STI) structures. In some embodiments, the isolation structures 160 contain a dielectric material such as silicon oxide or silicon nitride. The isolation structures 160 may be formed by depositing the dielectric material to fill the openings formed by the fin structures 150 and then performing a polishing process (such as chemical mechanical polishing) to planarize the surface of the dielectric material. The dielectric layers 130 and 120 are also removed, which may be performed before or after the formation of the isolation structures 160.

Figure 20:
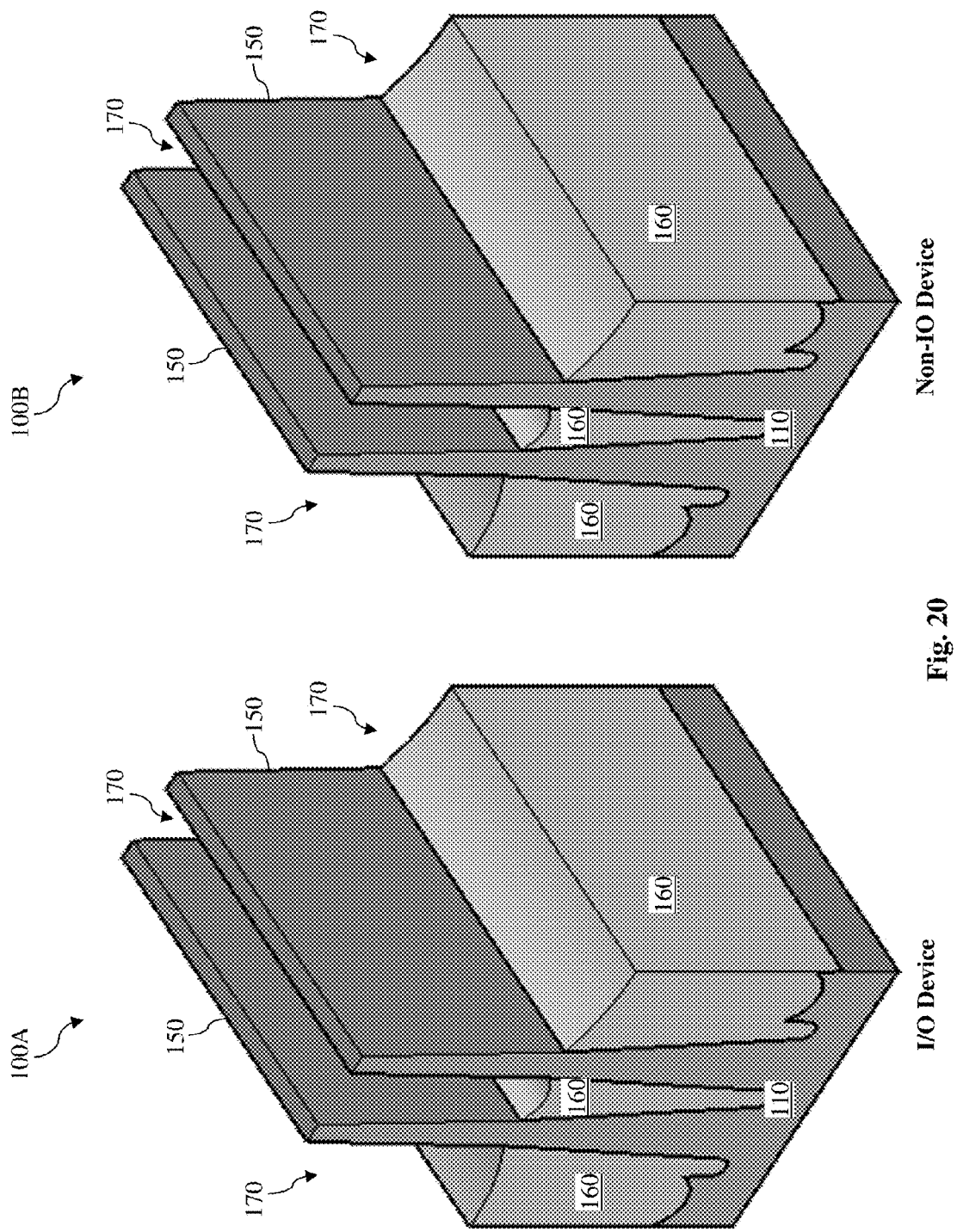

Referring now to FIG. 20, one or more etching processes are performed to form recesses 170. The recesses 170 are formed by removing portions (but not all) of the material from the isolation structures 160. At this point, the fin structures 150 partially protrude upwards and out of the isolation structures 160. In other words, at least a portion of each fin structure 150 is exposed and not covered by the isolation structures 160.

Figure 21:
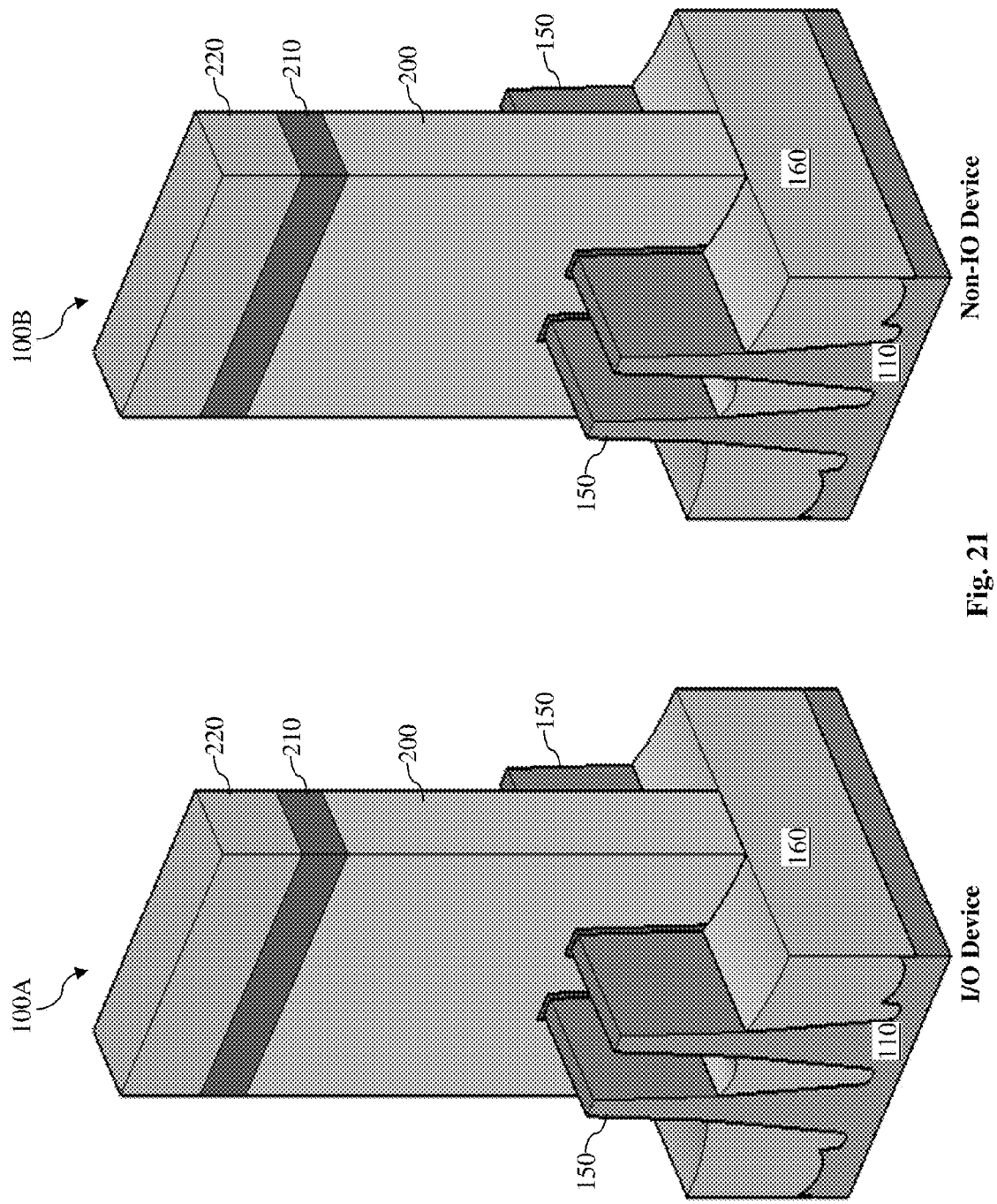

Referring now to FIG. 21, a patterned dummy gate structure 200 is formed over the isolation structures 160. The patterned dummy gate structure 200 is formed by one or more patterning processes. For example, a polysilicon material is formed over the isolation structures 160. A patterned hard mask is formed over the polysilicon material. The patterned hard mask includes a dielectric layer 210 and a dielectric layer 220. In some embodiments, the dielectric layer 210 may contain silicon nitride, and the dielectric layer 220 may contain silicon oxide. The patterned hard mask is then used to pattern (e.g., by one or more etching processes) the polysilicon material below to form the patterned dummy gate structure 200. As is shown in FIG. 21, the patterned dummy gate structure 200 is formed to wrap around the fin structures 150. It is also understood that the dummy gate structure 200 may include a dummy dielectric layer formed below the polysilicon material, but this is not specifically illustrated for the sake of simplicity.

Figure 22:
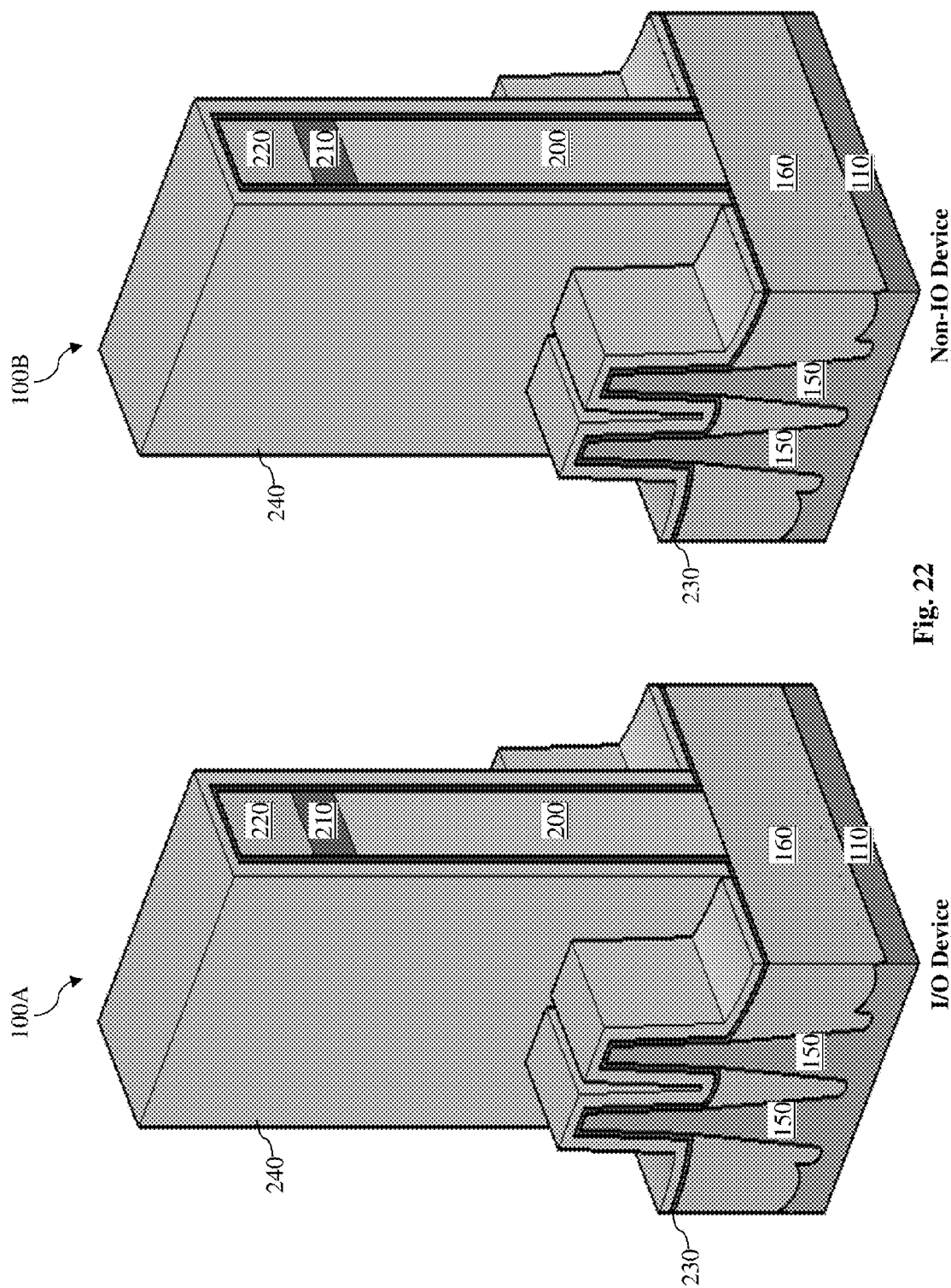

Referring now to FIG. 22, a sealing layer 230 is formed over the isolation structures 160, the fin structures 150, and the dummy gate structure 200. In some embodiments, the sealing layer 230 contains silicon carbon oxynitride (Si-CON). In other embodiments, the sealing layer 230 contains silicon oxycarbide (SiOC). A layer 240 is then formed on the sealing layer 230. In some embodiments, the layer 240 contains silicon nitride. In other embodiments, the layer 240 contains silicon oxide. In some other embodiments, the layer 240 contains amorphous silicon. In the embodiment shown herein, the layers 230 and 240 are each formed conformally. The layer 240 formed over the I/O device 100A will be transformed into an extra spacer by subsequent processes discussed below.

Up until this stage of fabrication, the same fabrication processes are performed for the I/O device 100A and the non-I/O device 100B. In other words, the I/O device 100A and the non-I/O device 100B are the same at this stage of fabrication. After this point, different fabrication processes will be performed to the I/O device 100A and the non-I/O device 100B.

Referring now to FIG. 23, an ion implantation process 250 is performed to the I/O device 100A. In some embodiments, the ion implantation process 250 implants carbon ions to the layer 240. In other embodiments, the ion implantation process 250 implants boron ions to the layer 240. The ion implantation process 250 is configured such that ions are implanted to the sidewalls of the layer 240 covering the sidewalls of the dummy gate structure 200 as well as upper surfaces of the layer 240. The portions of the layer 240 implanted by the ions are denoted as 240A to differentiate from the portions of the layer 240 that are substantially unaffected by the ion implantation. For example, portions the layer 240 covering the sidewalls of the fin structures 150 are substantially unaffected by the ion implantation. To the extent that any ions are implanted into these portions of the layer 240, they are sufficiently low in quantity and concentration so as to be negligible for the purposes of the present disclosure. In some embodiments, the ion implantation process 250 is performed at a tilt angle, which may be in a range from about 10 degrees to 45 degrees.

Meanwhile, a protective layer 260 is formed over the non I/O device 100B before the ion implantation process 250. In some embodiments, the protective layer 260 contains a photoresist material. The protective layer 260 protects the various layers of the non-I/O device 100B underneath from being implanted by the ions in the implantation process 250. In other words, while ions are implanted into portions of the layer 240 for the I/O device 100A, no ions are implanted into the layer 240 for the non I/O device 100B due to the presence of the protective layer 260.

Figure 24:
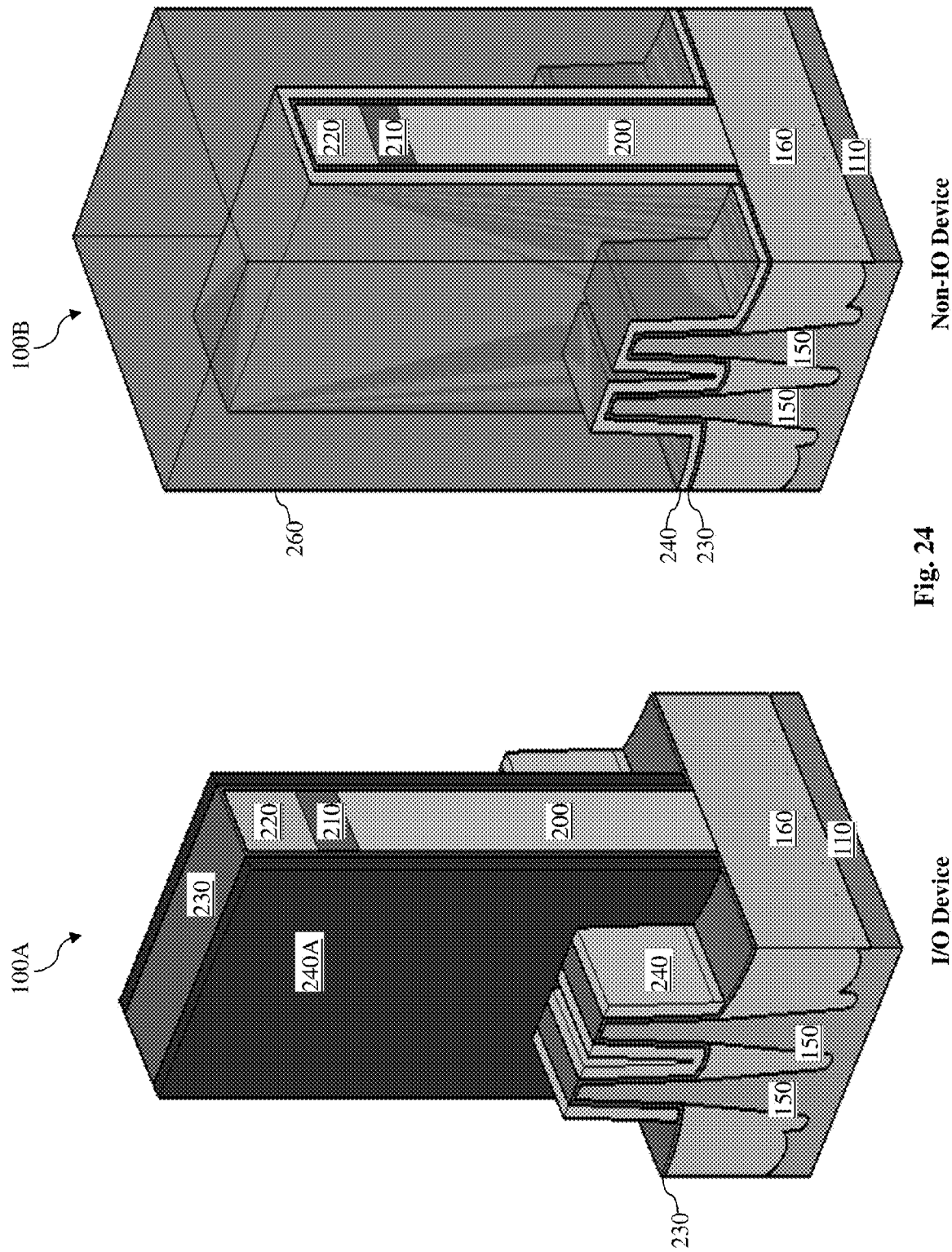

Referring now to FIG. 24, a dry etching process is performed to remove upper surface portions of the layer 240A (e.g., portions of the layer 240A covering the upper surfaces of the layer 220, the fin structures 150, and the isolation structures 160). However, the dry etching process does not substantially affect the portions of the layer 240A formed on sidewalls of the dummy gate structure 200 for the I/O device 100A. In this manner, spacers are formed by the portions of the layer 240A now remaining on the sidewalls of the dummy gate structure 200. The spacers formed by the portions of the layer 240A are "extra" spacers for reasons to be discussed below, and the reference numeral 240A may hereinafter be used to interchangeably refer to the spacers 240A or the layer 240A implanted by the ions.

Meanwhile, since the non-I/O device 100B has the protective layer 260 formed thereover, the dry etching process does not substantially affect the non-I/O device 100B. In other words, no spacers are formed in the non-I/O device 100B yet.

Referring now to FIG. 25, the protective layer 260 is removed from the non-I/O device 100B, thereby leaving the non-I/O device 100B exposed. An annealing process is also performed to repair/recover the damages caused by the ion implantation process 250. Thereafter, a wet etching process is performed to remove the layer 240 for both the I/O device 100A and the non-I/O device 100B. In some embodiments, hot phosphoric acid is used as an etchant in the wet etching process. Due to the ion implantation, the spacers 240A have different physical properties (such as etching rate) than the layer 240. As a result, the wet etching process does not substantially etch away the spacers 240A (formed on the I/O device 100A) but leaves them substantially intact. In comparison, the layer 240 is removed in its entirety for the non-I/O device 100B, including the portions of the layer 240 covering the sidewalls of the dummy gate structure 200 (and the layers 210-220). At this stage of fabrication, the I/O device 100A has extra spacers 240A that the non-I/O device 100B does not.

Figure 26:
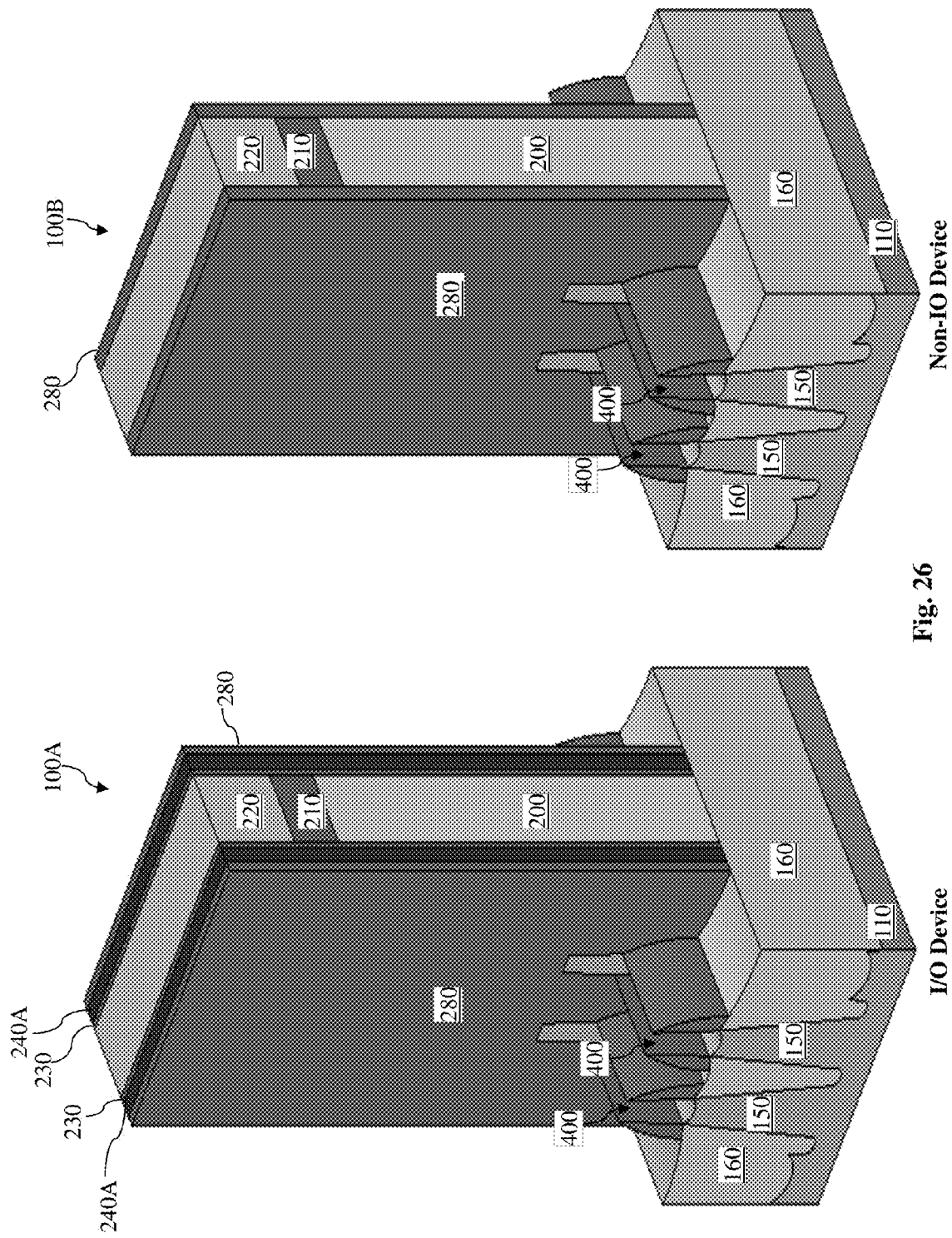

Referring now to FIG. 26, spacers 280 are formed for both the I/O device 100A and the non-I/O device 100B. The spacers 280 may be formed by depositing a dielectric material and then etching the dielectric material to form the spacers 280. In some embodiments, the spacers 280 contain silicon carbon oxynitride (SiCON). In other embodiments, the spacers 280 contain silicon oxycarbide (SiOC). For the I/O device 100A, the spacers 280 are formed on the sidewalls of the "extra" spacers 240A. For the non-I/O device 100B, the spacers 280 are formed on the sidewalls of the sealing 230. In the illustrated embodiment, the spacers 280 and the sealing layer 230 have the same material compositions, so they are collectively identified as the spacers 280 hereinafter for reasons of simplicity. Note that the portions of the sealing layer 230 covering the layer 220 are also removed, leaving the upper surfaces of the layer 220 exposed.

In addition, portions of the fin structures 150 over the isolation structures 160 are removed. The spacers 280 that were previously formed on the sidewalls of these fin structures 150 (now removed) are now separated by openings 400.

Figure 27:
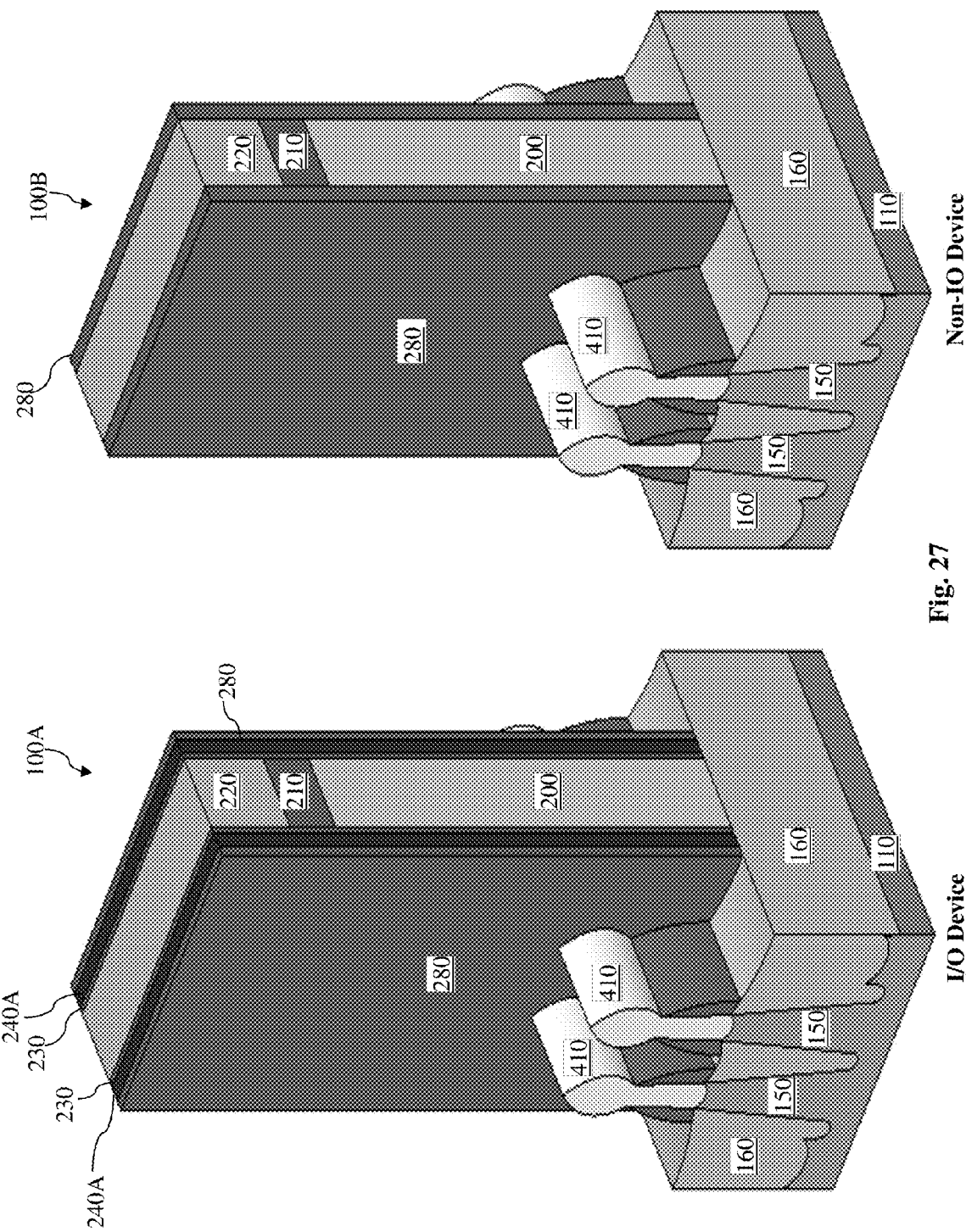

Referring now to FIG. 27, source and drain regions 410 are formed in the openings 400 for both the I/O device 100A and the non-I/O device 100B, for example by an epitaxial growth process. As is shown by FIG. 27, the source and drain regions 410 protrude out of the openings 400 and may have a curved cross-sectional contour.

Referring now to FIG. 28, interlayer dielectric (ILD) 300 is formed over the isolation structures 160 for both the I/O device 100A and the non-I/O device 100B. In some embodiments, the ILD 300 contains silicon oxide. The ILD 300 may be formed by a suitable deposition process. A polishing process such as chemical-mechanical-polishing (CMP) is performed to planarize the upper surface of the ILD 300. The layers 210 and 220 are also removed. The upper surface of the dummy gate structure 200 is now exposed.

Figure 29:
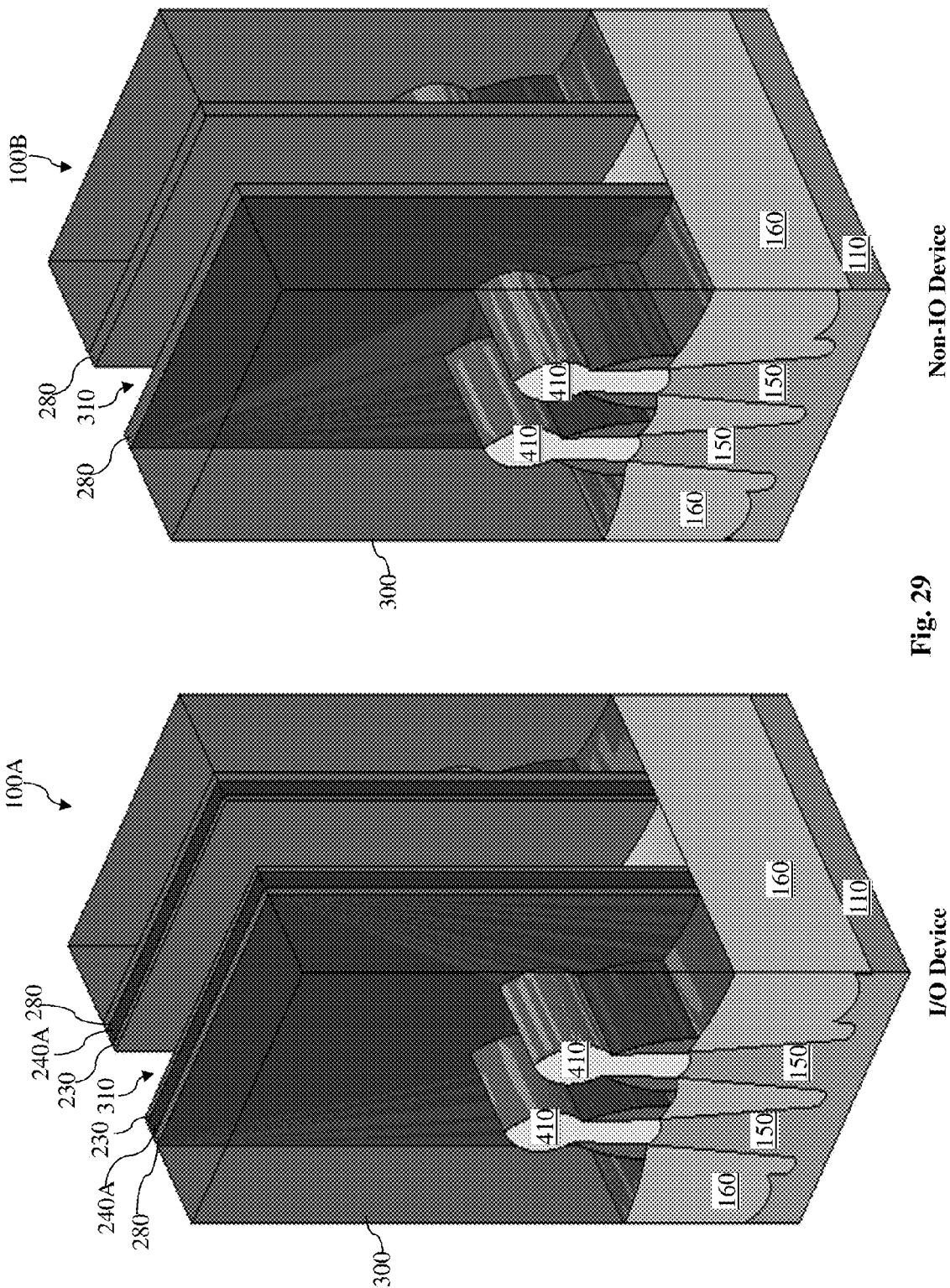
Figure 31:
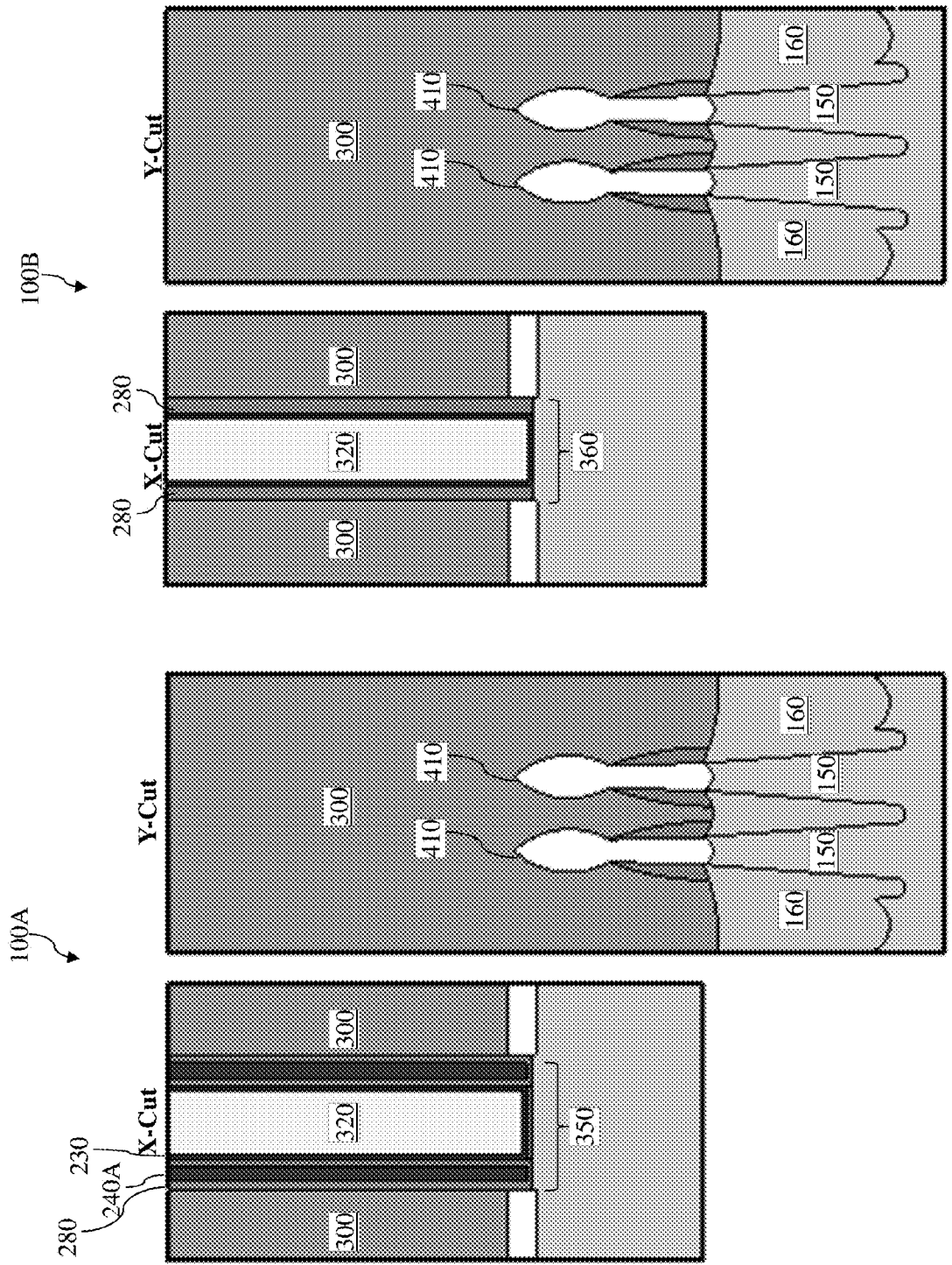

Referring now to FIG. 29, the dummy gate structure 200 is removed, thereby forming an opening 310 in both the I/O device 100A and the non-I/O device 100B. The removal of the dummy gate structure 200 includes removing the dummy polysilicon material as well as the dummy dielectric material of the dummy gate structure.

Referring now to FIG. 30, a functional gate structure 320 is formed in the opening 310 for both the I/O device 100A and the non-I/O device 100B. In some embodiments, the functional gate structure 320 includes a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 320. In various embodiments, the fill metal component may contain Aluminum (Al), Tungsten (W), Copper (Cu), or combinations thereof. The replacement of the dummy gate structure 200 by the functional gate structure 320 may be referred to as a gate replacement (or gate last) process.

Similar to the embodiment discussed above with reference to FIGS. 2-16, the embodiment corresponding to FIGS. 17-30 also form the "extra" spacers 240A for the I/O device 100A. By doing so, the S/D proximity for the I/O device 100A is effectively lengthened compared to the non-I/O device 100B. This is more clearly illustrated in FIG. 31, which illustrate two different cross-sectional side views for both the I/O device 100A and the non-I/O device 100B. One cross-sectional view is referred to as an "X-cut" view, and the other cross-sectional view is referred to as a "Y-cut" view. The "X-cut" view and the "Y-cut" view are perpendicular to one another.

As the "X-cut" views clearly show, the I/O device 100A has the "extra" spacer 240A that the non-I/O device 100B does not have. As a result, the I/O device 100A has a longer S/D proximity (e.g., the distance between the source and the drain) 350 than a S/D proximity 360 of the non-I/O device 100B. In some embodiments, the "extra" spacer 240A has a lateral dimension that is in a range from about 3 nanometers to about 10 nanometers, and thus the S/D proximity 350 of the I/O device 100A exceeds the S/D proximity 360 of the non-I/O device 100B by about 3 nanometers to about 10 nanometers. The greater S/D proximity of the I/O device 100A enhances its reliability, for example with respect to breakdown voltage, hot carrier injection, or leakage current.

FIGS. 32-46 illustrate another embodiment of the present disclosure for increasing the S/D proximity of the I/O device. For reasons of consistency and clarity, similar components appearing in FIGS. 2-16 are labeled the same in FIGS. 32-46.

Referring now to FIG. 32, the FinFET device 100A is an I/O device, and the FinFET device 100B is a non-I/O device, for example a core device. The FinFET devices 100A-100B are fabricated over the same substrate, which is not specifically illustrated herein for reasons of simplicity. In some embodiments, the substrate includes a dielectric material, for example silicon oxide (SiO2).

A semiconductor layer 110 is formed on the substrate 110. In an embodiment, the semiconductor layer 110 includes a crystal silicon material. An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 110 is in a range from about $1 \times 10^{17}$ ions/cm$^3$ to about $5 \times 10^{19}$ ions/cm$^3$.

A dielectric layer 120 is formed over the semiconductor layer 110. In some embodiments, the dielectric layer 120 contains silicon oxide. A dielectric layer 130 is formed over the dielectric layer 120. The dielectric layer 130 has a different material composition than the dielectric layer 120. In some embodiments, the dielectric layer 130 contains silicon nitride. The dielectric layers 120 and 130 collectively serve as a hard mask layer, which can be used to pattern the semiconductor layer 110 therebelow.

Figure 33:
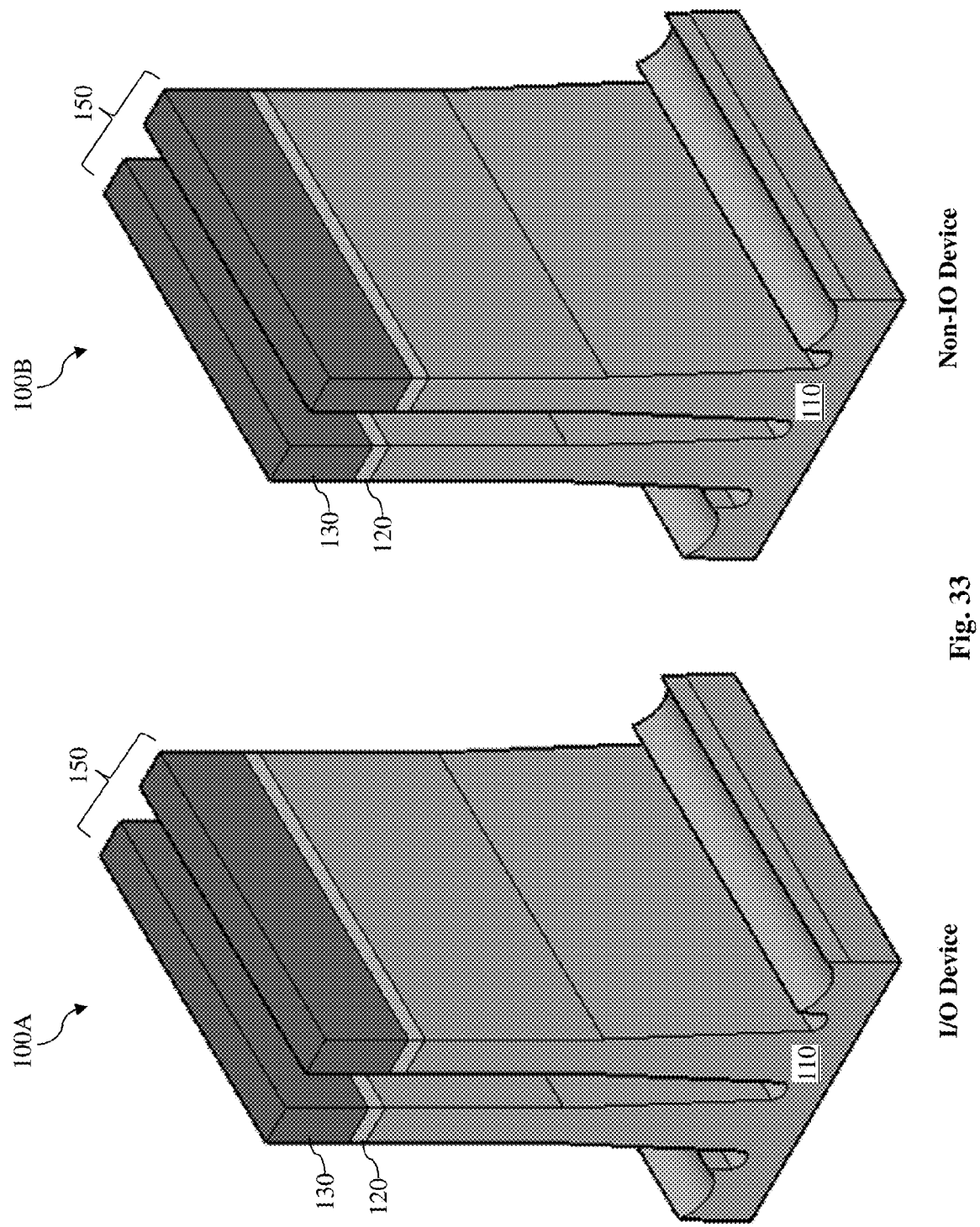

Referring now to FIG. 33, the dielectric layers 130, 120, and the semiconductor layer 110 are patterned through one or more lithography processes to form fin structures (or fins) 150. The lithography processes may include forming a patterned photoresist (not illustrated herein), which may be formed by processes such as deposition, exposure, developing, baking, etc. (not necessarily performed in that order). The patterned photoresist may then be used to pattern the layers below to form the fin structures 150 by etching away portions of the layers 110-130 not protected by the patterned photoresist. It is understood that the portions of the semiconductor layer 110 of the fin structures 150 will serve as the source, drain, and channel regions of the FinFET devices 100A and 100B.

Figure 34:
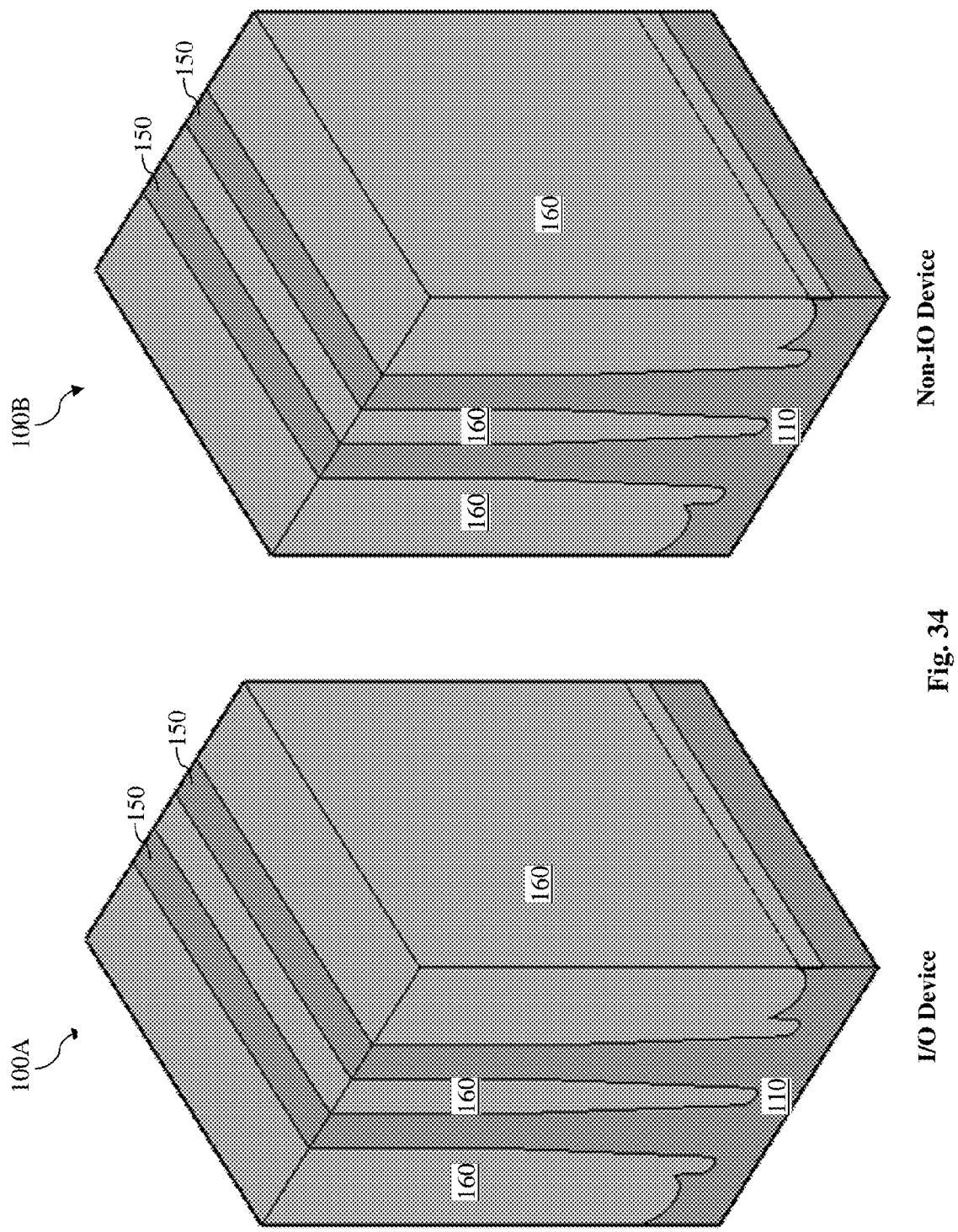

Referring now to FIG. 34, isolation structures 160 are formed to electrically isolate the fins 150. The isolation structures 160 may also be referred to as shallow trench isolation (STI) structures. In some embodiments, the isolation structures 160 contain a dielectric material such as silicon oxide or silicon nitride. The isolation structures 160 may be formed by depositing the dielectric material to fill the openings formed by the fin structures 150 and then performing a polishing process (such as chemical mechanical polishing) to planarize the surface of the dielectric material. The dielectric layers 130 and 120 are also removed, which may be performed before or after the formation of the isolation structures 160.

Figure 35:
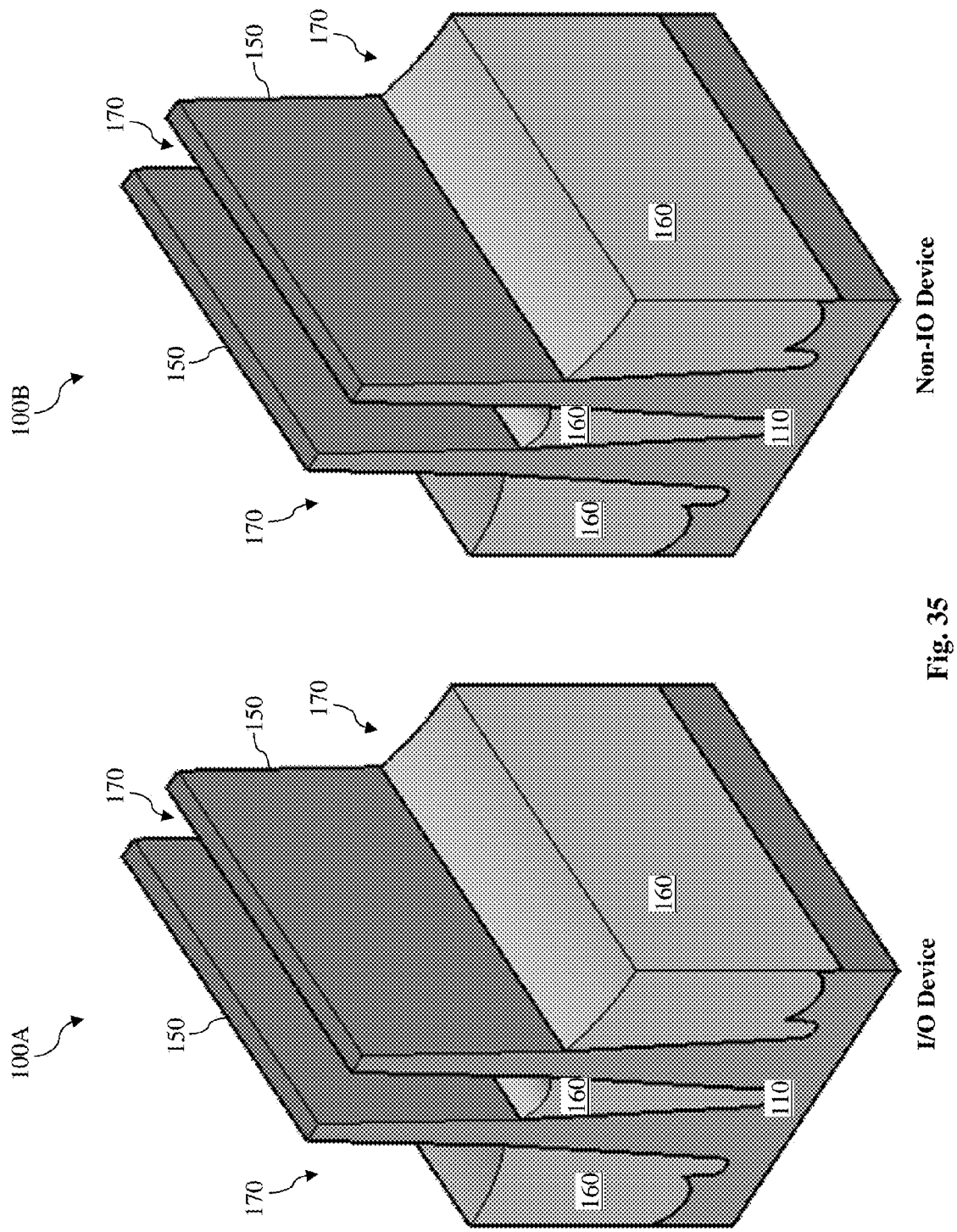

Referring now to FIG. 35, one or more etching processes are performed to form recesses 170. The recesses 170 are formed by removing portions (but not all) of the material from the isolation structures 160. At this point, the fin structures 150 partially protrude upwards and out of the isolation structures 160. In other words, at least a portion of each fin structure 150 is exposed and not covered by the isolation structures 160.

Figure 36:
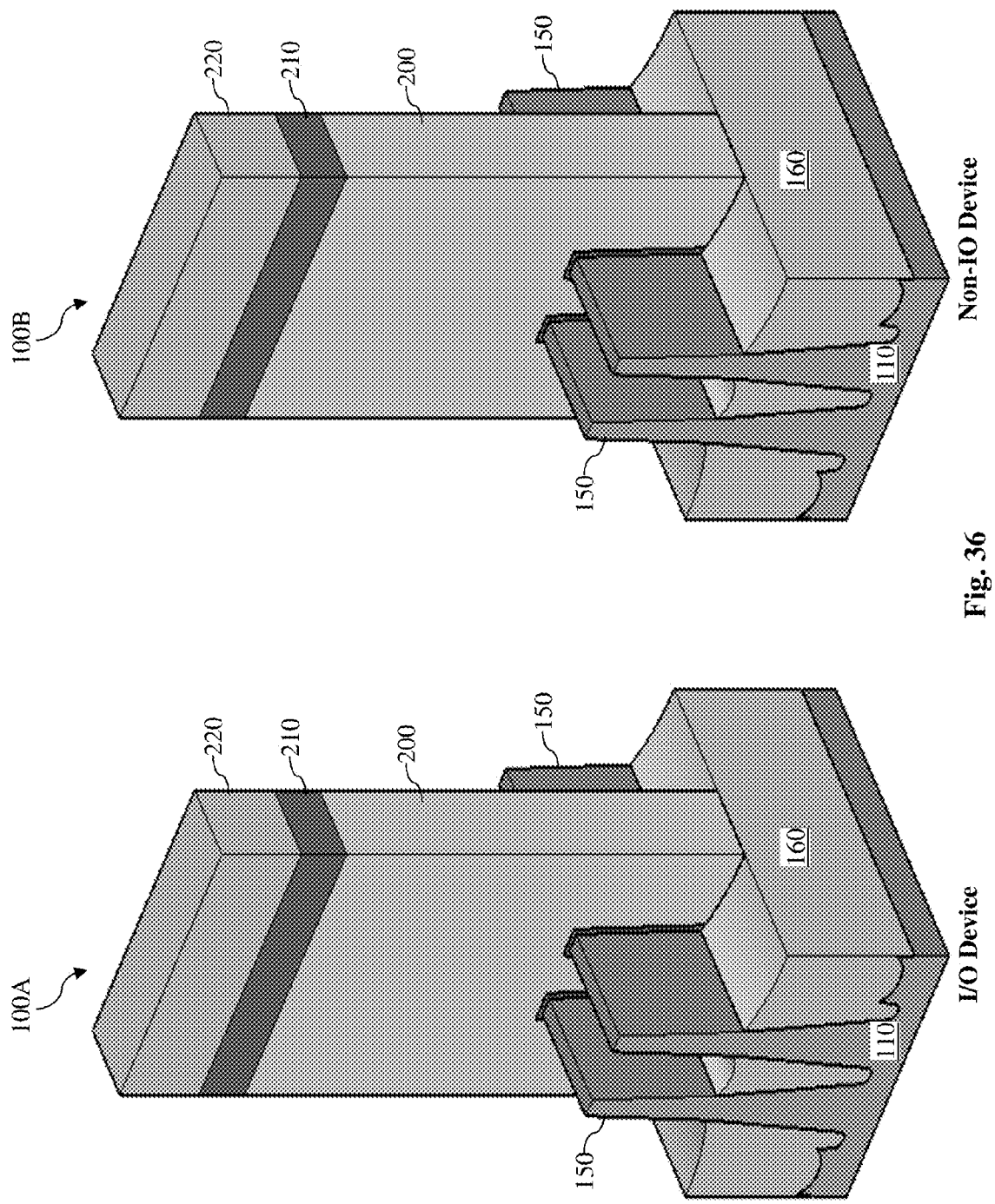

Referring now to FIG. 36, a patterned dummy gate structure 200 is formed over the isolation structures 160. The patterned dummy gate structure 200 is formed by one or more patterning processes. For example, a polysilicon material is formed over the isolation structures 160. A patterned hard mask is formed over the polysilicon material. The patterned hard mask includes a dielectric layer 210 and a dielectric layer 220. In some embodiments, the dielectric layer 210 may contain silicon nitride, and the dielectric layer 220 may contain silicon oxide. The patterned hard mask is then used to pattern (e.g., by one or more etching processes) the polysilicon material below to form the patterned dummy gate structure 200. As is shown in FIG. 36, the patterned dummy gate structure 200 is formed to wrap around the fin structures 150. It is also understood that the dummy gate structure 200 may include a dummy dielectric layer formed below the polysilicon material, but this is not specifically illustrated for the sake of simplicity.

Figure 37:
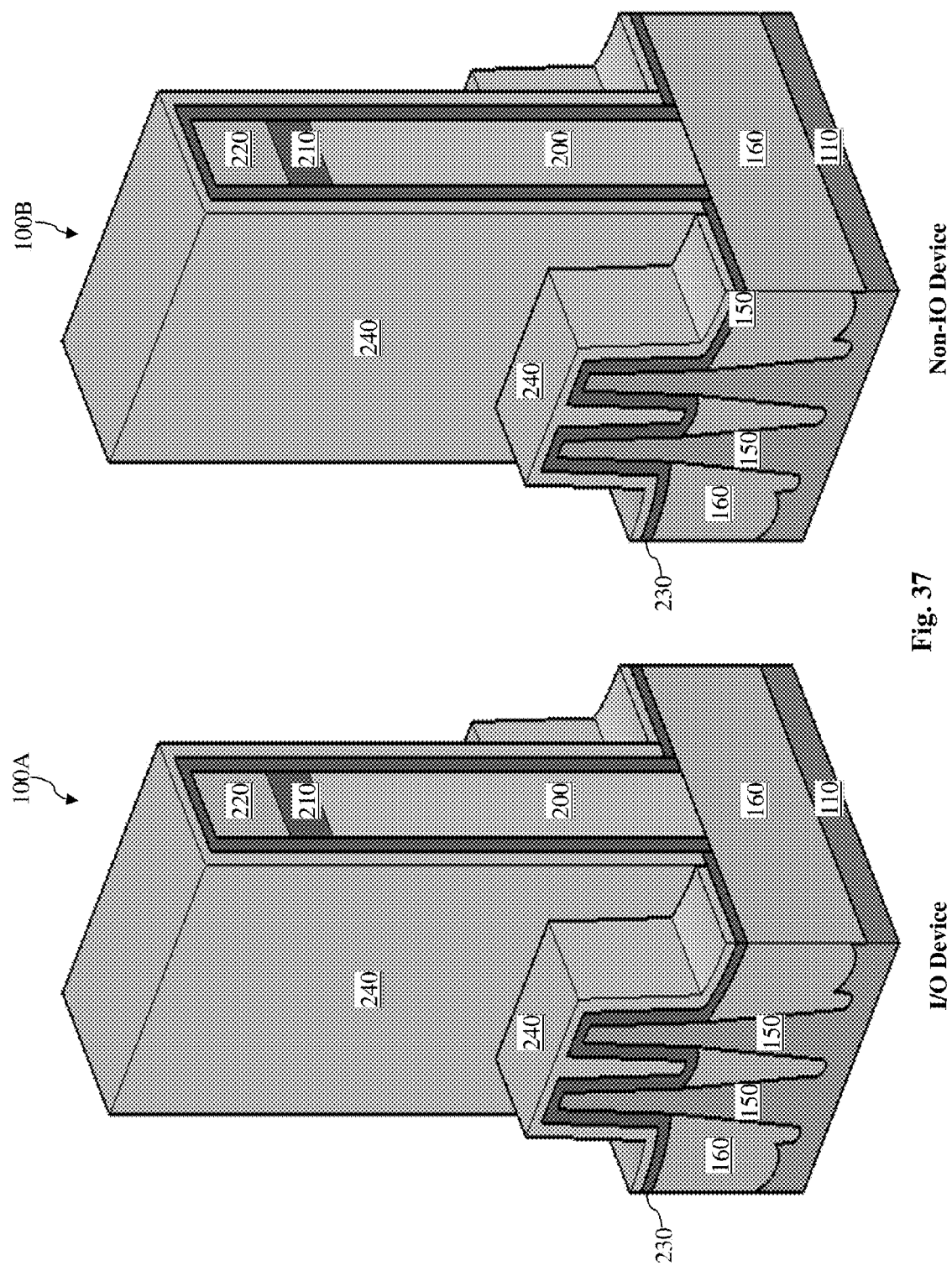

Referring now to FIG. 37, a sealing layer 230 is formed over the isolation structures 160, the fin structures 150, and the dummy gate structure 200. In some embodiments, the sealing layer 230 contains silicon carbon oxynitride (SiCON). In other embodiments, the sealing layer 230 contains silicon oxycarbide (SiOC). A layer 240 is then formed on the sealing layer 230. In some embodiments, the layer 240 contains silicon nitride. In other embodiments, the layer 240 contains silicon oxide. In some other embodiments, the layer 240 contains amorphous silicon. In the embodiment shown herein, the layers 230 and 240 are each formed conformally. The layer 240 formed over the I/O device 100A will be transformed into an extra spacer by subsequent processes discussed below.

Up until this stage of fabrication, the same fabrication processes are performed for the I/O device 100A and the non-I/O device 100B. In other words, the I/O device 100A and the non-I/O device 100B are the same at this stage of fabrication. After this point, different fabrication processes will be performed to the I/O device 100A and the non-I/O device 100B.

Figure 38:
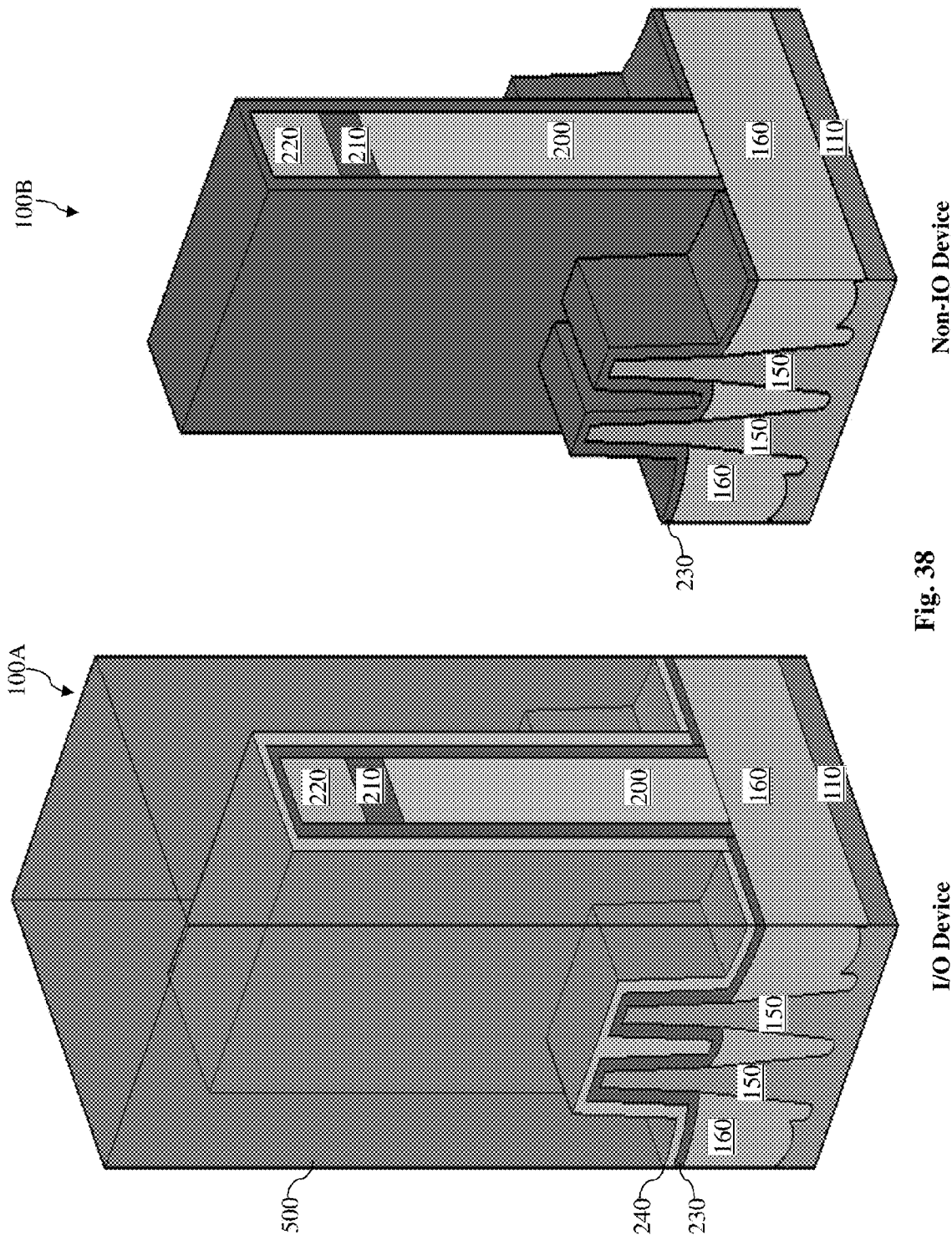

Referring now to FIG. 38, a protective layer 500 is formed over the I/O device 100A but not over the non-I/O device 100B. In some embodiments, the protective layer 500 contains a photoresist material. While the protective layer 500 protects the various layers of the I/O device 100A underneath, the layer 240 is removed from the non-I/O device 100B. The removal of the layer 240 may be performed via one or more etching processes, for example. The material compositions of the layers 230 and 240 are tuned to have sufficiently different etching rates (i.e., high etching selectivity) in the one or more etching processes such that the etching of the layer 240 does not substantially affect the layer 230. Therefore, after the etching process has been completed, the non-I/O device 100B is still covered by the sealing layer 230, but the layer 240 has been removed.

Not that since the layer 240 for the I/O device 100A is not removed, the layer 240 will be used to form an "extra" spacer for the I/O device 100A in a later process discussed below. In comparison, the non-I/O device 100B will not have this "extra" spacer.

Figure 39:
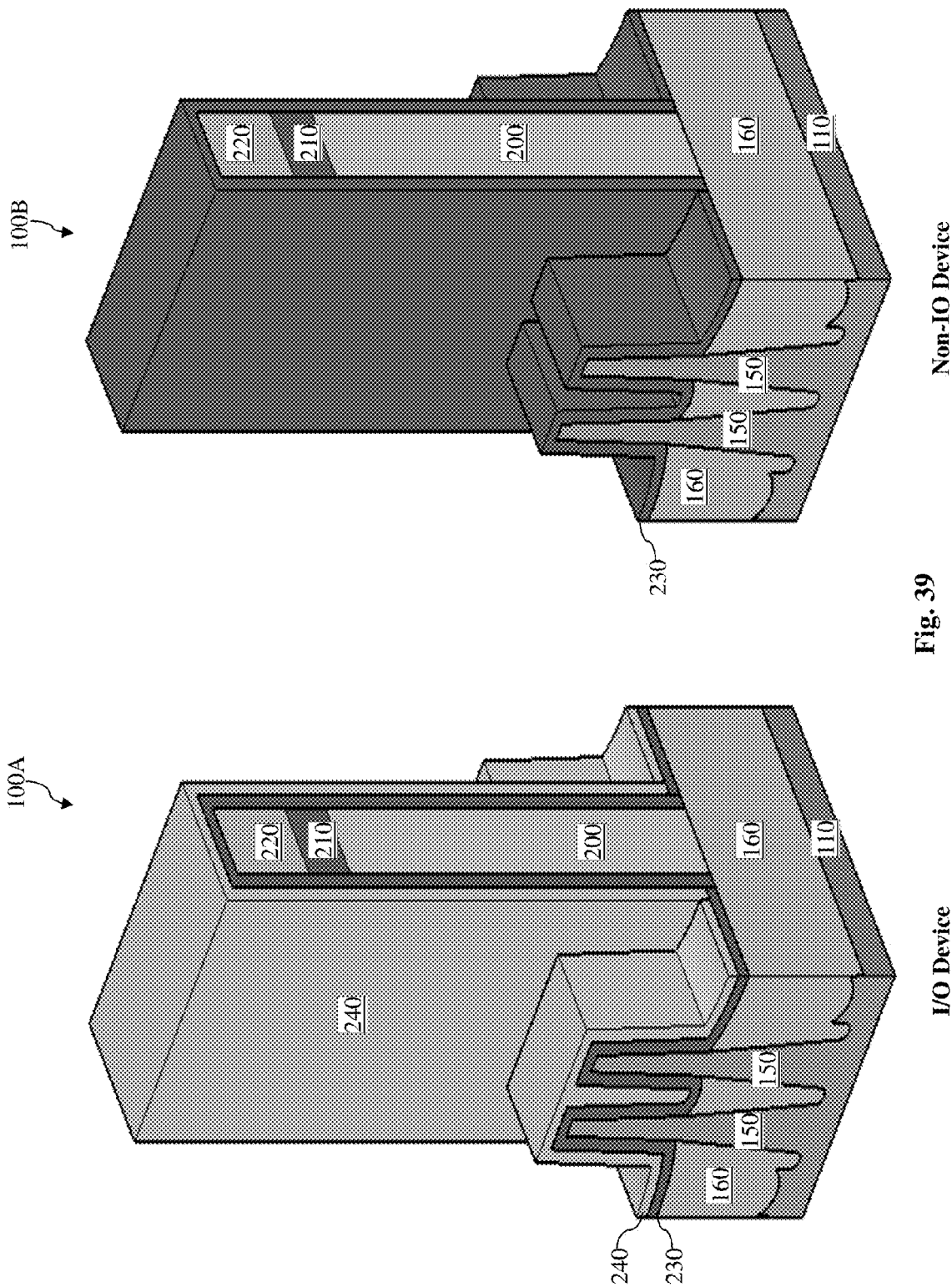

Referring now to FIG. 39, the protective layer 500 is removed, for example by a photoresist stripping or ashing process. At this stage of fabrication, the I/O device 100A is covered with the layer 240, while the non-I/O device 100B is not.

Figure 40:
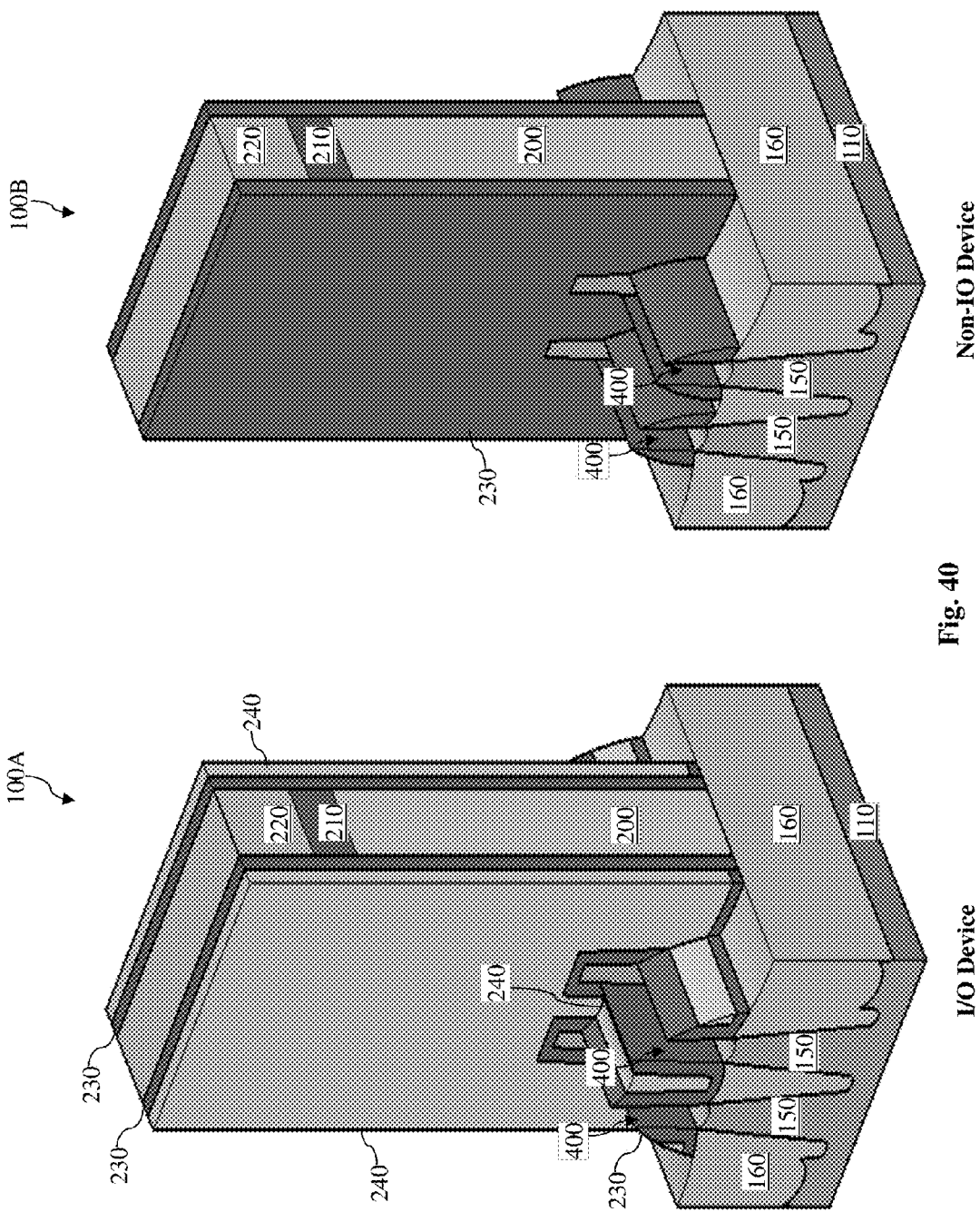

Referring now to FIG. 40, portions (e.g., upper surface portions) of the layer 240 and the layer 230 are removed for the I/O device 100A, and portions of the sealing layer 230 are removed for the non-I/O device 100B, thereby exposing the layer 220. At this point, spacers 230 are formed by the remaining portions of the sealing layer 230 formed on the sidewalls of the gate structure 200 of the non-I/O device 100B, and spacers 230/240 are formed by the remaining portions of the sealing layer 230 and the layer 240 formed on the sidewalls of the gate structure 200 of the I/O device 100. As a result, the I/O device 100A has "extra" spacers 240 that the non-I/O device does not.

Portions of the fin structures 150 protruding above the isolation structures 160 are also removed, as well as portions of the layers 230 and 240 formed thereabove. Thus, recesses 400 (referred to as S/D recesses) are formed for both the I/O device 100A and the non-I/O device 100B.

Referring now to FIG. 41, source and drain regions 410 are formed in the openings 400 for both the I/O device 100A and the non-I/O device 100B, for example by an epitaxial growth process. As is shown by FIG. 41, the source and drain regions 410 protrude out of the openings 400 and may have a curved cross-sectional contour.

Figure 42:
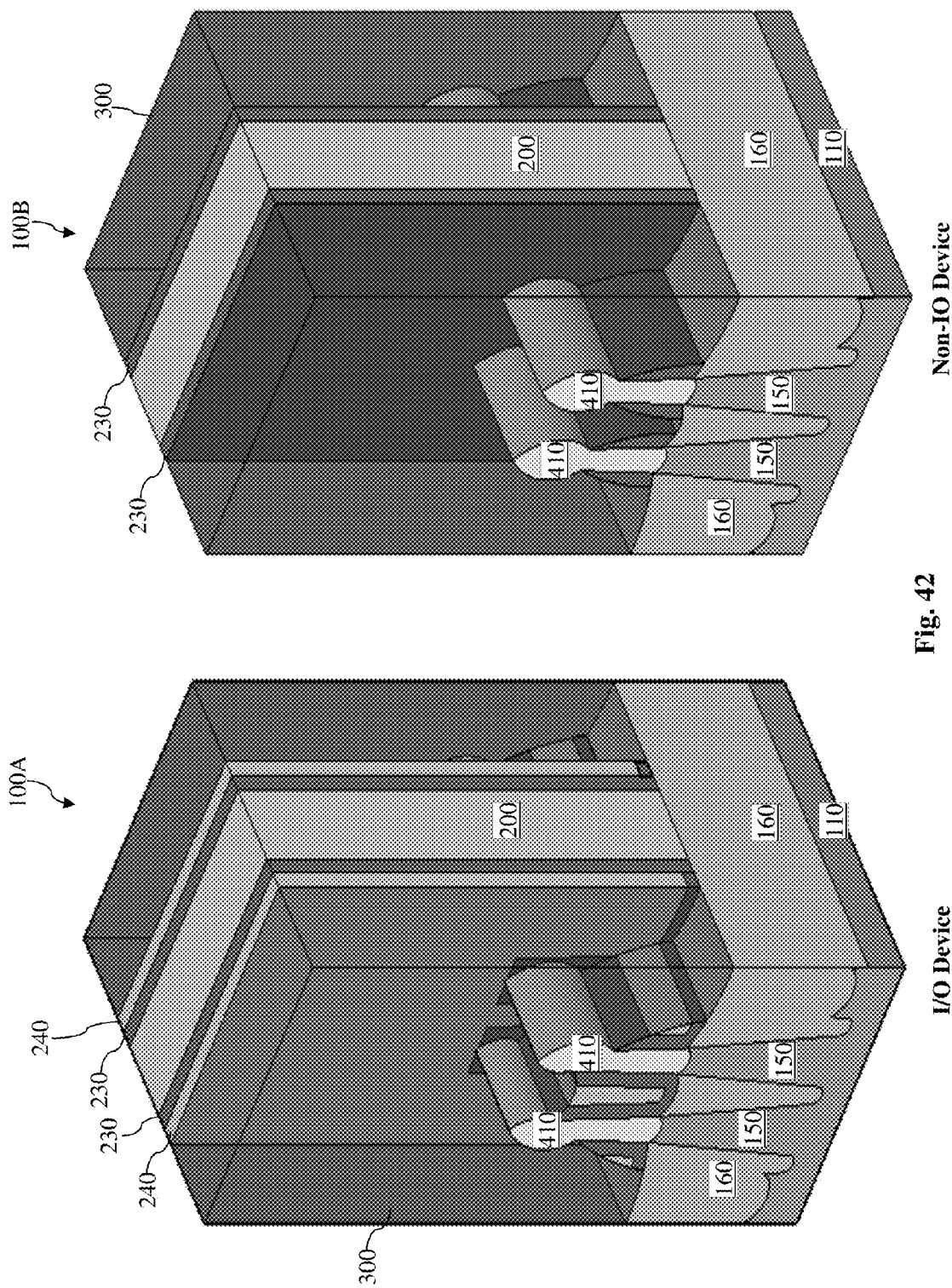
Figure 45:
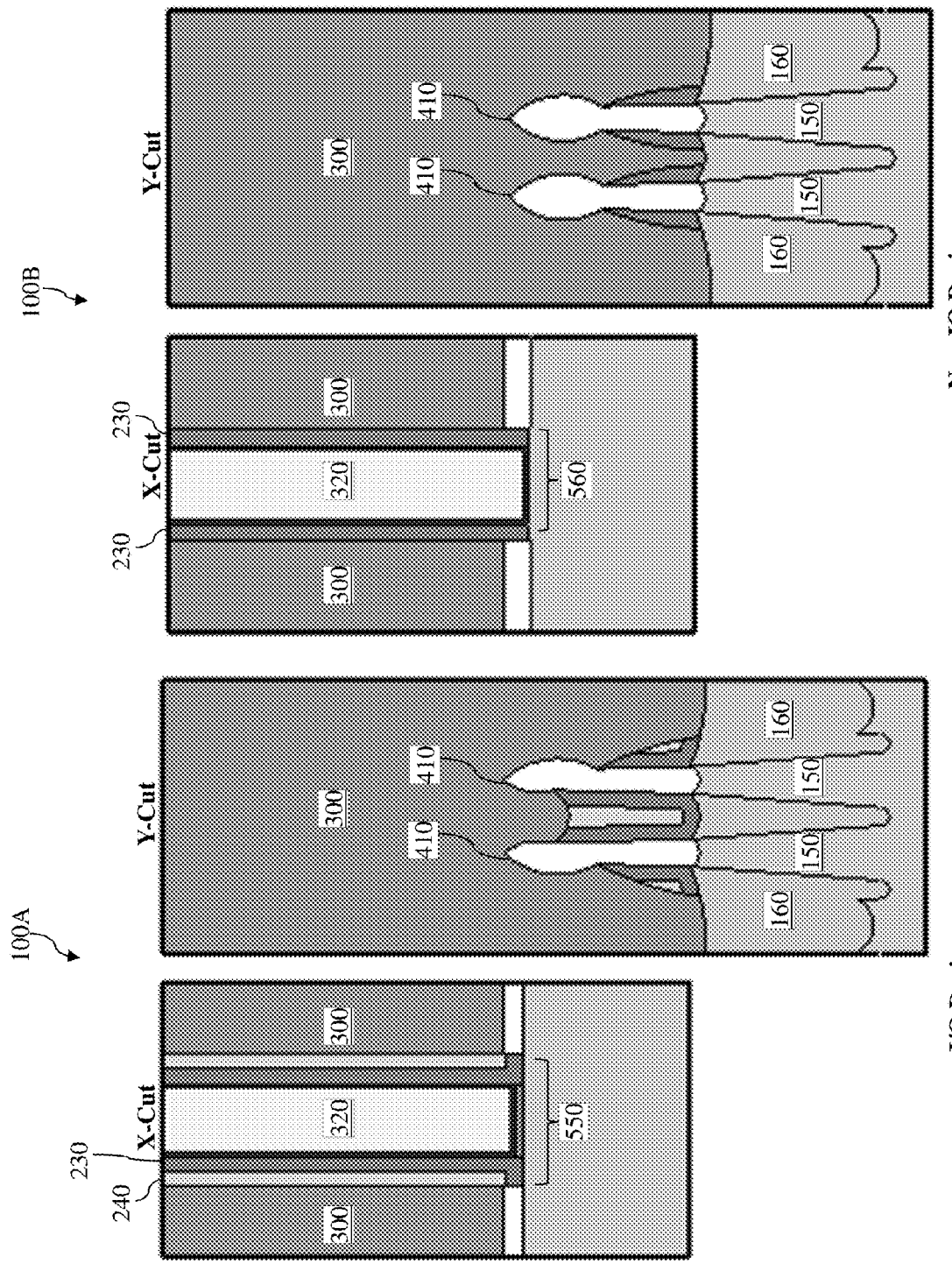

Referring now to FIG. 42, interlayer dielectric (ILD) 300 is formed over the isolation structures 160 for both the I/O device 100A and the non-I/O device 100B. In some embodiments, the ILD 300 contains silicon oxide. The ILD 300 may be formed by a suitable deposition process. A polishing process such as chemical-mechanical-polishing (CMP) is performed to planarize the upper surface of the ILD 300. The layers 210 and 220 are also removed. The upper surface of the dummy gate structure 200 is now exposed.

Referring now to FIG. 43, the dummy gate structure 200 is removed, thereby forming an opening 310 in both the I/O device 100A and the non-I/O device 100B. The removal of the dummy gate structure 200 includes removing the dummy polysilicon material as well as the dummy dielectric material of the dummy gate structure.

Referring now to FIG. 44, a functional gate structure 320 is formed in the opening 310 for both the I/O device 100A and the non-I/O device 100B. In some embodiments, the functional gate structure 320 includes a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO.

The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 320. In various embodiments, the fill metal component may contain Aluminum (Al), Tungsten (W), Copper (Cu), or combinations thereof. The replacement of the dummy gate structure 200 by the functional gate structure 320 may be referred to as a gate replacement (or gate last) process.

Based on the above discussions, it can be seen that the embodiment corresponding to FIGS. 32-44 also form the "extra" spacers 240 for the I/O device 100A. By doing so, the S/D proximity for the I/O device 100A is effectively lengthened compared to the non-I/O device 100B. This is more clearly illustrated in FIG. 45, which illustrate two different cross-sectional side views for both the I/O device 100A and the non-I/O device 100B. One cross-sectional view is referred to as an "X-cut" view, and the other cross-sectional view is referred to as a "Y-cut" view. The "X-cut" view and the "Y-cut" view are perpendicular to one another.

As the "X-cut" views clearly show, the I/O device 100A has the "extra" spacer 240 that the non-I/O device 100B does not have. As a result, the I/O device 100A has a longer S/D proximity (e.g., the distance between the source and the drain) 550 than a S/D proximity 560 of the non-I/O device 100B. In some embodiments, the "extra" spacer 240 has a lateral dimension that is in a range from about 3 nanometers to about 10 nanometers, and thus the S/D proximity 550 of the I/O device 100A exceeds the S/D proximity 560 of the non-I/O device 100B by about 3 nanometers to about 10 nanometers. The greater S/D proximity of the I/O device 100A enhances its reliability, for example with respect to breakdown voltage, hot carrier injection, or leakage current.

Though the embodiments discussed above utilize a crystal silicon material as its channel material (i.e., the material for the semiconductor layer 110), other suitable materials may also be used to implement the channel in alternative embodiments. For example, referring now to FIGS. 46, 47, and 48, where silicon germanium (SiGe) or germanium (Ge) are used to implement the channel instead of silicon.

Figure 46:
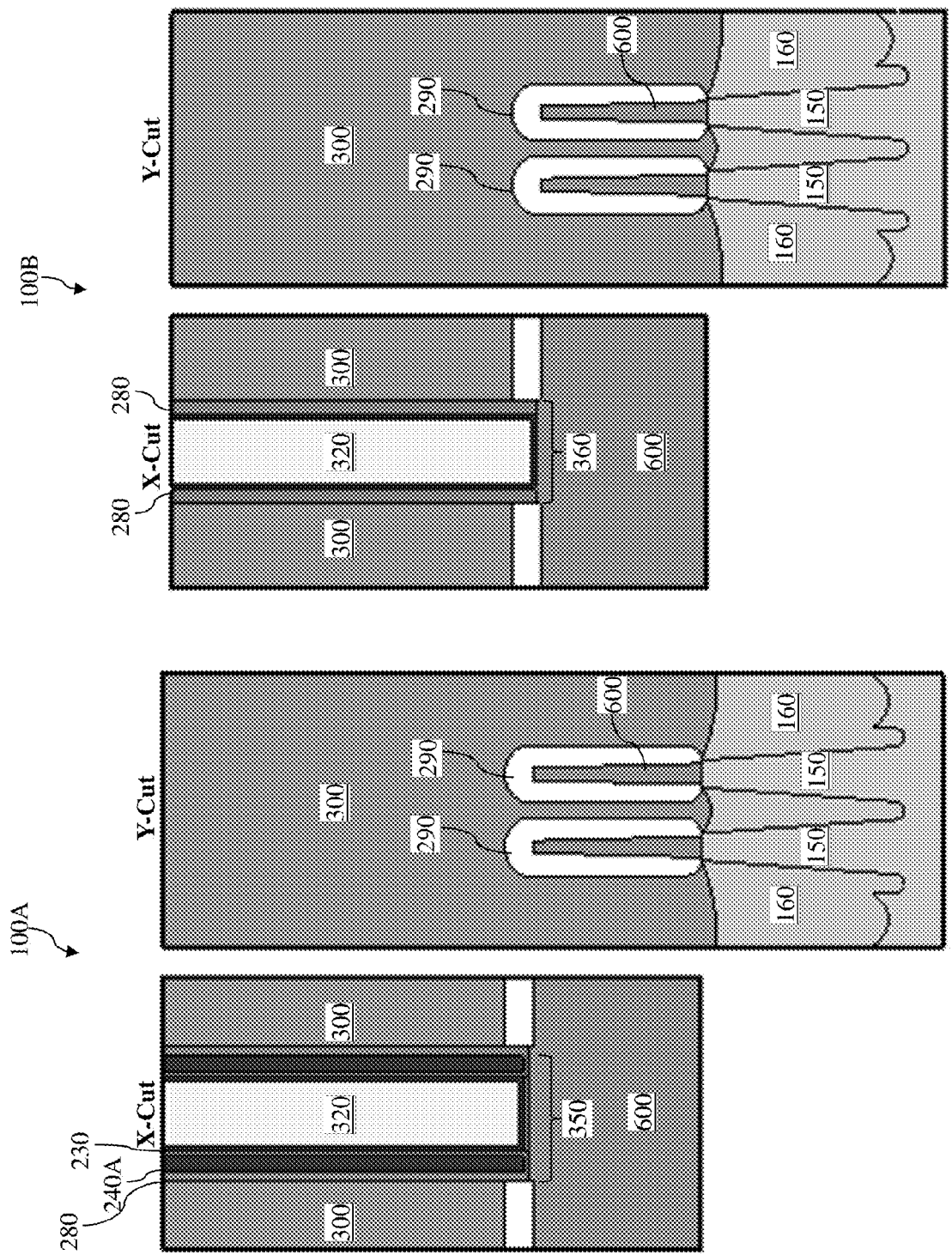

The embodiment shown in FIG. 46 is similar to the embodiment discussed above with reference to FIGS. 2-16, except that it has a SiGe or Ge channel 600 for both the I/O device 100A and the non-I/O device 100B. In other words, the embodiment shown in FIG. 46 can be formed using the same fabrication steps discussed above with reference to FIGS. 1-16, except that the crystal silicon material of the semiconductor layer 110 has been replaced with SiGe or Ge. The greater S/D proximity 350 of the I/O device 100A (compared to the S/D proximity 360) still improves the reliability of the SiGe-channel FinFET or Ge-channel FinFET, for example with respect to breakdown voltage or leakage such as gate-induced drain leakage (GIDL).

Figure 47:
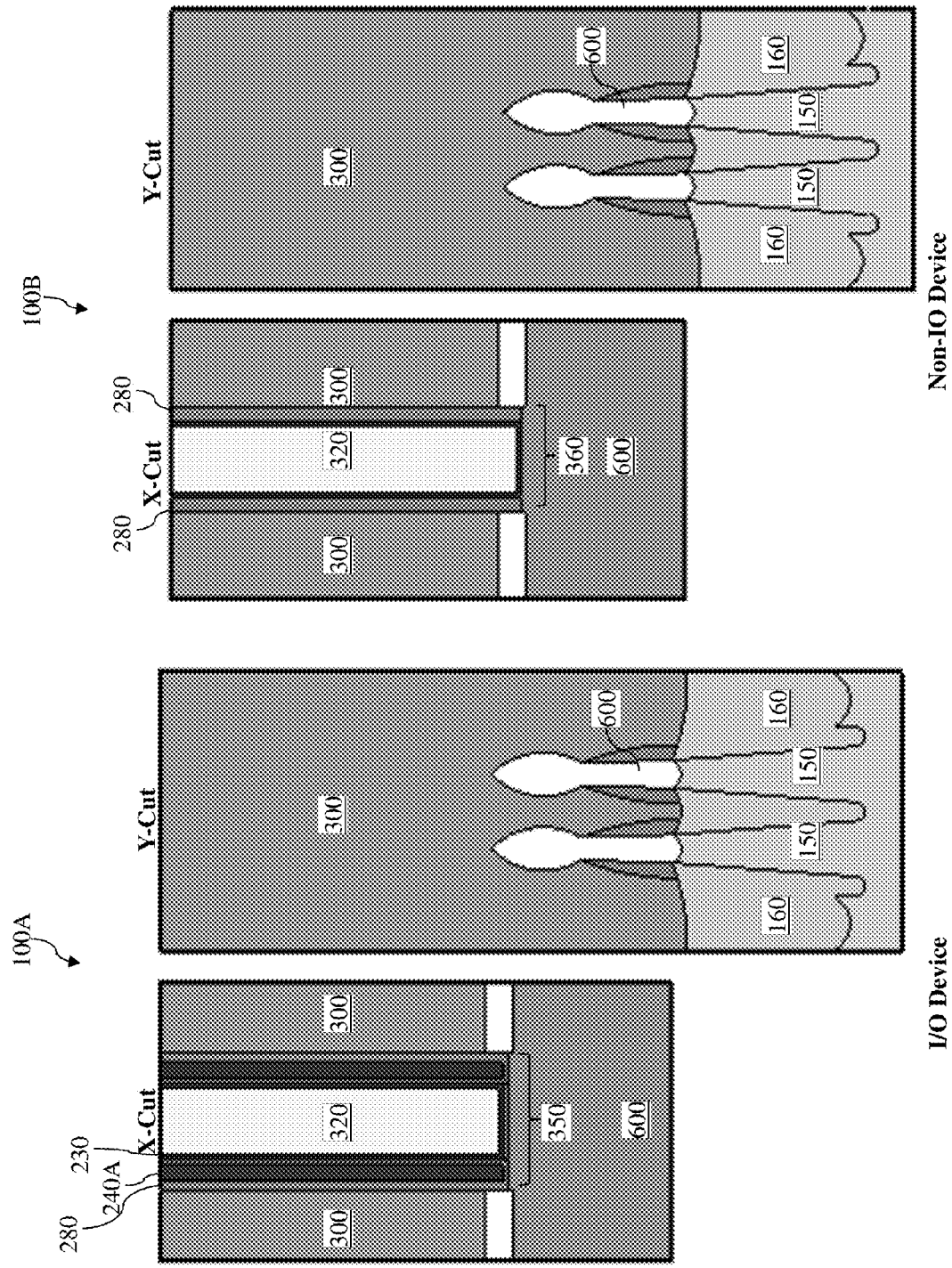

The embodiment shown in FIG. 47 is similar to the embodiment discussed above with reference to FIGS. 17-31, except that it has a SiGe or Ge channel 600 for both the I/O device 100A and the non-I/O device 100B. In other words, the embodiment shown in FIG. 47 can be formed using the same fabrication steps discussed above with reference to FIGS. 17-31, except that the crystal silicon material of the semiconductor layer 110 has been replaced with SiGe or Ge.

The greater S/D proximity 350 of the I/O device 100A (compared to the S/D proximity 360) still improves the reliability of the SiGe-channel FinFET or Ge-channel FinFET, for example with respect to breakdown voltage or leakage such as gate-induced drain leakage (GIDL).

Figure 48:
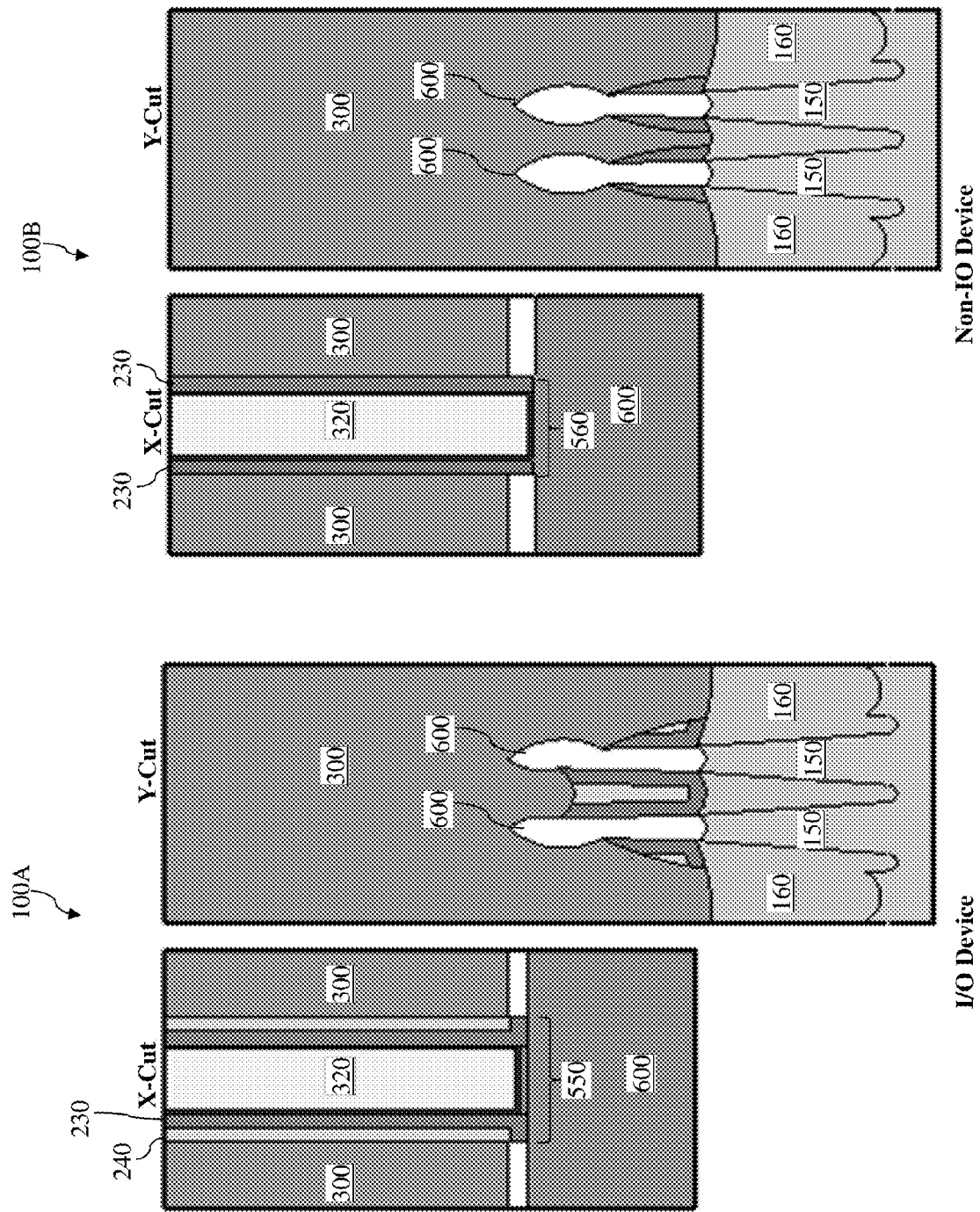

The embodiment shown in FIG. 48 is similar to the embodiment discussed above with reference to FIGS. 32-45, except that it has a SiGe or Ge channel 600 for both the I/O device 100A and the non-I/O device 100B. In other words, the embodiment shown in FIG. 48 can be formed using the same fabrication steps discussed above with reference to FIGS. 32-45, except that the crystal silicon material of the semiconductor layer 110 has been replaced with SiGe or Ge. The greater S/D proximity 550 of the I/O device 100A (compared to the S/D proximity 560) still improves the reliability of the SiGe-channel FinFET or Ge-channel FinFET, for example with respect to breakdown voltage or leakage such as gate-induced drain leakage (GIDL).

Figure 49:
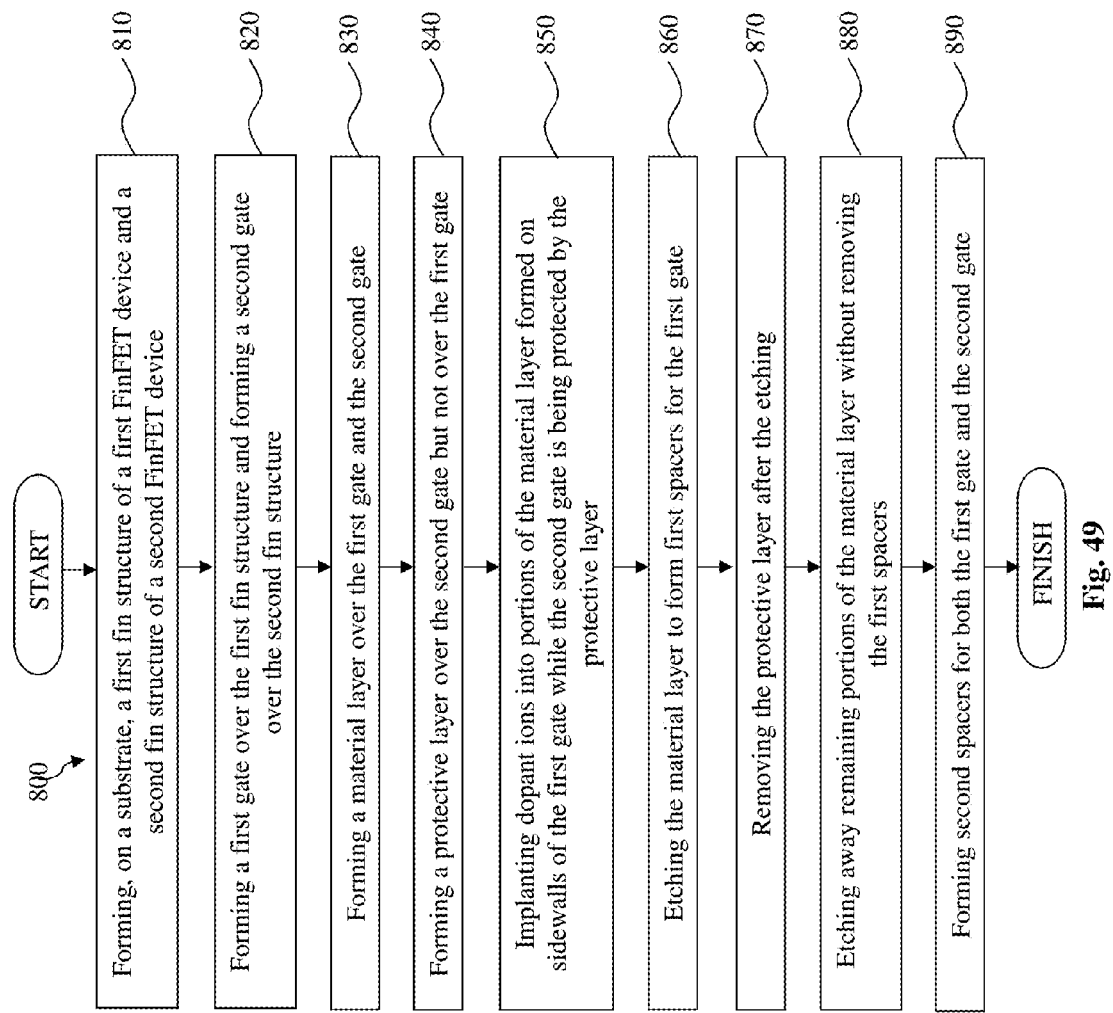
FIGS. 49-50 are flow charts of methods for fabricating a FinFET device in accordance with embodiments of the present disclosure.

FIG. 49 is a flowchart of a method 800 for fabricating a FinFET device in accordance with various aspects of the present disclosure. The method 800 includes a step 810 of forming, on a substrate, a first fin structure of a first FinFET device and a second fin structure of a second FinFET device. The fin structure contains a semiconductor material, for example silicon, silicon germanium, or germanium. In some embodiments, the forming of the first and second fin structures includes a step of forming a semiconductor layer over the substrate and a step of patterning the semiconductor layer into the fin structure. In some embodiments, the first FinFET device is an Input/Output (I/O) device, and the second FinFET device is a non-I/O device. For example, the non-I/O device is a core device.

The method 800 includes a step 820 of forming a first gate over the first fin structure and forming a second gate over the second fin structure.

The method 800 includes a step 830 of forming a material layer over the first gate and the second gate. In some embodiments, the material layer contains a dielectric material, such as silicon nitride or silicon oxide.

The method 800 includes a step 840 of forming a protective layer over the second gate but not over the first gate. In some embodiments, the protective layer contains photoresist.

The method 800 includes a step 850 of implanting dopant ions into portions of the material layer formed on sidewalls of the first gate while the second gate is being protected by the protective layer. In some embodiments, the dopant ions include carbon ions. In other embodiments, the dopant ions include boron ions.

The method 800 includes a step 860 of after the implanting, etching the material layer to form first spacers for the first gate.

The method 800 includes a step 870 of removing the protective layer after the etching.

The method 800 includes a step 880 of etching away remaining portions of the material layer without removing the first spacers. This is because the first spacers are doped with the ions and as such are harder to remove.

The method 800 includes a step 890 of forming second spacers for both the first gate and the second gate. The first spacers and the second spacers are formed to have different material compositions. In some embodiments, the first spacers contain silicon nitride, silicon oxide, or amorphous silicon. In some embodiments, the second spacers contain silicon carbon oxynitride (SiCON) or silicon oxycarbide (SiOC).

The first FinFET device has a greater source/drain proximity than the second FinFET device due to a formation of the first spacers.

It is understood that additional process steps may be performed before, during, or after the steps 810-890 discussed above to complete the fabrication of the semiconductor device. For example, the first gate and the second gates may be dummy gates, in which case the method 800 may include a step of replacing the dummy gates with high-k metal gates. Other process steps are not discussed herein for reasons of simplicity.

Figure 50:
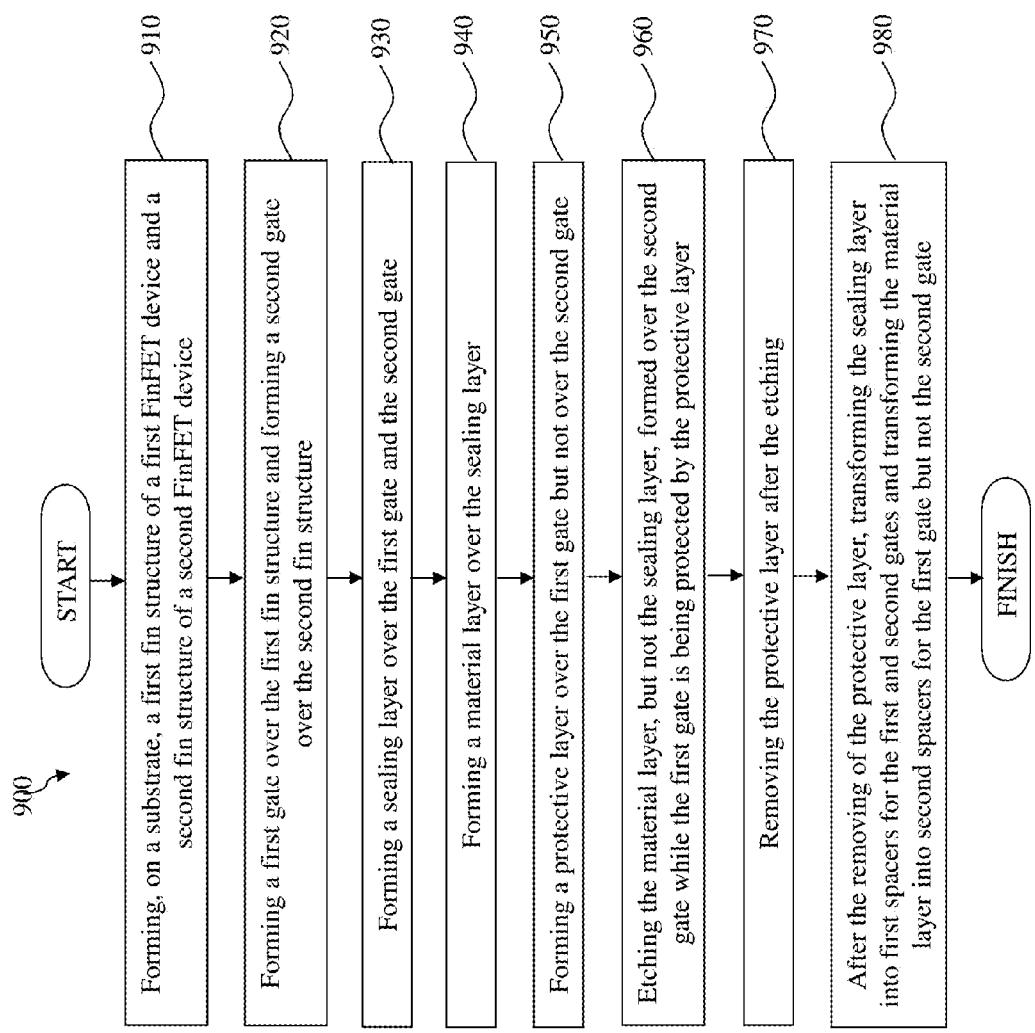

FIG. 50 is a flowchart of a method 900 for fabricating a FinFET device in accordance with various aspects of the present disclosure. The method 900 includes a step 910 of forming, on a substrate, a first fin structure of a first FinFET device and a second fin structure of a second FinFET device. The fin structure contains a semiconductor material, for example silicon, silicon germanium, or germanium. In some embodiments, the forming of the first and second fin structures includes a step of forming a semiconductor layer over the substrate and a step of patterning the semiconductor layer into the fin structure. In some embodiments, the first FinFET device is an Input/Output (I/O) device, and the second FinFET device is a non-I/O device. For example, the non-I/O device is a core device.

The method 900 includes a step 920 of forming a first gate over the first fin structure and forming a second gate over the second fin structure.

The method 900 includes a step 930 of forming a sealing layer over the first gate and the second gate.

The method 900 includes a step 940 of forming a material layer over the sealing layer.

The method 900 includes a step 950 of forming a protective layer over the first gate but not over the second gate.

The method 900 includes a step 960 of etching the material layer, but not the sealing layer, formed over the second gate while the first gate is being protected by the protective layer. The sealing layer and the material layer are formed to have different material compositions such that they have different etching rates during the etching of the material layer.

The method 900 includes a step 970 of removing the protective layer after the etching.

The method 900 includes a step 980 of after the removing of the protective layer, transforming the sealing layer into first spacers for the first and second gates and transforming the material layer into second spacers for the first gate but not the second gate. The first FinFET device has a greater source/drain proximity than the second FinFET device due to a formation of the second spacers It is understood that additional process steps may be performed before, during, or after the steps 910-980 discussed above to complete the fabrication of the semiconductor device. For example, the first gate and the second gates may be dummy gates, in which case the method 900 may include a step of replacing the dummy gates with high-k metal gates. Other process steps are not discussed herein for reasons of simplicity.

Based on the above discussions, it can be seen that the present disclosure offers advantages over conventional FinFET and the fabrication thereof. It is understood, however, that other embodiments may offer additional advantages, and not all advantages are necessarily disclosed herein, and that no particular advantage is required for all embodiments. One advantage is that the FinFET devices of the present disclosure have greater S/D proximity for I/O devices than for non-I/O devices. In various embodiments, the greater S/D proximity is due to the unique fabrication process flow that results in extra spacers for the I/O device, whereas the non-I/O device does not have these extra spacers. Due to the greater I/O device S/D proximity, the reliability of the FinFET device herein can be improved, for example reliability related to breakdown voltage, hot carrier injection, or leakage current. Another advantage of the present disclosure is that the unique fabrication steps (that lead to the extra spacers) discussed herein are easy to implement and are compatible with existing fabrication process flow. Therefore, implementing the present disclosure does not lead to increased costs.

One aspect of the present disclosure involves a semiconductor device. The semiconductor device includes a first FinFET device and a second FinFET device. The first FinFET device includes a first gate, a first source, and a first drain. The first FinFET device has a first source/drain proximity. The second FinFET device includes a second gate, a second source, and a second drain. The second FinFET device has a second source/drain proximity that is different from the first source/drain proximity.

Another aspect of the present disclosure involves a method of fabricating a semiconductor device. On a substrate, a first fin structure of a first FinFET device is formed and a second fin structure of a second FinFET device is formed. A first gate is formed over the first fin structure, and a second gate is formed over the second fin structure. A material layer is formed over the first gate and the second gate. A protective layer is formed over the second gate but not over the first gate. Dopant ions are implanted into portions of the material layer formed on sidewalls of the first gate while the second gate is being protected by the protective layer. After the dopant ions are implanted, the material layer is etched to form first spacers for the first gate.

Yet another aspect of the present disclosure involves a method of fabricating a semiconductor device. On a substrate, a first fin structure of a first FinFET device is formed and a second fin structure of a second FinFET device is formed. A first gate is formed over the first fin structure, and a second gate is formed over the second fin structure. A sealing layer is formed over the first gate and the second gate. A material layer is formed over the sealing layer. A protective layer is formed over the first gate but not over the second gate. The material layer (but not the sealing layer) formed over the second gate is etched while the first gate is being protected by the protective layer. The protective layer is removed after the etching of the material layer. After the removing of the protective layer, the sealing layer is transformed into first spacers for the first and second gates, and the material layer is transformed into second spacers for the first gate but not the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming, on a substrate, a first fin structure of a first FinFET device and a second fin structure of a second FinFET device;
    forming a first gate over the first fin structure and forming a second gate over the second fin structure;
    forming a material layer over the first gate and the second gate;
    forming a protective layer over the second gate but not over the first gate;
    implanting dopant ions into portions of the material layer formed on sidewalls of the first gate while the second gate is being protected by the protective layer; and
    after the implanting, etching the material layer to form first spacers for the first gate.

2. The method of claim 1, further comprising:
    removing the protective layer after the etching;
    thereafter etching away remaining portions of the material layer without removing the first spacers; and
    thereafter forming second spacers for both the first gate and the second gate.

3. The method of claim 2, wherein the first spacers and the second spacers are formed to have different material compositions.

4. The method of claim 2, wherein the first gate and the second gate are dummy gates, and further comprising: replacing the dummy gates with high-k metal gates.

5. The method of claim 1, wherein:
    the first FinFET device is an Input/Output (I/O) device; and
    the second FinFET device is a non-I/O device.

6. The method of claim 5, wherein the non-I/O device is a core device.

7. The method of claim 5, wherein the first FinFET device has a greater source/drain proximity than the second FinFET device due to a formation of the first spacers.

8. A method of fabricating a semiconductor device, comprising:
    forming, on a substrate, a first fin structure of a first FinFET device and a second fin structure of a second FinFET device;
    forming a first gate over the first fin structure and forming a second gate over the second fin structure;
    forming a sealing layer over the first gate and the second gate;
    forming a material layer over the sealing layer;
    forming a protective layer over the first gate but not over the second gate;
    etching the material layer, but not the sealing layer, formed over the second gate while the first gate is being protected by the protective layer;
    removing the protective layer after the etching; and
    after the removing of the protective layer, transforming the sealing layer into first spacers for the first and second gates and transforming the material layer into second spacers for the first gate but not the second gate.

9. The method of claim 8, wherein the sealing layer and the material layer are formed to have different material compositions such that they have different etching rates during the etching of the material layer.

10. The method of claim 8, wherein:
    the first FinFET device is an Input/Output (I/O) device; and
    the second FinFET device is a non-I/O device.

11. The method of claim 10, wherein the non-I/O device is a core device.

12. The method of claim 10, wherein the first FinFET device has a greater source/drain proximity than the second FinFET device due to a formation of the second spacers.

13. A method of fabricating a semiconductor device, the method comprising:
   forming a first FinFET device that includes a first gate, a first source, and a first drain, the first source and first drain being formed within and around a first portion of a first semiconductor layer extending in a first direction, the first gate wrapping around a second portion of the first semiconductor layer in a second direction and a third direction, the first, second, and third directions being orthogonal to one another, wherein the first FinFET device is formed to have a first source/drain proximity; and
   forming a second FinFET device that includes a second gate, a second source, and a second drain, the second source and second drain being formed within and around a first portion of a second semiconductor layer extending in the first direction, the second gate wrapping around a second portion of the second semiconductor layer in the second direction and the third direction, wherein the second FinFET device is formed to have a second source/drain proximity that is greater than or less than the first source/drain proximity in the first direction.

14. The method of claim 13, wherein:
   the forming of the first FinFET device comprises forming an Input/Output (I/O) device; and
   the forming the second FinFET device comprises forming a non-I/O device.

15. The method of claim 14, wherein the forming the non-I/O device comprises forming a core device.

16. The method of claim 14, wherein the forming the first FinFET device and the forming the second FinFET device are performed such that the first source/drain proximity is formed to be greater than the second source/drain proximity.

17. The method of claim 14, wherein:
   the forming the I/O device and the forming the non-I/O device are each comprise forming a first spacer; and
   the forming the I/O device further comprises forming a second spacer having a different material composition than the first spacer.

18. The method of claim 17, wherein:
   the forming the first spacer comprises forming a silicon carbon oxynitride (SiCON) spacer or a silicon oxycarbide (SiOC) spacer; and
   the forming the second spacer comprises forming a silicon nitride spacer, a silicon oxide spacer, or an amorphous silicon spacer.

19. The method of claim 18, wherein the forming the second spacer further comprises implanting dopant ions in the second spacer.

20. The method of claim 13, wherein the forming the first FinFET device and the forming the second FinFET device are performed such that the first gate and the second gate each comprise a high-k gate dielectric and a metal gate electrode.

\* \* \* \* \*